US00RE49508E

(19) United States
(12) Reissued Patent
Kanno

(10) Patent Number: US RE49,508 E
(45) Date of Reissued Patent: Apr. 25, 2023

(54) MEMORY SYSTEM AND METHOD FOR CONTROLLING NONVOLATILE MEMORY

(71) Applicant: Kioxia Corporation, Tokyo (JP)

(72) Inventor: Shinichi Kanno, Tokyo (JP)

(73) Assignee: Kioxia Corporation, Tokyo (JP)

(21) Appl. No.: 17/087,268

(22) Filed: Nov. 2, 2020

Related U.S. Patent Documents

Reissue of:
(64) Patent No.: 10,418,371
Issued: Sep. 17, 2019
Appl. No.: 16/126,231
Filed: Sep. 10, 2018

U.S. Applications:
(63) Continuation of application No. 15/700,365, filed on Sep. 11, 2017, now Pat. No. 10,103,158.

(30) Foreign Application Priority Data

Feb. 28, 2017 (JP) ..... 2017-036930

(51) Int. Cl.

| | |
|---|---|
| ***G11C 11/34*** | (2006.01) |
| ***G11C 16/04*** | (2006.01) |
| ***H01L 27/11524*** | (2017.01) |
| ***H01L 27/105*** | (2023.01) |
| ***G06F 3/06*** | (2006.01) |
| ***G06F 12/02*** | (2006.01) |

(Continued)

(52) U.S. Cl.
CPC ..... *H01L 27/11524* (2013.01); *G06F 3/0604* (2013.01); *G06F 3/0608* (2013.01); *G06F 3/0631* (2013.01); *G06F 3/0644* (2013.01); *G06F 3/0652* (2013.01); *G06F 3/0659* (2013.01); *G06F 3/0679* (2013.01); *G06F 12/0246* (2013.01); *G06F 12/06* (2013.01); *H01L 27/1052* (2013.01); *G06F 2212/1016* (2013.01); *G06F 2212/214* (2013.01); *G06F 2212/7202* (2013.01); *G11C 16/16* (2013.01)

(58) Field of Classification Search
CPC ..... G11C 88/12; G11C 29/76; G06F 12/0246
USPC ..... 365/63; 711/1.3, E12.001
See application file for complete search history.

(56) References Cited

U.S. PATENT DOCUMENTS 9,229,854 B1 1/2016 Kuzmin
10,103,158 B2 * 10/2018 Kanno ..... G06F 3/0608
(Continued)

FOREIGN PATENT DOCUMENTS

JP 2013-513881 A 4/2013
JP 2017-27388 A 2/2017
WO WO 2016/013076 A1 1/2016

*Primary Examiner* — My Trang Ton
(74) *Attorney, Agent, or Firm* — Oblon, McClelland, Maier & Neustadt, L.L.P.

(57) ABSTRACT

According to one embodiment, a memory system classifies a plurality of nonvolatile memory dies connected to a plurality of channels, into a plurality of die groups such that each of the plurality of nonvolatile memory dies belongs to only one die group. The memory system performs a data write/read operation for one die group of the plurality of die groups in accordance with an I/O command from a host designating one of a plurality of regions including at least one region corresponding to each die group. The memory system manages a group of free blocks in the nonvolatile memory for each of the plurality of die group by using a plurality of free block pools corresponding to the plurality of die groups.

34 Claims, 36 Drawing Sheets

(51) Int. Cl.
*G06F 12/06* (2006.01)
*G11C 16/16* (2006.01)

(56) References Cited

U.S. PATENT DOCUMENTS

2010/0325343 A1* 12/2010 Takashima ..... G11C 29/76 711/E12.001
2011/0145475 A1 6/2011 Eleftheriou et al.
2011/0302361 A1 12/2011 Yamazaki et al.
2013/0019057 A1 1/2013 Stephens
2013/0250643 A1* 9/2013 Matsunaga ..... G11C 8/12 365/63
2014/0003142 A1 1/2014 Lee et al.
2014/0019672 A1* 1/2014 Harasawa ..... G06F 12/0246 711/103
2014/0195725 A1* 7/2014 Bennett ..... G06F 12/0246 711/103
2014/0207997 A1 7/2014 Peterson
2014/0258596 A1* 9/2014 Kojima ..... G06F 12/0246 711/103
2015/0347025 A1* 12/2015 Law ..... G06F 3/0611 711/103
2016/0034354 A1 2/2016 Hashimoto
2016/0062677 A1* 3/2016 Samuels ..... G06F 3/0616 711/103
2016/0103617 A1 4/2016 Kang
2016/0313943 A1 10/2016 Hashimoto et al.
2017/0024276 A1 1/2017 Kanno
2017/0168929 A1 6/2017 Kanno
2017/0262228 A1 9/2017 Kanno
2017/0262365 A1 9/2017 Kanno
2018/0088805 A1 3/2018 Kanno

* cited by examiner

MEMORY SYSTEM AND METHOD FOR CONTROLLING NONVOLATILE MEMORY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is a *Reissue of U.S. Pat. No. 10,418,371, issued Sep. 17, 2019, which is a* continuation of U.S. application Ser. No. 15/700,365, filed Sep. 11, 2017, which is based upon and claims the benefit of priority from Japanese Patent Application No. 2017-036930, filed Feb. 28, 2017, the entire contents of both of which are incorporated herein by reference.

FIELD

Embodiments described herein relate generally to a technique for controlling a nonvolatile memory.

BACKGROUND

In recent years, memory systems comprising nonvolatile memories have been widely prevalent.

As such a memory system, a solid state drive (SSD) based on a NAND flash technology is known. The SSD is used as a storage for various computers in view of its features such as low power consumption and high performance.

Normally, the SSD is equipped with a large number of nonvolatile memory dies in order to increase the capacity of the SSD. The individual nonvolatile memory dies can operate independently. Thus, the nonvolatile memories can function as units for parallel processing.

However, typically, operations for one nonvolatile memory die are performed sequentially rather than in parallel. Thus, if a read request occurs for a nonvolatile memory die in which a write operation is being executed (i.e., die contention), a time until when the read request is responded to (i.e., read latency) may be very long.

Therefore, a new function needs to be implemented which enables a host to access the SSD without causing die contention.

DETAILED DESCRIPTION

Various embodiments will be described hereinafter with reference to the accompanying drawings.

In general, according to one embodiment, a memory system is connectable to a host. The memory system comprises a nonvolatile memory and a controller. The nonvolatile memory comprises a plurality of nonvolatile memory dies connected to a plurality of channels. The controller is electrically connected to the nonvolatile memory and is configured to control the nonvolatile memory via the plurality of channels. Each of the nonvolatile memory dies comprises a plurality of blocks.

The controller classifies the plurality of nonvolatile memory dies into a plurality of die groups such that each of the plurality of nonvolatile memory dies belongs to only one die group. The controller performs a data write/read operation for one of the plurality of die groups in accordance with an I/O command from the host designating one of a plurality of regions including at least one region corresponding to each die group.

The controller manages a group of free blocks in the nonvolatile memory for each of the plurality of die group by using a plurality of free block pools corresponding to the plurality of die groups.

The controller performs, for each of the plurality of die groups, an operation of allocating one of the free blocks in the corresponding free block pool as a block to which user data is to be written, an operation of writing the user data to the allocated block, an operation of managing the block filled with the user data by using a data block pool, and an operation of returning blocks which are managed by the data block pool and which hold no valid data to the corresponding free block pool.

Figure 1:
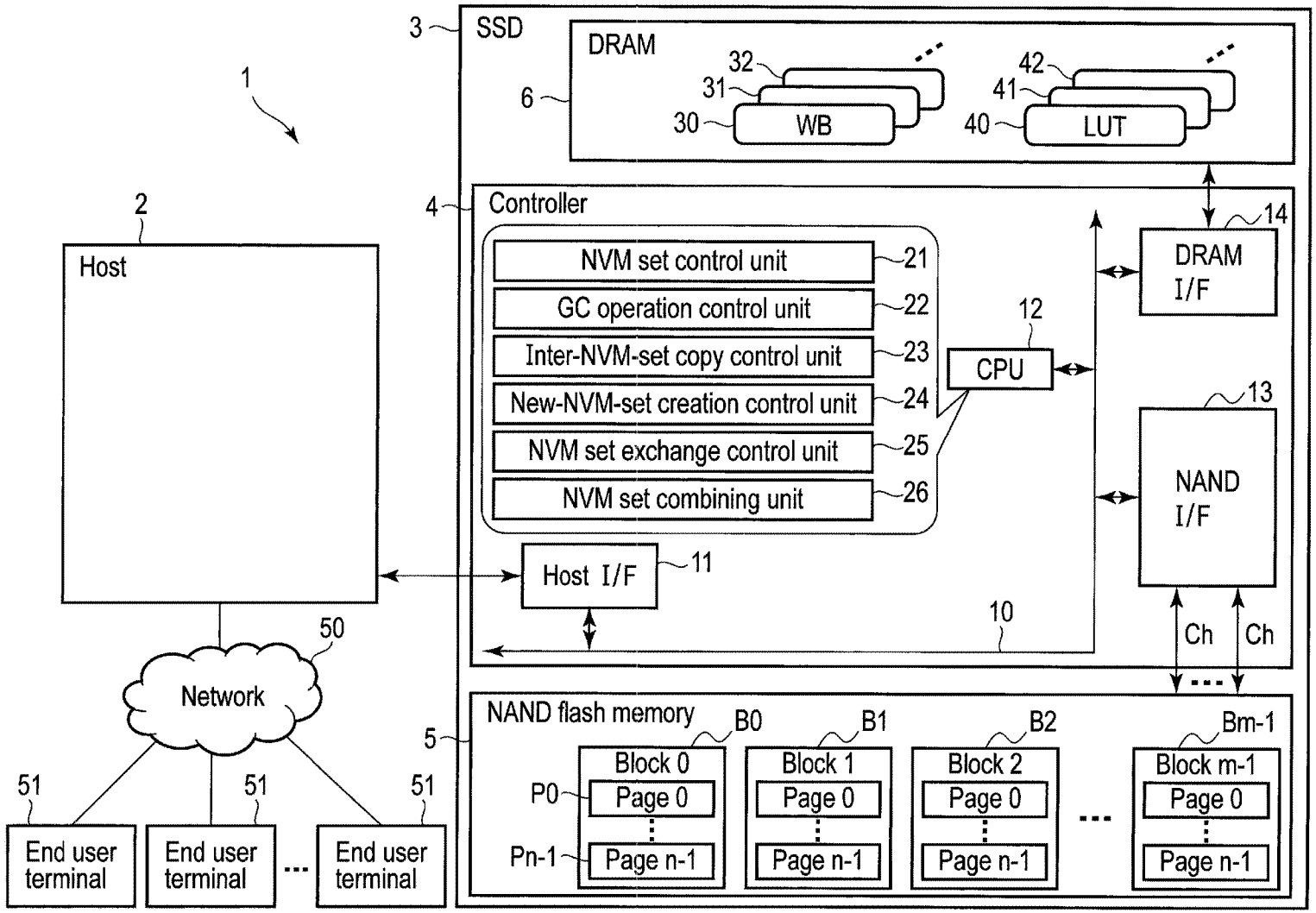
FIG. 1 is a block diagram illustrating a configuration example of a memory system of an embodiment.

First, with reference to FIG. 1, a configuration of an information processing system comprising a memory system according to an embodiment will be described.

The memory system is a semiconductor storage device configured to write data to a nonvolatile memory and to read data from the nonvolatile memory. The memory system is implemented, for example, as a NAND flash technology based solid state drive (SSD) 3.

The information processing system 1 comprises a host (host device) 2 and an SSD 3. The host 2 is an information processing apparatus such as a server or a personal computer. A typical example of a server functioning as the host 2 is a server in a data center.

In a case where the host 2 is implemented by the server in the data center, the host (server) 2 may be connected to a plurality of end user terminals (clients) 51 via a network 50. The host 2 can provide various services to the end user terminals 51. A plurality of virtual machines may be executed on a physical server functioning as the host (server) 2. The virtual machines can function as a virtual serves configured to provide various services to corresponding clients (end user terminals 51).

The SSD 3 may be used as a main storage for the information processing apparatus (computing device) functioning as the host 2. The SSD 3 may be built into the information processing apparatus or connected to the information processing apparatus via a cable or a network.

As an interface which interconnects the host 2 and the SSD 3, SCSI, Serial Attached SCSI (SAS), ATA, Serial ATA (SATA), PCI Express (PCIe), Ethernet (registered trade mark), Fibre channel, NVM Express (NVMe) (registered trade mark), and the like may be used.

The SSD 3 comprises a controller 4 and a nonvolatile memory (NAND flash memory) 5. The SSD 3 may comprise a random access memory, for example, a DRAM 6.

The NAND flash memory 5 comprises a memory cell array comprising a plurality of memory cells arranged in a matrix. The NAND flash memory 5 may be a NAND flash memory of a two-dimensional structure or a NAND flash memory of a three-dimensional structure.

The memory cell array in the NAND flash memory 5 comprises a plurality of blocks B0 to Bm-1. Each of the blocks B0 to Bm-1 is organized of a large number of pages (in this case, pages P0 to Pn-1). Blocks B0 to Bm-1 function as erase units. The blocks may be referred to as "erase blocks" or "physical blocks". Each of the pages P0 to Pn-1 comprises a plurality of memory cells connected to the same word line. The pages P0 to Pn-1 are units for a data write operation and a data read operation.

The controller 4 is electrically connected to the NAND flash memory 5 via a NAND interface 13 such as Toggle and an open NAND flash interface (ONFI), and a plurality of channels (Ch). The NAND interface 13 functions as a NAND control circuit configured to control the NAND flash memory 5.

Figure 2:
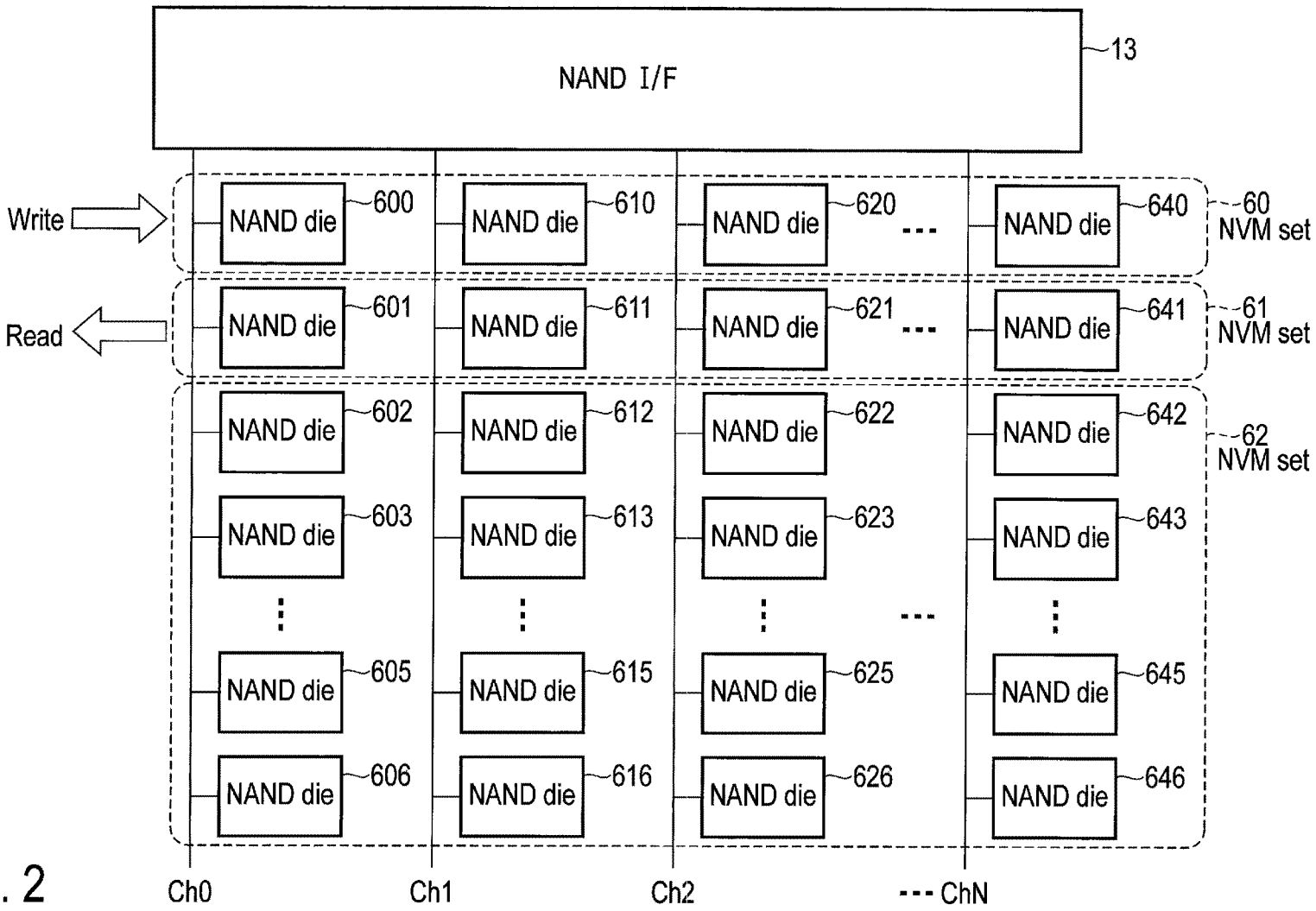
FIG. 2 is a block diagram illustrating a plurality of nonvolatile memory sets (NVM sets) each spanning a plurality of channels, which sets are obtained by classifying a plurality of NAND flash memory dies in the memory system of the embodiment.

As illustrated in FIG. 2, the NAND flash memory 5 comprises a plurality of NAND flash memory dies (in FIG. 2, illustrated as "NAND dies"). Each of the NAND flash memory dies is a nonvolatile memory die comprising a memory cell array comprising a plurality of blocks and a peripheral circuit which controls the memory cell array. The individual NAND flash memory dies can operate independently. Thus, the NAND flash memory dies function as single parallel operation units. The NAND flash memory dies are also referred to as "NAND flash memory chips".

FIG. 2 illustrates a case where a plurality of channels Ch0, Ch1, Ch2, . . . ChN are connected to the NAND interface 13 and where the same number (for example, K dies per channel, K is an integer of 2 or larger) of NAND flash memory dies are connected to each of the channels Ch0, Ch1, Ch2, . . . ChN. Each of the channels comprises a communication line (memory bus) for communication with the corresponding NAND flash memory dies.

In FIG. 2, NAND flash memory dies 600, 601, 602 to 606 are connected to the channel Ch0. NAND flash memory dies 610, 611, 612 to 616 are connected to the channel Ch1. NAND flash memory dies 620, 621, 622 to 626 are connected to the channel Ch2. Similarly, NAND flash memory dies 640, 641, 642 to 646 are connected to the channel ChN.

The controller 4 controls the NAND flash memory 5 via the channels Ch0, Ch1, Ch2, . . . ChN. The controller 4 can simultaneously drive the channels Ch0, Ch1, Ch2, . . . ChN. In other words, the NAND interface 13 comprises N NAND control circuits corresponding to the channels Ch0, Ch1, Ch2, . . . ChN, respectively. The controller 4 uses the NAND control circuits to allow the channels Ch0, Ch1, Ch2, . . . ChN to be driven independently.

In the present embodiment, the controller 4 classifies K×N NAND flash memory dies 600 to 646 into a plurality of die groups such that each of the NAND flash memory dies belongs to only one die group. The die group is hereinafter referred to as the "nonvolatile memory subset (NVM set)".

In FIG. 2, each NVM set spans a plurality of channels Ch0, Ch1, Ch2, . . . ChN. These NVM sets may by obtained by striping the K×N NAND flash memory dies 600 to 646 across the channels Ch0, Ch1, Ch2, . . . ChN. For example, the NVM set 60 comprises the NAND flash memory dies 600, 610, 620, . . . 640 connected to the channels Ch0, Ch1, Ch2, . . . ChN, respectively. The NVM set 61 comprises the NAND flash memory dies 601, 611, 621, . . . 641 connected to the channels Ch0, Ch1, Ch2, . . . ChN, respectively. The NVM set 62 comprises the NAND flash memory dies 602, 603, . . . 605, 606 connected to the channel Ch0, the NAND flash memory dies 612, 613, . . . 615, 616 connected to the channel Ch1, the NAND flash memory dies 622, 623, . . . 625, 626 connected to the channel Ch2, and the NAND flash memory dies 642, 643, . . . 645, 646 connected to the channel ChN.

As described above, in FIG. 2, the K×N NAND flash memory dies 600 to 646 is classified into the plurality of NVM sets each spanning the plurality of channels. In each of the NVM sets, a data write/read operation can be simultaneously performed on up to N NAND flash memory dies.

A plurality of regions which can be specified by the host 2 can be associated with the plurality of NVM sets, respectively. The plurality of regions is logical regions which are accessible to the host 2. One or more regions may correspond to each NVM set. The number of regions corresponding to each NVM set may vary with the NVM set.

The controller 4 can simultaneously execute a plurality of I/O commands (write commands or read commands) specifying different regions corresponding to different NVM sets without causing die contention. Therefore, for example, even when a read command intended for a region corresponding to the NVM set 61 is received from the host 2 while a data write operation is being executed in the NVM set 60, the controller 4 can immediately execute a data read operation corresponding to the read command without waiting for the data write operation to complete.

Figure 3:
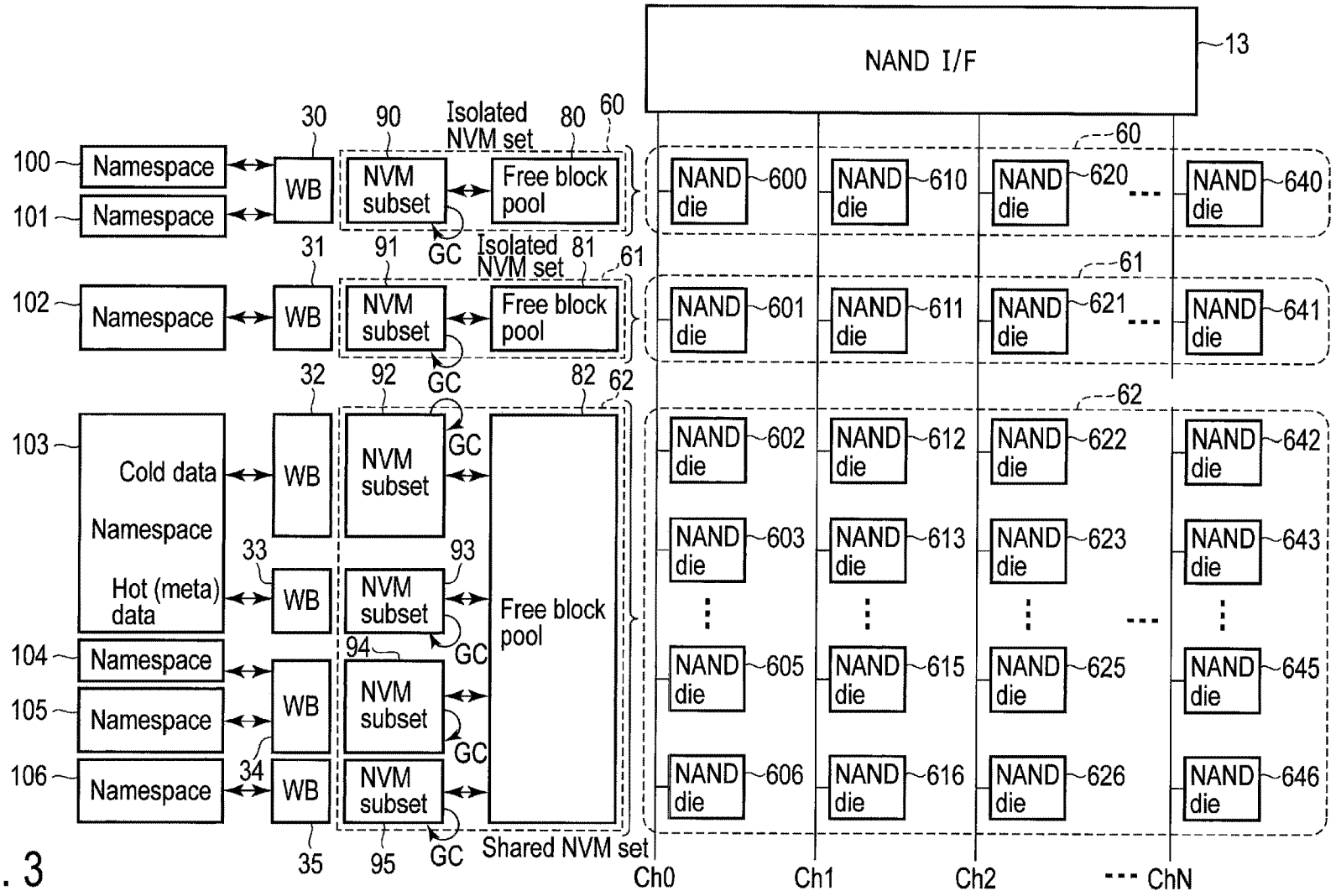
FIG. 3 is a block diagram illustrating a relation between block management corresponding to each NVM set and one or more regions (namespaces) corresponding to each NVM set.

In the SSD 3 illustrated in FIG. 3, the controller 4 can also function as a flush translation layer (FTL) configured to perform data management on the NAND flash memory 5 and block management on the NAND flash memory 5.

The data management performed by the FTL comprises (1) management of mapping information indicative a correspondence relation between logical addresses and physical addresses in the NAND flash memory 5, and (2) a process for hiding read/write in units of pages and an erase operation in units of blocks. The logical addresses are addresses used by the host 2 to address the SSD 3. Logical block addresses (LBA) are normally used as the logical addresses.

Management of mapping between the logical block addresses (LBA) and the physical addresses is performed using a lookup table (LUT) functioning as an address translation table (logical-to-physical address translation table). A physical address corresponding to a certain LBA is indicative of a physical location in the NAND flash memory 5 to which data corresponding to the LBA has been written. The lookup table (LUT) may be loaded from the NAND flash memory 5 into the DRAM 6 when the SSD 3 is powered on. In general, each lookup table has a relatively large size. Therefore, at least a part of each lookup table may be housed in the DRAM 6 as an address translation table cache.

In the NAND flash memory 5, data write to a page can be carried out only once per erase cycle. Thus, the controller 4 writes update data corresponding to a certain LBA to a physical location different from a physical location where previous data corresponding to the LBA is stored. The controller 4 updates the corresponding lookup table (LUT) to associate a physical address of the physical location to which the update data is written with the LBA. Consequently, the previous data corresponding to the LBA is invalidated.

The present embodiment uses a plurality of lookup tables (LUT) 40, 41, 42, . . . . The lookup tables (LUT) 40, 41, 42, . . . basically correspond to the respective NVM sets. Each of the lookup tables may be associated with one region or with one group for garbage collection.

Each NVM set comprises at least one group for garbage collection. The group for garbage collection comprises a plurality of blocks and is used as a unit which is subjected to garbage collection. Exclusively one lookup table may be used for an NVM set comprising only one group for garbage collection. A plurality of lookup tables may be used for an NVM set comprising a plurality of groups for garbage collection.

The controller 4 also has a multi namespace control function. The multi namespace control function enables a plurality of logical address spaces (LBA spaces) to be allocated to the SSD 3 in order to allow one storage device to be handled as a plurality of drives.

Each of the above-described plurality of regions may be implemented by a namespace. Each namespace corresponds to a region in the NAND flash memory 5. A logical address range (LBA range) is allocated to each namespace. The size of the LBA range (in other words, the number of LBAs) can be varied with the namespace. Each LBA range starts with LBA0. The individual namespaces are identified by identifiers of the namespaces.

A write command from the host 2 includes the identifier of a particular namespace, in other words, a namespace ID (NSID). The controller 4 determines a region (namespace) to be accessed to which write data is to be written, based on the namespace ID in the write command from the host 2. Similarly, a read command from the host 2 includes a namespace ID corresponding to a particular namespace. The controller 4 determines a region (namespace) to be accessed from which data is to be read, based on the namespace ID in the read command from the host 2.

Block management includes management of bad blocks, wear leveling, and garbage collection.

Wear leveling is an operation of leveling the wear of blocks.

Garbage collection is an operation of increasing the number of free blocks to which data can be written. In a garbage collection operation, the controller 4 copies only valid data in some blocks including a mixture of the valid data and invalid data to another block (for example, a free block). The valid data as used herein means data which is referred to from the LUT (i.e., data linked to a certain logical address as the latest data) and may subsequently be read by the host 2. The invalid data means data which no longer has a possibility of being read from the host 2. For example, data associated with a certain logical address is valid data, and data associated with no logical address is invalid data. The controller 4 maps, to the LBAs of the copied valid data, copy destination physical addresses of the valid data. A block including only invalid data as the valid data has been copied to another block is released as a free block. Consequently, the block can be reused after an erase operation is performed on the block.

Now, a configuration of the controller 4 will be described.

The controller 4 comprises a host interface 11, a CPU 12, the NAND interface 13, a DRAM interface 14, etc. The CPU 12, the NAND interface 13, and the DRAM interface 14 are interconnected via the bus 10.

The host interface 11 is a host interface circuit configured to perform communication with the host 2. The host interface 11 may be, for example, a PCIe controller (NVMe controller). The host interface 11 receives various commands (write commands, read commands, various control commands, unmap (UNMAP) command, and the like) from the host 2.

The write command requests the SSD 3 to write data designated by the write command. The write command may include a starting LBA, a transfer length, and an ID. The ID in the write command is an identifier for uniquely identifying a region to which data is to be written. The ID may be a namespace ID. The read command requests the SSD3 to read data designated by the read command. The read command may include a starting LBA, a transfer length, and an ID. The ID in the read command is an identifier for uniquely identifying a region from which data is to be read. The ID may be a namespace ID.

The CPU 12 is a processor configured to control the host interface 11, the NAND interface 13, and the DRAM interface 14. The CPU 12 loads a control program (firmware) from the NAND flash memory 5 or a ROM not illustrated in the drawings into the DRAM 6 in response to power-on of the SSD 3, and executes the firmware and thus various processes. The firmware may be loaded into a SRAM in the controller 4, which is not illustrated in the drawings. The CPU 12 can execute, for example, command processes for processing various commands from the host 2, in addition to the above-described FTL process. Operations of the CPU 12 can be controlled by the above-described firmware executed by the CPU 12. A part or all of each of the FTL process and the command process may be executed by dedicated hardware in the controller 4.

The CPU 12 can function as an NVM set control unit 21, a garbage collection (GC) operation control unit 22, an inter-NVM-set copy control unit 23, a new-NVM-set creation control unit 24, an NVM set exchange control unit 25, and an NVM set combining unit 26.

The NVM set control unit 21 classifies the K×N NAND flash memory dies 600 to 646 into a plurality of NVM sets such that each of the K×N NAND flash memory dies 600 to 646 belongs to only one NVM set. The NVM set control unit 21 performs a data write/read operation for one of the plurality of NVM sets in accordance with an I/O command from the host 2 designating any one of a plurality of regions including at least one region per NVM set. For example, in a case where the plurality of NVM sets have a first NVM set and a second NVM set, the NVM set control unit 21 performs a data write/read operation for the first NVM set in accordance with a first I/O command from the host 2 designating at least one region corresponding to the first NVM set, and performs a data write/read operation for the second NVM set in accordance with a second I/O command from the host 2 designating at least one region corresponding to the second NVM set.

Further, the NVM set control unit 21 individually manages free blocks in the NAND flash memory (a large number of NAND flash memory dies) 5 for each of the plurality of NVM sets by using a plurality of free block pools corresponding to the plurality of NVM sets. The free blocks mean blocks holding no valid data. For example, each of the free blocks belonging to the first NVM set is managed by a first free block pool corresponding to the first NVM set, and each of the free blocks belonging to the second NVM set is managed by a second free block pool corresponding to the second NVM set. In an operation of initializing the SSD 3, the NVM set control unit 21 places all the blocks belonging to the first NVM set in the first free block pool, and places all the blocks belonging to the second NVM set in the second free block pool.

For each of the plurality of NVM sets, the NVM set control unit 21 performs an allocate operation of allocating one of the free blocks in the corresponding free block pool as a block to which user data (write data from the host 2 or data to be copied from another block for garbage collection) is to be written, an operation of writing the user data to the allocated block, an operation of managing the block filled with the user data by using the data block pool (also referred to as an active block pool), and an operation of returning blocks which are managed by the data block pool and which hold no valid data to the corresponding free block pool.

Consequently, blocks placed in a free block pool corresponding to a certain NVM set can be used only by one or more regions corresponding to the NVM set, enabling die contention between a plurality of NVM sets to be reliably prevented. The data block pool means a pool used to manage each of blocks which belong to the corresponding NVM set and which hold valid data.

The present embodiment allows handling of two types of NVM sets, that is, an isolated NVM set and a shared NVM set.

The isolated NVM set is an NVM set comprising only one group for garbage collection (only one data block pool). In other words, a free block pool corresponding to an isolated NVM set is a free block pool dedicated to a single data block pool for managing the blocks which belong to the NVM set and which hold valid data. In the isolated NVM set, a single data block pool occupies the free block pool corresponding to the isolated NVM set.

The shared NVM set is an NVM set comprising a plurality of groups for garbage collection (a plurality of data block pools). In other words, the free block pool corresponding to the shared NVM set is a free block pool shared by a plurality of data block pools for managing the respective blocks which belong to the NVM set and which hold valid data. In the shared NVM set, a plurality of data block pools shares the free block pool corresponding to the shared NVM set.

The garbage collection (GC) operation control unit 22 independently executes garbage collection for each of the above-described groups for garbage collection.

In garbage collection of the isolated NVM set, in other words, in garbage collection of the blocks in the single data block pool belonging to the isolated NVM set, the GC operation control unit 22 performs operations of (1) allocating one of the free blocks in the free block pool corresponding to the isolated NVM set as a copy destination block, (2) copying only valid data from one or more blocks included in the data block pool and including a mixture of the valid data and invalid data to the copy destination block, and (3) returning, to the free block pool corresponding to the isolated NVM set, the blocks including only the invalid data as a result of copying the valid data to the copy destination block. Consequently, the free blocks resulting from GC of an isolated NVM set can be used only by one or more regions corresponding to the NVM set, enabling die contention between a plurality of NVM sets to be reliably prevented.

In garbage collection of the shared NVM set, in other words, in garbage collection of the blocks in one of the plurality of data block pools belonging to the shared NVM set, the GC operation control unit 22 performs operations of (1) allocating one of the free blocks in the free block pool corresponding to the shared NVM set as a copy destination block, (2) copying only valid data from one or more blocks included in the data block pool and including a mixture of the valid data and invalid data to the copy destination block, and (3) returning, to the free block pool corresponding to the shared NVM set, the blocks including only the invalid data as a result of copying the valid data to the copy destination block. Consequently, since the free blocks resulting from GC of a shared NVM set can be used only by one or more regions corresponding to the NVM set, enabling die contention between a plurality of NVM sets to be reliably prevented.

The inter-NVM-set copy control unit 23 performs an inter-NVM-set copy operation in order to level the degrees of wear of the NVM sets (the numbers of program/erase cycles of the NVM sets). The inter-NVM-set copy operation can be used, for example, to copy valid data stored in an isolated NVM set with a high degree of wear to an isolated NVM set with a low degree of wear. Consequently, the degrees of wear of these NVM sets can be leveled. The host 2 can deliver, to the SSD 3, an inter-NVM-set copy command including a parameter designating a copy source NVM set and a copy destination NVM set.

The inter-NVM-set copy control unit 23 (1) selects a block holding valid data from the blocks belonging to the copy source NVM set, as a copy source block, (2) copies only the valid data in the copy source block to a copy destination block allocated from a free block pool corresponding to a copy destination NVM set, (3) updates a lookup table managing mapping between logical addresses and physical addresses in the copy source NVM set to map a physical address indicative of a physical location in the copy destination block to which the valid data has been copied to the logical address corresponding to the copied valid data, (4) when valid data no longer exist in the copy source block, returns the copy source block to the free block pool corresponding to the copy source NVM set, and (5) repeats the operations (1) to (4) until a block holding valid data no longer exists in the copy source NVM set. Consequently, the data in the copy source NVM set (the data with a high update frequency) can be moved to the copy destination NVM set with few program/erase cycles. As a result, the copy destination NVM set with a low degree of wear is utilized to write data with a high update frequency. Therefore, this enables delay of timing when the number of program/erase cycles for the copy source NVM set reaches a limit value.

The new-NVM-set creation control unit 24 creates a new NVM set from another NVM set. For example, the new-NVM-set creation control unit 24 can create a set of some of the NAND flash memory dies included in a certain NVM set, as a new NVM set. Consequently, one NVM set can be divided into two NVM sets.

The NVM set exchange control unit 25 performs an NVM set exchange operation in order to level the degrees of wear (the numbers of program/erase cycles) of the NVM sets. The NVM set exchange operation can be used to exchange data between an isolated NVM set with a high degree of wear and an isolated NVM set with a low degree of wear. Consequently, the degrees of wear of these NVM sets can be leveled. The host 2 can transmit, to the SSD 3, an NVM set exchange command including parameters designating two NVM sets (a first NVM set and a second NVM set) for which stored data are to be exchanged with each other.

The NVM set exchange control unit 25 performs an operation of copying only the valid data in the first NVM set to the second NVM set and an operation of copying only the valid data in the second NVM set to the first NVM set.

In the operation of copying only the valid data in the first NVM set to the second NVM set, the NVM set exchange control unit 25 (1) selects a block holding valid data from the blocks belonging to the first NVM set, as a copy source block, (2) copies only the valid data in the copy source block to a copy destination block allocated from the free block pool corresponding to the second NVM set, (3) updates the lookup table managing the mapping between logical addresses and physical addresses in the first NVM set to map the physical address indicative of the physical location in the copy destination block to which the valid data has been copied to the logical address corresponding to the copied valid data, (4) when valid data no longer exist in the copy source block, returns the copy source block to the free block pool corresponding to the first NVM set, and (5) repeats the operations (1) to (4) until a block holding valid data no longer exists in the first NVM set.

In the operation of copying only the valid data in the second NVM set to the first NVM set, the NVM set exchange control unit 25 (1) selects a block holding valid data from the blocks belonging to the second NVM set, as a copy source block, (2) copies only the valid data in the copy source block to a copy destination block allocated from the free block pool corresponding to the first NVM set, (3) updates the lookup table managing the mapping between logical addresses and physical addresses in the second NVM set to map the physical address indicative of the physical location in the copy destination block to which the valid data has been copied to the logical address corresponding to the copied valid data, (4) when valid data no longer exist in the copy source block, returns the copy source block to the free block pool corresponding to the second NVM set, and (5) repeats the operations (1) to (4) until a block holding valid data no longer exists in the second NVM set.

Consequently, the degrees of wear of the two NVM sets can be leveled.

The NVM set combining unit 26 combines two or more NVM sets into one NVM set. The host 2 can designate the two or more NVM sets to be combined and the one NVM set to which the NVM sets are to be combined.

The NAND interface 13 controls the NAND flash memory 5 under the control of the CPU 12. The DRAM interface 14 is a DRAM controller configured to control the DRAM 6 under the control of the CPU 12. A part of the storage region in the DRAM 6 is utilized as a write buffer (WB) in which write data from the host 2 is temporarily stored. In the present embodiment, a plurality of write buffers (WB) 30, 31, 32, . . . are utilized. At least one write buffer (WB) may be prepared for each NVM set. Other part of the storage region in the DRAM 6 is utilized to store the above-described lookup tables (LUTs) 40, 41, 42, . . . .

FIG. 3 illustrates an example of a relation between block management corresponding to each NVM set in FIG. 2 and one or more regions (namespaces) corresponding to each NVM set.

The NVM set 60 comprises the NAND flash memory die 600 connected to the channel Ch0, the NAND flash memory die 610 connected to the channel Ch1, the NAND flash memory die 620 connected to the channel Ch2, . . . and the NAND flash memory die 640 connected to the channel ChN. The blocks (free blocks) which belong to the NVM set 60 and which hold no valid data are each managed by a free block pool 80 corresponding to the NVM set 60. In a process of initializing the SSD 3, the controller 4 places all the blocks belonging to the NVM set 60, in other words, all the blocks in the NAND flash memory dies 600, 610, 620, . . . 640, in the free block pool 80 corresponding to the NVM set 60.

The blocks belonging to the NVM set 60 are managed using the free block pool 80 and an NVM subset 90. The NVM subset 90 is a data block pool configured to manage each of the blocks which belong to the NVM set 60 and which hold valid data. The blocks included in the NVM subset 90 form one group for garbage collection.

The free block pool 80 is a free block pool dedicated to one NVM subset 90. Therefore, the NVM set 60 functions as an NVM set exclusively used by one NVM subset 90 (isolated NVM set). One write buffer (WB) 30 is associated with the NVM subset 90.

The NVM set 60 is utilized as a physical storage space for at least one region (namespace) which can be designated by the host 2. The NVM set 60 may be a physical storage space dedicated to only one namespace. FIG. 3 illustrates a case where the NVM set 60 is utilized as a physical storage space for the two namespaces 100, 101.

The NVM set 61 comprises the NAND flash memory die 601 connected to the channel Ch0, the NAND flash memory die 611 connected to the channel Ch1, the NAND flash memory die 621 connected to the channel Ch2, . . . and the NAND flash memory die 641 connected to the channel ChN. The blocks (free blocks) which belong to the NVM set 61 and which hold no valid data are each managed by a free block pool 81 corresponding to the NVM set 61. In the process of initializing the SSD 3, the controller 4 places all the blocks belonging to the NVM set 61, in other words, all the blocks in the NAND flash memory dies 601, 611, 621, . . . 641, in the free block pool 81 corresponding to the NVM set 61.

The blocks belonging to the NVM set 61 are managed using the free block pool 81 and an NVM subset 91. The NVM subset 91 is a data block pool configured to manage each of the blocks which belong to the NVM set 61 and which hold valid data. The blocks included in the NVM subset 91 form one group for garbage collection. The free block pool 81 is a free block pool dedicated to one NVM subset 91. Therefore, the NVM set 61 functions as an NVM set exclusively used by one NVM subset 91 (isolated NVM set). One write buffer (WB) 31 is associated with the NVM subset 91.

The NVM set 61 is utilized as a physical storage space for at least one region (namespace). The NVM set 61 may be a physical storage space dedicated to only one namespace. FIG. 3 illustrates a case where the NVM set 61 is utilized as a physical storage space for one namespaces 102.

The NVM set 62 comprises the NAND flash memory dies 602, 603, . . . 605, 606 connected to the channel Ch0, the NAND flash memory dies 612, 613, . . . 615, 616 connected to the channel Ch1, the NAND flash memory dies 622, 623, . . . 625, 626 connected to the channel Ch2, . . . and the NAND flash memory dies 642, 643, . . . 645, 646 connected to the channel ChN. The blocks (free blocks) which belong to the NVM set 62 and which hold no valid data are each managed by a free block pool 82 corresponding to the NVM set 62. In the process of initializing the SSD 3, the controller 4 places all the blocks belonging to the NVM set 62, in other words, all the blocks in the NAND flash memory dies 602 to 606, 612 to 616, 622 to 626, . . . 642 to 646, in the free block pool 82 corresponding to the NVM set 62.

The blocks belonging to the NVM set 62 are managed using the free block pool 82 and NVM subsets 92, 93, 94, 95. Each of the NVM subsets 92, 93, 94, 95 is a data block pool configured to manage each of the blocks which belong to the NVM set 62 and which hold valid data. The blocks included in the NVM subset 92 form one group for garbage collection, the blocks included in the NVM subset 93 form another group for garbage collection, the blocks included in the NVM subset 94 form yet another group for garbage collection, and the blocks included in the NVM subset 95 form still another group for garbage collection. The free block pool 82 is a free block pool shared by the NVM subsets 92, 93, 94, 95. Therefore, the NVM set 62 functions as a shared NVM set shared by the plurality of NVM subsets 92 to 95. The NVM subsets 92, 93, 94, 95 are associated with write buffers (WB) 32, 33, 34, 35.

The NVM set 62 is utilized as a physical storage space for at least one region (namespace). The NVM set 62 may be a physical storage space dedicated to only one namespace, or a physical storage space for a plurality of namespaces. FIG. 3 illustrates a case where the NVM set 62 is utilized as a physical storage space for four namespaces 103, 104, 105, 106.

FIG. 3 illustrates a case where the namespace 103 uses the two NVM subsets 92 and 93. For example, an LBA range corresponding to the namespace 103 may be divided into two sub LBA ranges. Write data corresponding to one of the sub LBA ranges (for example, cold data with a low update frequency) may be written to an input block for the NVM subset 92 (write destination block) via the write buffer (WB) 32. Write data corresponding to the other sub LBA range (for example, hot data with a high update frequency (meta data)) may be written to an input block for the NVM subset 93 (write destination block) via the write buffer (WB) 33.

In FIG. 3, a data write/read operation is performed for the NVM set 60 in accordance with an I/O command from the host 2 including the ID of the namespace 100 or 101. Further, a data write/read operation is performed for the NVM set 61 in accordance with an I/O command from the host 2 including the ID of the namespace 102. Further, a data write/read operation is performed for the NVM set 62 in accordance with an I/O command from the host 2 including the ID of any of the namespaces 103 to 106. Therefore, the NVM sets 60, 61, 62 can be simultaneously accessed, and a long latency (a particular long read latency) resulting from die contention can be suppressed.

Furthermore, garbage collection is executed independently for each NVM subset, and thus, a namespace exclusively using one or more NVM subsets is not affected (GC contention) by garbage collection of another NVM subset used by another namespace.

The shared NVM set 62 has the following features.

Inside the shared NVM set 62, the free block pool 82 is shared by the plurality of NVM subsets 92 to 95, and thus, die contention may occur. However, when a new input block for a certain NVM subset needs to allocated, the controller 4 can select a block having a small number of program/erase cycles from the free blocks in the shared free block pool 82, and allocate the selected block as a new input block. Consequently, degrees of wear of the NVM subsets 92, 93, 94, 95 can be leveled.

The isolated NVM sets 60, 61 have the following features.

Inside each of the isolated NVM sets 60, 61, one NVM subset can exclusively use one free block pool. Therefore, if one namespace is associated with this one NVM subset, the namespace can exclusively use the isolated NVM set without causing die contention. However, the isolated NVM set shares no free blocks with the other NVM sets, and thus, if data stored in a particular isolated NVM set has a high rewrite frequency (high update frequency), this isolated NVM set may have a higher degree of wear than the other NVM sets. Such uneven wear may be a factor which shortens the life of the SSD 3.

In the present embodiment, the shared NVM set and the isolated NVM set can be allowed to coexist in one SSD 3. Therefore, for example, the shared NVM set and the isolated NVM set can be used differently according to a workload.

In the case in FIG. 3, the following environment is provided for the individual namespaces.

<NVM Set 60>

The namespaces 100, 101 share the one NVM subset 90. No die contention occurs between the namespaces 100, 101 and the other namespaces, whereas GC contention may occur between the namespaces 100, 101.

<NVM Set 61>

The namespace 102 exclusively uses the one NVM subset 91. No die contention or GC contention occurs between the namespace 102 and the other namespaces.

<NVM Set 62>

The namespace 103 exclusively uses the two NVM sets 92, 93. Die contention may occur between the namespace 103 and the other namespaces which use the NVM set 62, whereas no GC contention occurs between the namespace 103 and the other namespaces.

The namespaces 104, 105 share the one NVM subset 94. Die contention may occur between the namespaces 104, 105 and the other namespaces which use the NVM set 62. No GC contention occurs between the namespaces 104, 105 and the other namespaces, whereas GC contention may occur between the namespaces 104, 105.

The namespace 106 exclusively uses the one NVM subset 95. Die contention may occur between the namespace 106 and the other namespaces which use the NVM set 62, whereas no GC contention occurs between the namespace 106 and the other namespaces.

Now, with reference to FIG. 4, a host write/garbage collection operation for the isolated NVM sets 60, 61 will be described.

Figure 4:
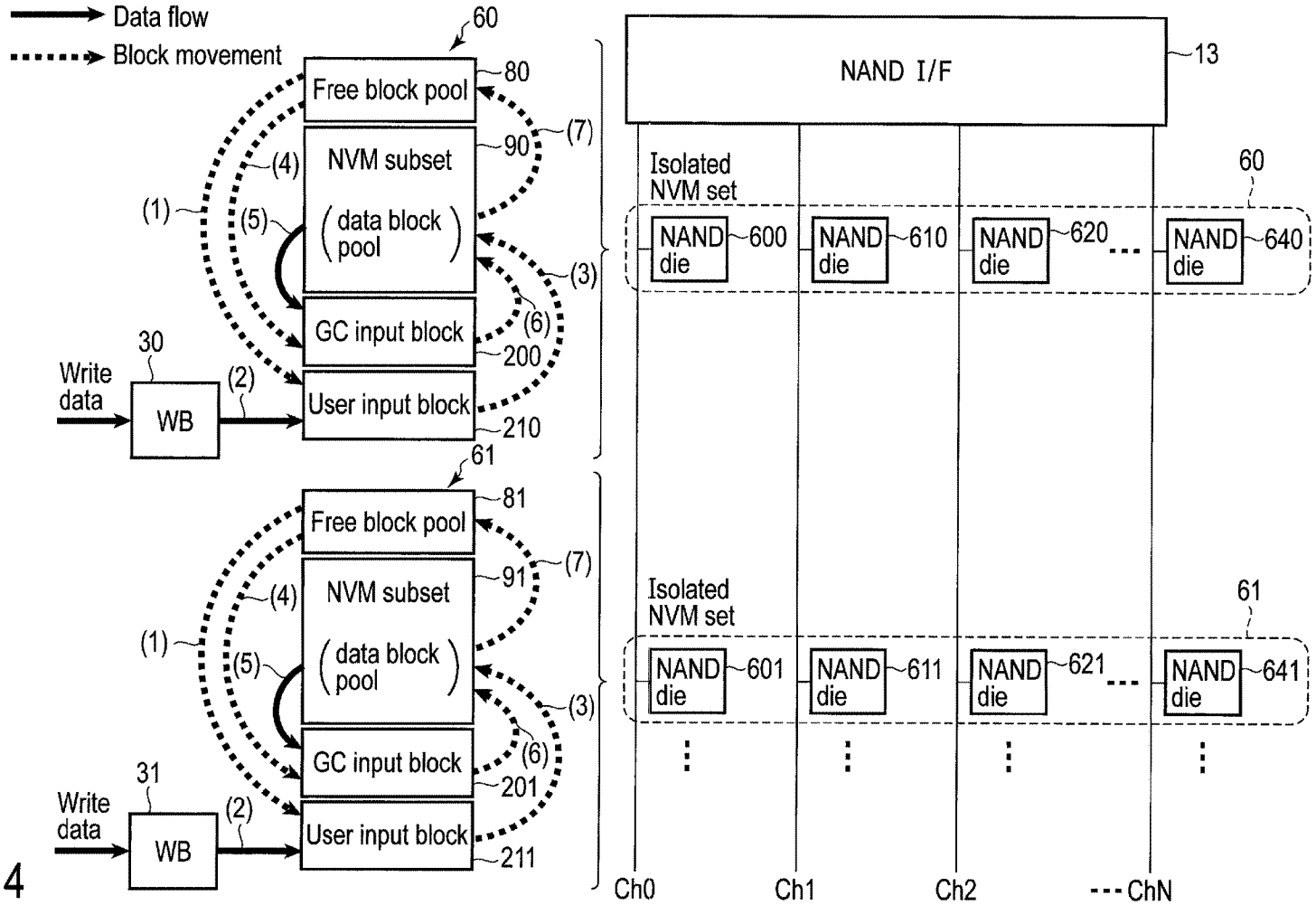
FIG. 4 is a diagram illustrating a host write/garbage collection operation for an isolated NVM set, which operation is performed by the memory system of the embodiment.

A upper left part of the FIG. 4 illustrates a host write/garbage collection operation for the NVM set 60.

(1) Allocation of the User Input Block

First, one of the free blocks in the free block pool 80 is allocated as a user input block 210. The user input block 210 is a block to which write data from the host 2 is to be written and is also referred to as a write destination block. If the user input block 210 has already been allocated, this operation is not performed.

(2) Host Write

Write data from the host 2 is written to the user input block 210 from the write buffer 30. The write buffer 30 temporarily stores write data associated with the namespace 100 or the namespace 101. The lookup table corresponding to the NVM set 60 is updated. Consequently, a physical address indicative of a physical location in the user input block 210 to which the write data has been written is mapped to a logical address (LBA) corresponding to the write data.

(3) Movement of the User Input Block

When the user input block 210 is filled with the write data, the user input block 210 is moved to the NVM subset (data block pool) 90. In other words, the user input block 210 filled with the data is managed by the NVM subset (data block pool) 90.

(4) Allocation of the GC Input Block

When garbage collection needs to be executed in the NVM set 60, a garbage collection operation for the blocks in the NVM subset 90 is performed independently of the other NVM sets. For example, when the number of blocks included in the NVM subset 90 is larger than a certain threshold X1 corresponding to the NVM subset 90, the garbage collection operation may be determined to be necessary. The threshold X1 may be determined based on the total number of blocks which can be allocated for the NVM subset 90. For example, the certain threshold X1 corresponding to the NVM set 90 may be a value resulting from subtraction of a predetermined number from the total number of blocks which can be allocated for the NVM subset 90.

When the garbage collection operation is needed in the NVM set 60, one free block in the free block pool 80 is allocated as the GC input block 200. The GC input block 200 is a block to which valid data is to be copied for garbage collection and is also referred to as a copy destination block.

(5) Copying of Valid Data

One or more blocks including a mixture of valid data and invalid data are selected from the blocks in the NVM subset 90 as copy source blocks. Only the valid data in the selected blocks is copied to the GC input block 200. The lookup table corresponding to the NVM set 60 is updated. Consequently, a physical address indicative of a physical location in the GC input block 200 to which the valid data has been copied is mapped to a logical address (LBA) corresponding to the copied valid data.

(6) Movement of the GC Input Block

When the GC input block 200 is filled with the valid data, the GC input block 200 is moved to the NVM subset 90. In other words, the GC input block 200 filled with the valid data is managed by the NVM subset (data block pool) 90.

(7) Returning of Blocks

Blocks which are managed by the NVM subset 90 and which do not hold valid data are returned from the NVM subset 90 to the free block pool 80. Blocks which do not hold valid data are blocks where all the data therein are invalidated by host write, or blocks where all the valid data therein are copied to the copy destination block by the garbage collection operation.

A lower left part of FIG. 4 illustrates a host write/garbage collection operation for the NVM set 61.

(1) Allocation of the User Input Block

One free block in the free block pool 81 is allocated as a user input block 211.

(2) Host Write

Write data from the host 2 is written to the user input block 211 from the write buffer 31. The write buffer 31 temporarily stores write data associated with the namespace 102. The lookup table corresponding to the NVM set 61 is updated. Consequently, a physical address indicative of a physical location in the user input block 211 to which the write data has been written is mapped to a logical address (LBA) corresponding to the write data.

(3) Movement of the User Input Block

When the user input block 211 is filled with the write data, the user input block 211 is moved to the NVM subset (data block pool) 91. In other words, the user input block 211 filled with the data is managed by the NVM subset (data block pool) 91.

(4) Allocation of the GC Input Block

When garbage collection needs to be executed in the NVM set 61, a garbage collection operation for the blocks in the NVM subset 91 is performed independently of the other NVM sets. For example, when the number of blocks included in the NVM subset 91 is larger than the certain threshold X1 corresponding to the NVM subset 91, the garbage collection operation may be determined to be necessary. The threshold X1 may be determined based on the total number of blocks which can be allocated for the NVM subset 91. For example, the certain threshold X1 corresponding to the NVM set 91 may be a value resulting from subtraction of a predetermined number from the total number of blocks which can be allocated for the NVM subset 91.

When the garbage collection operation is needed in the NVM set 61, one free block in the free block pool 81 is allocated as the GC input block 201.

(5) Copying of Valid Data

One or more blocks including a mixture of valid data and invalid data are selected from the blocks in the NVM subset 91 as copy source blocks. Only the valid data in the selected blocks is copied to the GC input block 201. The lookup table corresponding to the NVM set 61 is updated. Consequently, a physical address indicative of a physical location in the GC input block 201 to which the valid data has been copied is mapped to a logical address (LBA) corresponding to the copied valid data.

(6) Movement of the GC Input Block

When the GC input block 201 is filled with the valid data, the GC input block 201 is moved to the NVM subset 91. In other words, the GC input block 201 filled with the valid data is managed by the NVM subset (data block pool) 91.

(7) Returning of Blocks

Blocks which are managed by the NVM subset 91 and which do not hold valid data are returned from the NVM subset 91 to the free block pool 81. Blocks which do not hold valid data are blocks where all the data therein are invalidated by host write or blocks where all the valid data therein are copied to the copy destination block by the garbage collection operation.

Figure 5:
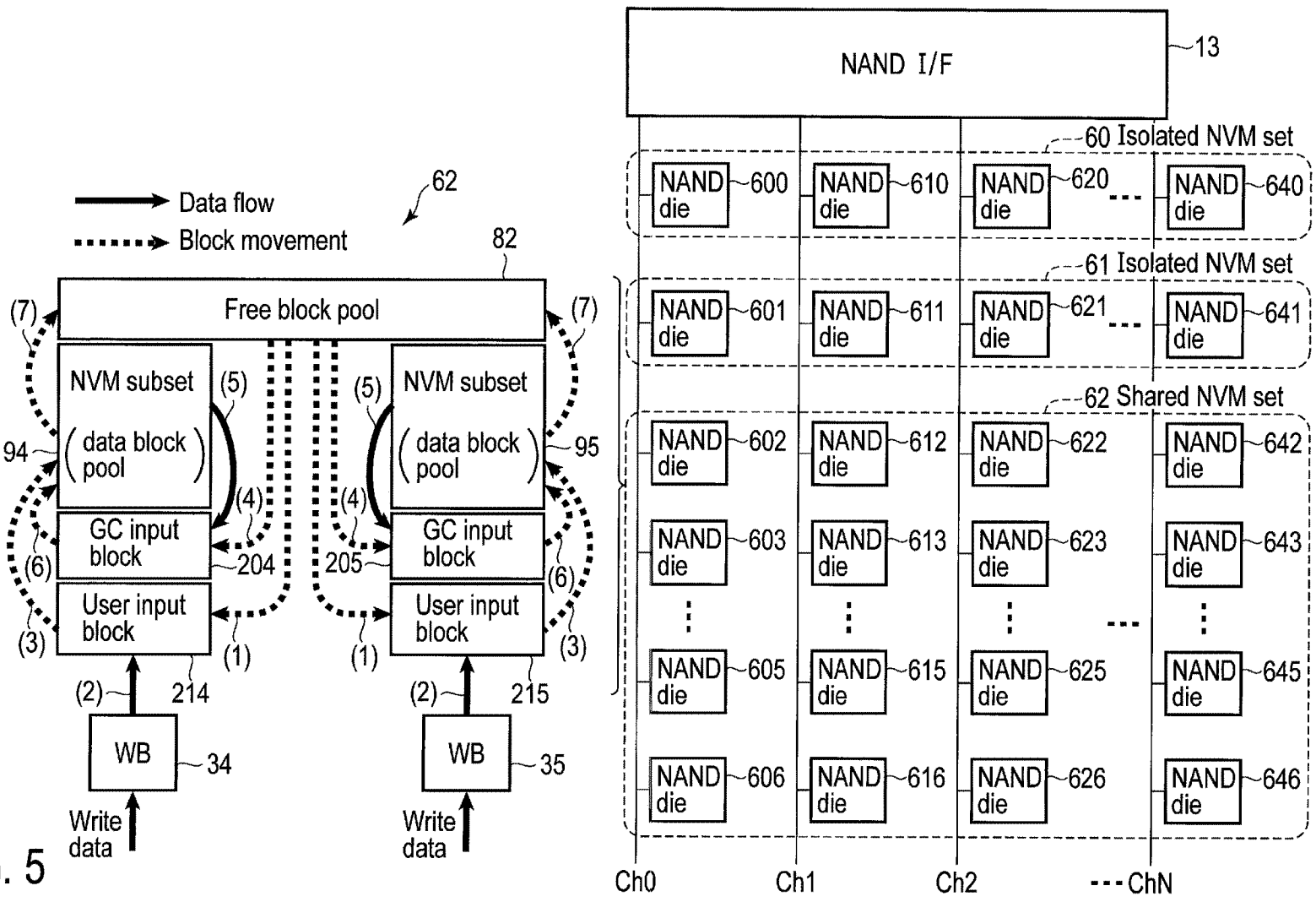
FIG. 5 is a diagram illustrating a host write/garbage collection operation for a shared NVM set, which operation is performed by the memory system of the embodiment.

FIG. 5 is a host write/garbage collection operation performed for the shared NVM set 62. In FIG. 5, a case is assumed where the shared NVM set 62 comprises only the two NVM subsets 94, 95.

A host write/garbage collection operation for the NVM subset 94 is performed as follows.

(1) Allocation of the User Input Block

One free block in the free block pool 82 is allocated as a user input block 214.

(2) Host Write

Write data from the host 2 is written to the user input block 214 from the write buffer 34. The write buffer 34 temporarily stores write data associated with the namespace 104 or 105. The lookup table corresponding to the NVM subset 94 is updated. Consequently, a physical address indicative of a physical location in the user input block 214 to which the write data has been written is mapped to a logical address (LBA) corresponding to the write data.

(3) Movement of the User Input Block

When the user input block 214 is filled with the write data, the user input block 214 is moved to the NVM subset (data block pool) 94. In other words, the user input block 214 filled with the data is managed by the NVM subset (data block pool) 94.

(4) Allocation of the GC Input Block

When garbage collection needs to be executed in the NVM subset (data block pool) 94, a garbage collection operation for the blocks in the NVM subset 94 is performed independently of the other NVM sets and the other NVM subsets in the NVM set 62. For example, when the number of blocks included in the NVM subset 94 is larger than the certain threshold X1 corresponding to the NVM subset 94, the garbage collection operation may be determined to be necessary. The threshold X1 may be determined based on the total number of blocks which can be allocated for the NVM subset 94. For example, the certain threshold X1 corresponding to the NVM set 94 may be a value resulting from subtraction of a predetermined number from the total number of blocks which can be allocated for the NVM subset 94.

When the garbage collection operation is needed for the NVM subset 94, one free block in the free block pool 82 is allocated as a GC input block 204.

(5) Copying of Valid Data

One or more blocks including a mixture of valid data and invalid data are selected from the blocks in the NVM subset 94 as copy source blocks. Only the valid data in the selected blocks is copied to the GC input block 204. The lookup table corresponding to the NVM subset 94 is updated. Consequently, a physical address indicative of a physical location in the GC input block 204 to which the valid data has been copied is mapped to a logical address (LBA) corresponding to the copied valid data.

(6) Movement of the GC Input Block

When the GC input block 204 is filled with the valid data, the GC input block 204 is moved to the NVM subset 94. In other words, the GC input block 204 filled with the valid data is managed by the NVM subset (data block pool) 94.

(7) Returning of Blocks

Blocks which are managed by the NVM subset 94 and which do not hold valid data are returned from the NVM subset 94 to the free block pool 82. Blocks which do not hold valid data are blocks where all the data therein are invalidated by host write or blocks where all the valid data therein are copied to the copy destination block by the garbage collection operation.

A host write/garbage collection operation for the NVM subset 95 is performed in accordance with the same procedure for the host write/garbage collection operation for the NVM subset 94.

Figure 6:
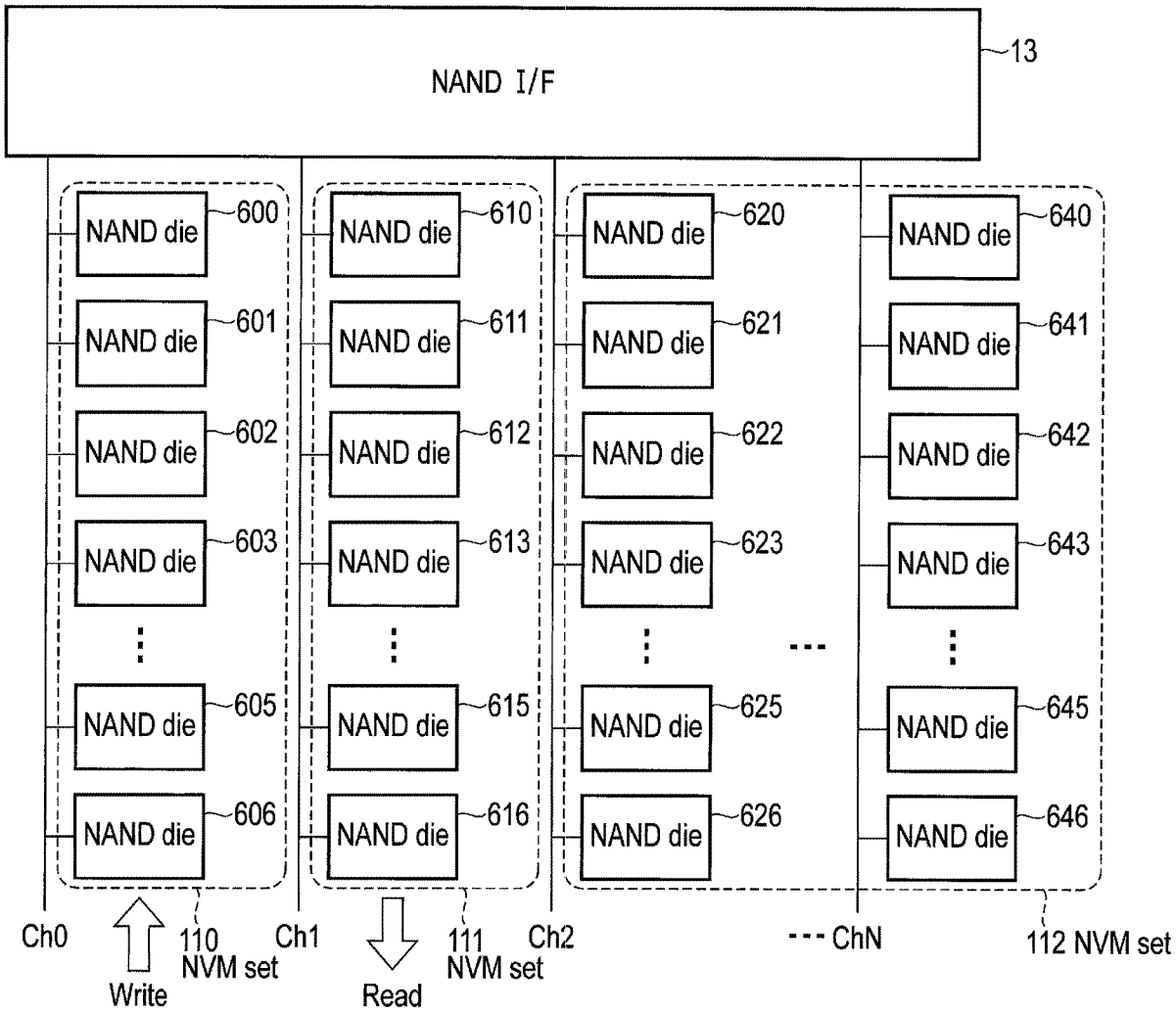
FIG. 6 is a block diagram illustrating a plurality of NVM sets each comprising a set of NAND flash memory dies connected to the same channel, which sets are obtained by classifying a plurality of NAND flash memory dies in the memory system of the embodiment.

FIG. 6 illustrates another configuration example of a plurality of NVM sets.

In FIG. 6, each NVM set comprises a set of NAND flash memory dies connected to the same channel. That is, an NVM set 110 comprises the NAND flash memory dies 600, 601, 602, 603, . . . 605, 606 connected to the channel Ch0. An NVM set 111 comprises the NAND flash memory dies 610, 611, 612, 613, . . . 615, 616 connected to the channel Ch1. An NVM set 112 comprises the NAND flash memory dies 620, 621, 622, 623, . . . 625, 626 connected to the channel Ch2, . . . the NAND flash memory dies 640, 641, 642, 643, . . . 645, 646 connected to the channel ChN.

In the NVM set configuration in FIG. 6, accesses to the NVM sets 110, 111, 112 are executed via different channels. Therefore, on whichever NAND flash memory die in a certain NVM set a data write/read operation is being performed, a data write/read operation can be immediately performed for any NAND flash memory die in another NVM set.

In the NVM set configuration in FIG. 2 in which each NVM set spans a plurality of channels, one channel is shared among the NVM sets. Therefore, in the NVM set configuration in FIG. 2, if a write/read request to the NAND flash memory die 600 in the NVM set 60 and a write/read request to the NAND flash memory die 601 in the NVM set 61 are simultaneously issued, latency may increase due to access contention to the channel Ch0.

In the NVM set configuration in FIG. 6, accesses to the NVM sets 110, 111, 112 are executed via different channels, and thus, even if write/read requests to the NVM sets 110, 111, 112 are simultaneously issued, the write/read requests can be immediately performed. Therefore, latency on access requests from the host 2 can be reduced.

However, in the NVM set configuration in FIG. 6, peak I/O performance of each NVM set is limited to the performance of a single channel. Therefore, the NVM set configuration in FIG. 6 is suitably utilized in combination with a mechanism which enables the performance of a single channel to be improved.

Figure 7:
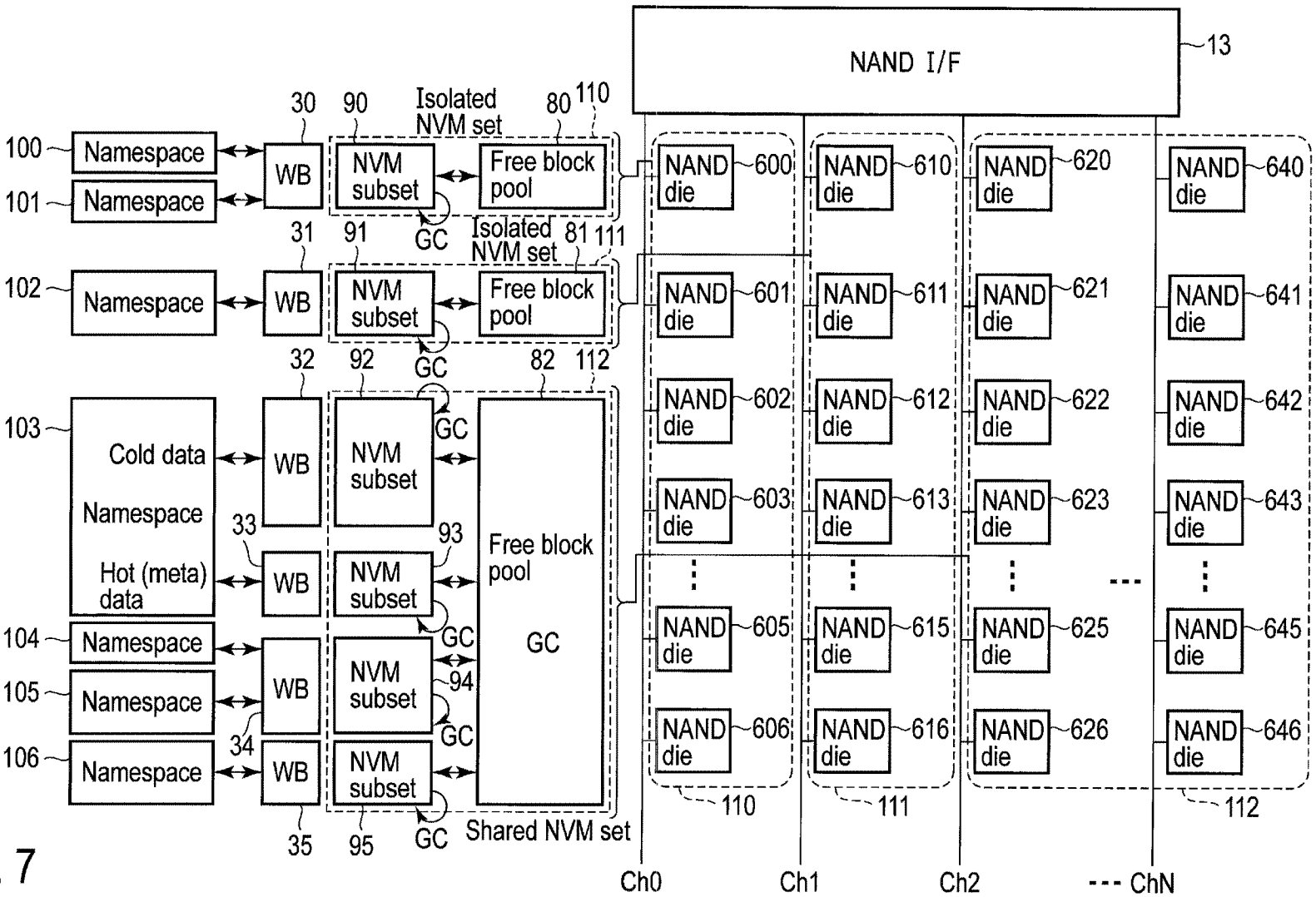
FIG. 7 is a block diagram illustrating a relation between block management corresponding to each NVM set in FIG. 6 and one or more regions (namespaces) corresponding to each NVM set.

FIG. 7 illustrates a relation between block management corresponding to each NVM set in FIG. 6 and one or more regions (namespaces) corresponding to each NVM set.

Like the NVM set 60 in FIG. 2, the NVM set 110 can function as an isolated NVM set. In the process of initializing the SSD 3, all the blocks belonging to the NVM set 110 are placed in the free block pool 80 dedicated to the NVM subset 90. Like the NVM set 61 in FIG. 2, the NVM set 111 can function as an isolated NVM set. In the process of initializing the SSD 3, all the blocks belonging to the NVM set 111 are placed in the free block pool 81 dedicated to the NVM subset 91. Like the NVM set 62 in FIG. 2, the NVM set 112 can function as a shared NVM set. In the process of initializing the SSD 3, all the blocks belonging to the NVM set 112 are placed in the free block pool 82 shared by the NVM subsets 92 to 95.

Figure 8:
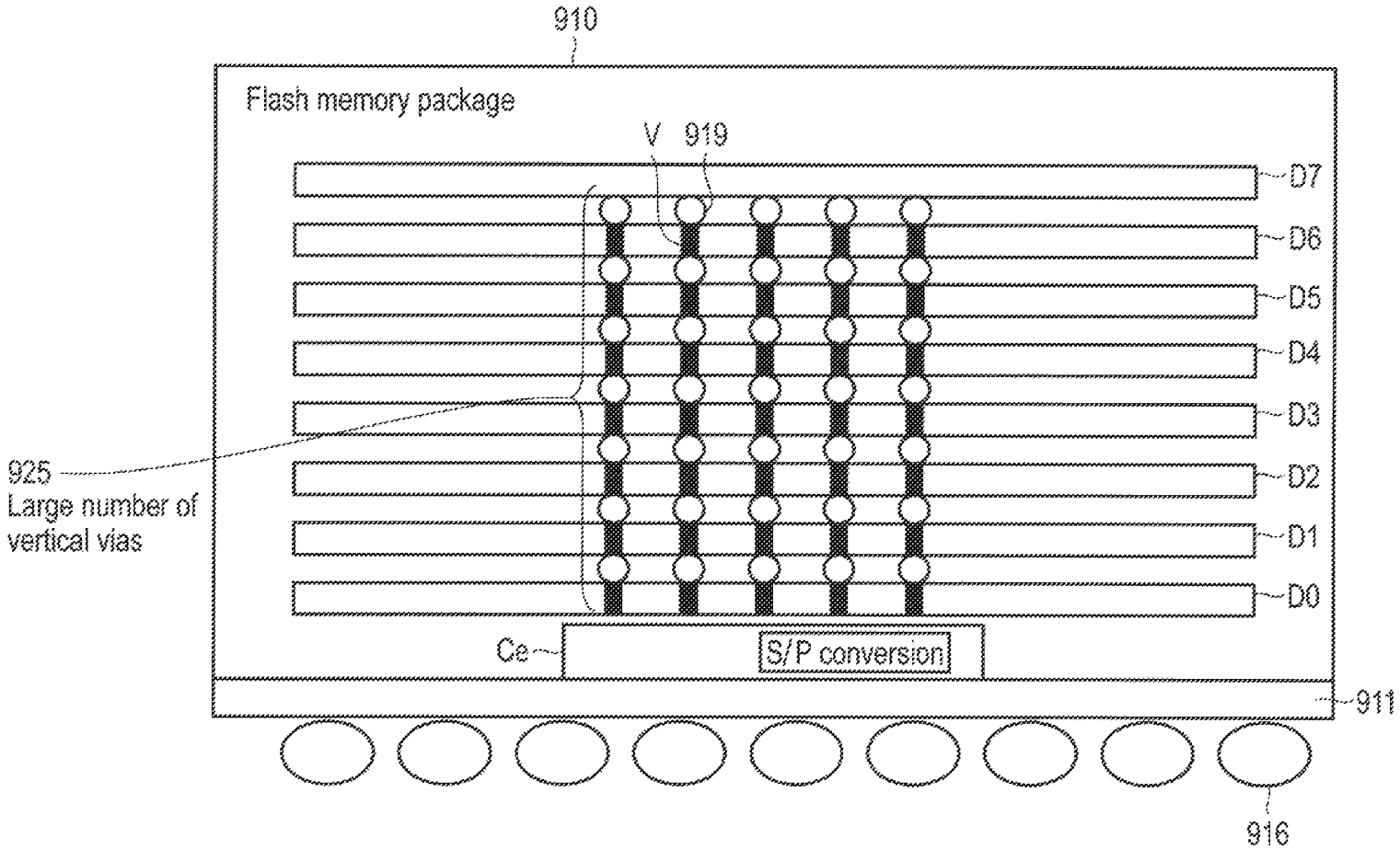
FIG. 8 is a diagram schematically illustrating a flash memory package applied to the memory system of the embodiment.

FIG. 8 schematically illustrates a flash memory package which can be used as the NAND flash memory 5 mounted in the SSD 3.

This flash memory package 910 is a memory package which enables an increase in the rate of data input and data output and a reduction in power consumption based on a through silicon via (TSV) technique which uses an electrode perpendicularly penetrating the inside of NAND flash memory dies stacked in the package. In the flash memory package 910, the plurality of stacked NAND flash memory dies is housed in the single package. A case is illustrated where eight NAND flash memory dies D0 to D7 are housed in a single package. However, the number of NAND flash memory dies housed in the package is not limited to this example.

The flash memory package 910 comprises a package substrate 911 such as a printed wiring board, an interface die (also referred to as an interface chip) Ce, and the above-described stacked NAND flash memory dies D0 to D7. On a back surface of the package substrate 911, a plurality of solder bumps 916 is arranged which functions as a plurality of external I/O terminals (electrodes) to allow signals to be input and output. These signals include I/O signals of an 8 bit width and various control signals (a plurality of chip enable signals CE, a command latch enable signal CLE, an address latch enable signal ALE, a write enable signal WE, a read enable signal RE, a plurality of ready/busy signals RB, and the like). The I/O signals of an 8 bit width are used to transmit commands, addresses, data, and the like. A part of the address may include a chip address. A NAND flash memory die to be accessed may be selected based on a combination of the chip enable signal CE and the chip address.

The interface die Ce is arranged on a front surface of the package substrate 911. The interface die Ce is connected to the plurality of solder bumps 916 via a wiring layer not illustrated in the drawings.

The stacked NAND flash memory dies D0 to D7 are interconnected by a large number of vertical vias 925. The interface die Ce transmits the I/O signals, the chip enable signals CE, the command latch enable signal CLE, the address latch enable signal ALE, the write enable signal WE, the read enable signal RE, and the like to the NAND flash memory dies D0 to D7 via the large number of vertical vias 925, and receives the I/O signals, the ready/busy signals RB, and the like from the NAND flash memory dies D0 to D7 via the large number of vertical vias 925.

The interface die Ce may incorporate a parallel/serial conversion circuit. The interface die Ce may convert the I/O signals of an 8 bit width from the controller 4 into, for example, I/O signals of a 64 bit width using the parallel/serial conversion circuit, and transmit the I/O signals of a 64 bit width to the NAND flash memory dies D0 to D7 via particular 64 vertical vias included in the large number of vertical vias 925.

Each of the vertical vias 925 comprises a plurality of through electrodes V penetrating semiconductor substrates of the stacked NAND flash memory dies D0 to D7, and a plurality of bump electrodes (solder bumps) 919 each connecting corresponding two of the stacked NAND flash memory dies D0 to D7.

In a conventional memory package using wire bonding, an increased number of dies stacked increase the parasitic capacitance and parasitic resistance of external I/O terminals of the package, making the memory package difficult to operate at high frequency.

In the flash memory package 910 in FIG. 8, the stacked NAND flash memory dies D0 to D7 are interconnected by the large number of vertical vias 925 instead of bonding wire. Therefore, the parasitic capacitance and parasitic resistance of the external I/O terminals can be reduced to enable the NAND flash memory dies in the flash memory package 910 to operate at high operating frequency.

Figure 9:
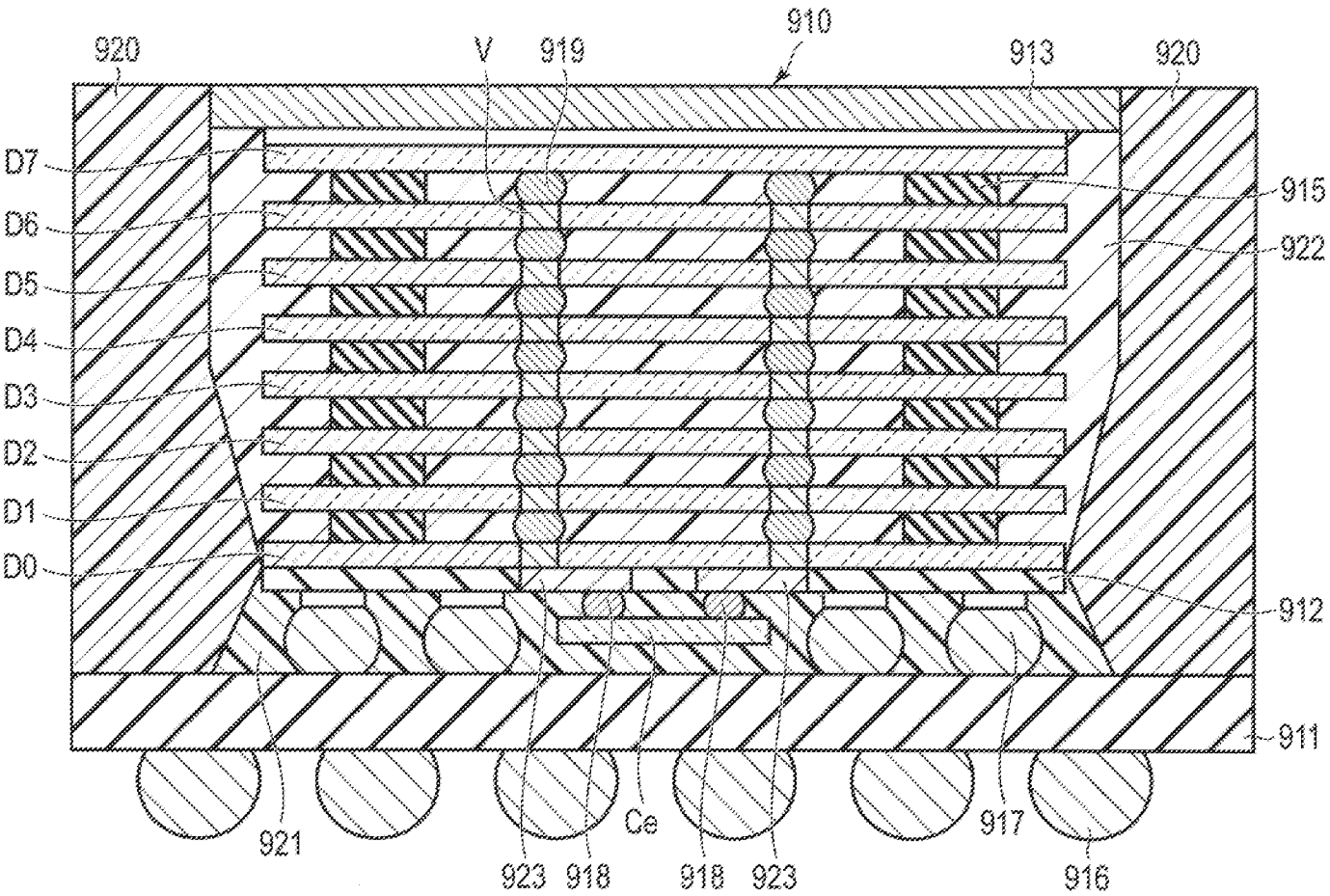
FIG. 9 is a cross-sectional view illustrating the structure of a flash memory package in FIG. 8.

FIG. 9 is a cross-sectional view of the flash memory package 910.

The stacked NAND flash memory dies D0 to D7 are mounted on a front surface of a supporting substrate 912. Through electrodes V are embedded in each of the NAND flash memory dies D0 to D7. The through electrodes V are electrodes penetrating the semiconductor substrate in the corresponding NAND flash memory die. The through electrodes V in two adjacent NAND flash memory dies are connected together by solder bumps 919. In this case, on the front surface of each NAND flash memory die, the through electrodes V may be connected to the solder bumps 919 via wiring layers provided above the corresponding semiconductor substrate. The two adjacent NAND flash memory dies may be physically coupled together via bonding layers 915.

The interface die Ce is mounted on a back surface of the supporting substrate 912. Wiring layers 923 are formed in the supporting substrate 912. The interface die Ce is connected to the wiring layers 923 via a plurality of the solder bumps 918. Each through electrode V in the lowermost NAND flash memory die D0 is connected to the wiring layers 923. Consequently, the interface die Ce is electrically connected to the NAND flash memory dies D0 to D7.

The supporting substrate 912 is connected to the package substrate 911 via a plurality of solder bumps 917. The interface die Ce is sealed with a sealing resin 921. The NAND flash memory dies D0 to D7 are sealed with a sealing resin 922. Outer peripheries of the sealing resins 921, 922 are sealed with a sealing resin 920, and the upper portion of the sealing resin is sealed with a metal plate 913.

Figure 10:
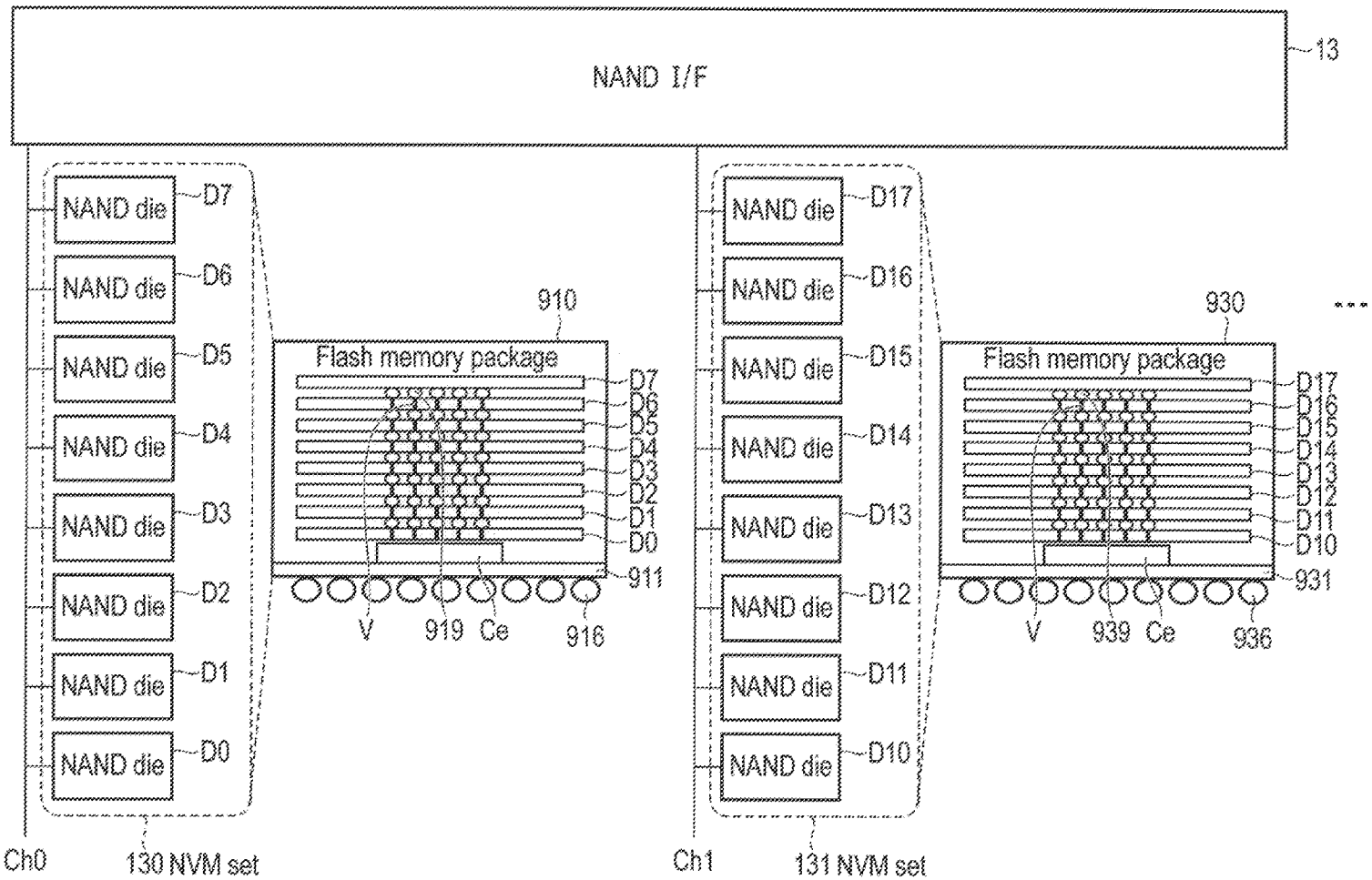
FIG. 10 is a diagram illustrating a relation between a plurality of NVM sets each comprising a set of NAND flash memory dies connected to the same channel and one or more flash memory packages used as the NVM sets.

FIG. 10 illustrates a relation between a plurality of NVM sets described with reference to FIG. 6 and one or more flash memory packages used as the NVM sets.

FIG. 10 illustrates an example where a large number of NAND flash memory dies in the NAND flash memory 5 are classified into two NVM sets 130, 131. The NVM sets 130, 131 correspond to the isolated NVM sets 110, 111 described with reference to FIG. 6, respectively. The NVM set 130 comprises the NAND flash memory dies D0 to D7 each connected to the channel Ch0, and the NVM set 131 comprises NAND flash memory dies D10 to D17 each connected to the channel Ch1.

The NAND flash memory dies D0 to D7 in the NVM set 130 are implemented by the single flash memory package 910. In the flash memory package 910, the NAND flash memory dies D0 to D7 are stacked and interconnected by a large number of vertical vias (each vertical via comprises the through electrodes V and the solder bumps 919) as described with reference to FIG. 8 and FIG. 9. A plurality of signal lines in the channel Ch0 connects to the plurality of external I/O terminals (solder bumps 916) provided on the back surface of the package substrate 911 of the flash memory package 910. The signal lines may include an I/O signal line of an 8 bit width and a plurality of control signal lines for the various control signals (the plurality of chip enable signals CE, the command latch enable signal CLE, the address latch enable signal ALE, the write enable signal WE, the read enable signal RE, the plurality of ready/busy signals RB, and the like). These signals received from the NAND interface 13 via the channel Ch0 are transmitted to the NAND flash memory dies D0 to D7 via the interface die Ce and the large number of vertical vias.

Also the NAND flash memory dies D10 to D17 in the NVM set 131 are implemented by a single flash memory package 930. The flash memory package 930 has a structure similar to the structure of the flash memory package 910. That is, in the flash memory package 930, the NAND flash memory dies D10 to D17 are stacked and interconnected by a large number of vertical vias (each vertical via comprises the through electrodes V and the solder bumps 939). A plurality of signal lines in the channel Ch1 connects to a plurality of external I/O terminals (solder bumps 936) provided on a back surface of a package circuit board 931 of the flash memory package 930. The signal lines may include an I/O signal line of an 8 bit width and a plurality of control signal lines for the various control signals (the plurality of chip enable signals CE, the command latch enable signal CLE, the address latch enable signal ALE, the write enable signal WE, the read enable signal RE, the plurality of ready/busy signals RB, and the like). These signals received from the NAND interface 13 via the channel Ch1 are transmitted to the NAND flash memory dies D10 to D17 via the interface die Ce and the large number of vertical vias.

The controller 4 performs a data write/read operation for the NVM set 130 via the channel Ch0 in accordance with an I/O command from the host 2 designating a region (namespace) corresponding to the NVM set 130. The controller 4 also performs a data write/read operation for the NVM set 131 via the channel Ch1 in accordance with an I/O command from the host 2 designating a region (namespace) corresponding to the NVM set 131.

In the configuration in FIG. 10, the peak I/O performance of each NVM set is limited to the performance of a single channel, but the performance of each channel is better than in a configuration using a normal memory package in which a plurality of dies is connected together by wire bonding. Therefore, the configuration in FIG. 10 enables simultaneous execution of write/read requests to the NVM sets 130, 131, respectively, and also enables minimization of degradation of the peak I/O performance of each NVM set.

FIG. 10 illustrates the case where the plurality of NAND flash memory dies included in each isolated NVM set is implemented by the memory package comprising the large number of vertical vias (TSVs). However, a plurality of NAND flash memory dies included in a shared NVM set can also be implemented by a memory package comprising a large number of vertical vias (TSVs).

When a single memory package comprising a large number of vertical vias (TSVs) supports two or more channels, a plurality of NAND flash memory dies included in two or more NVM sets corresponding to two or more channels may be implemented by a single memory package.

Now, a garbage collection operation for the NVM set 60 described with reference to FIG. 2 and FIG. 3 will be specifically described with reference to FIG. 11 to FIG. 13.

Figure 11:
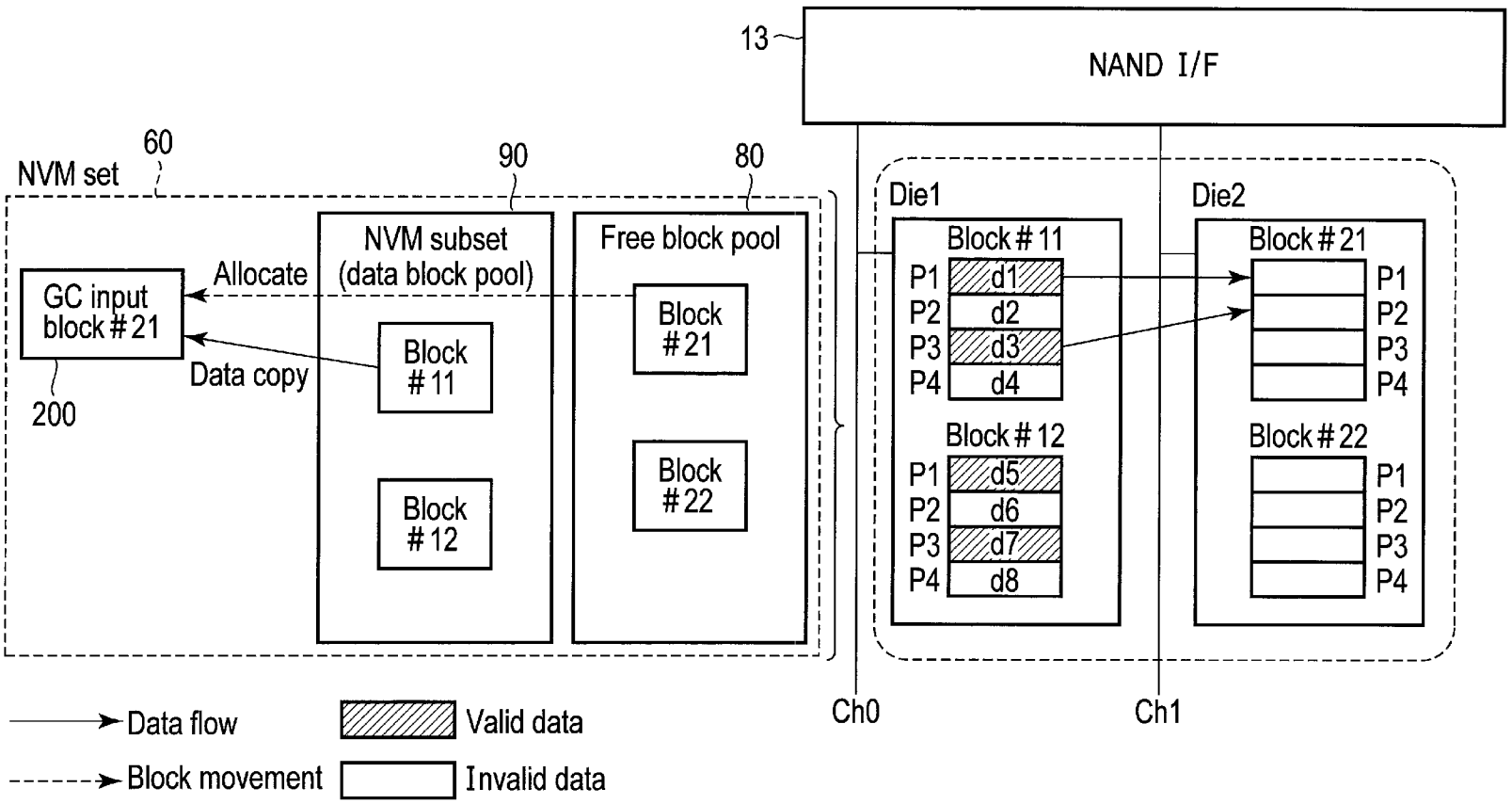
FIG. 11 is a diagram illustrating a part of a garbage collection operation for a certain NVM subset, which operation is performed by the memory system of the embodiment.
Figure 12:
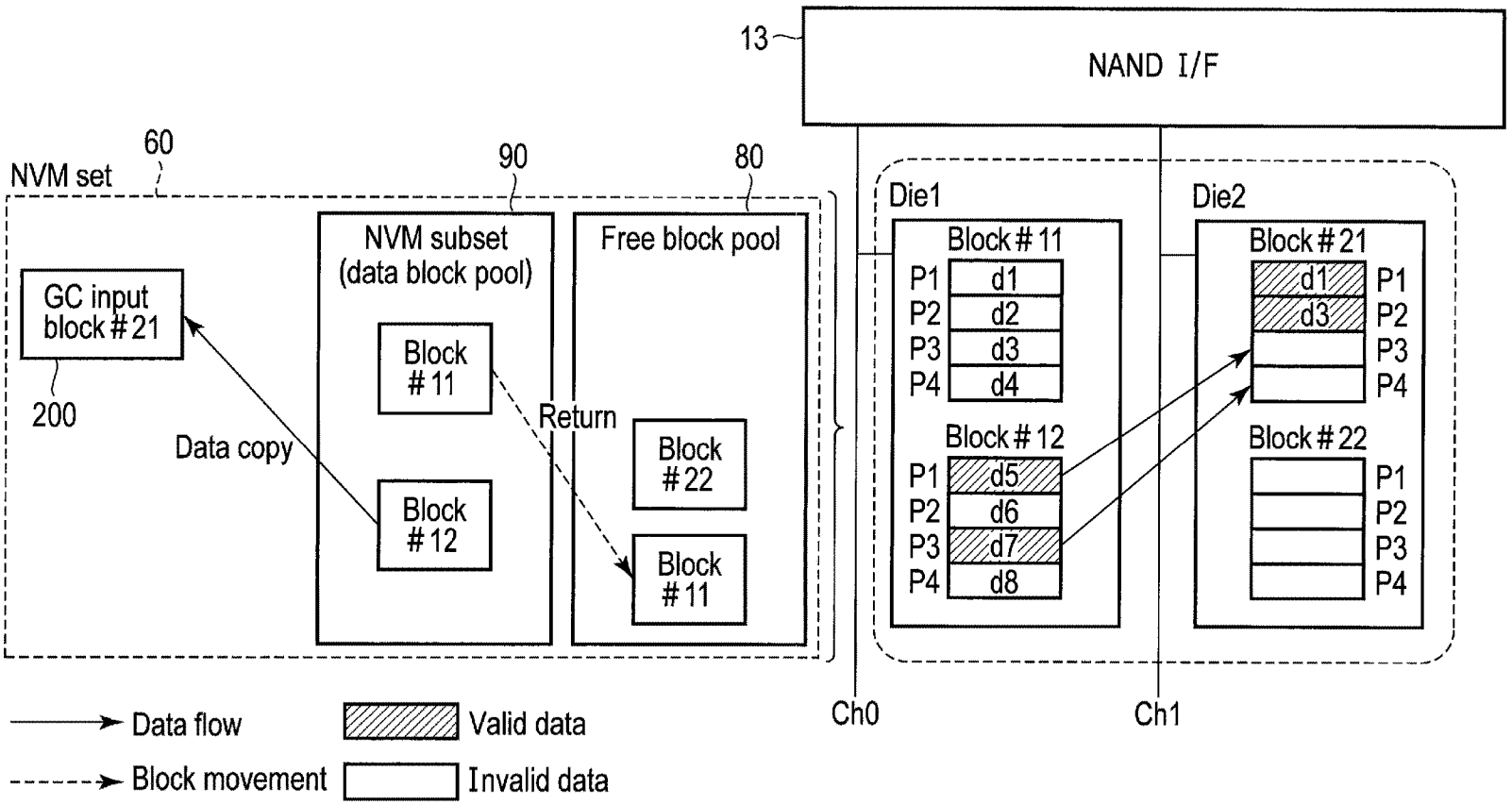
FIG. 12 is a diagram illustrating one remaining part of the garbage collection operation for the certain NVM subset, which operation is performed by the memory system of the embodiment.
Figure 13:
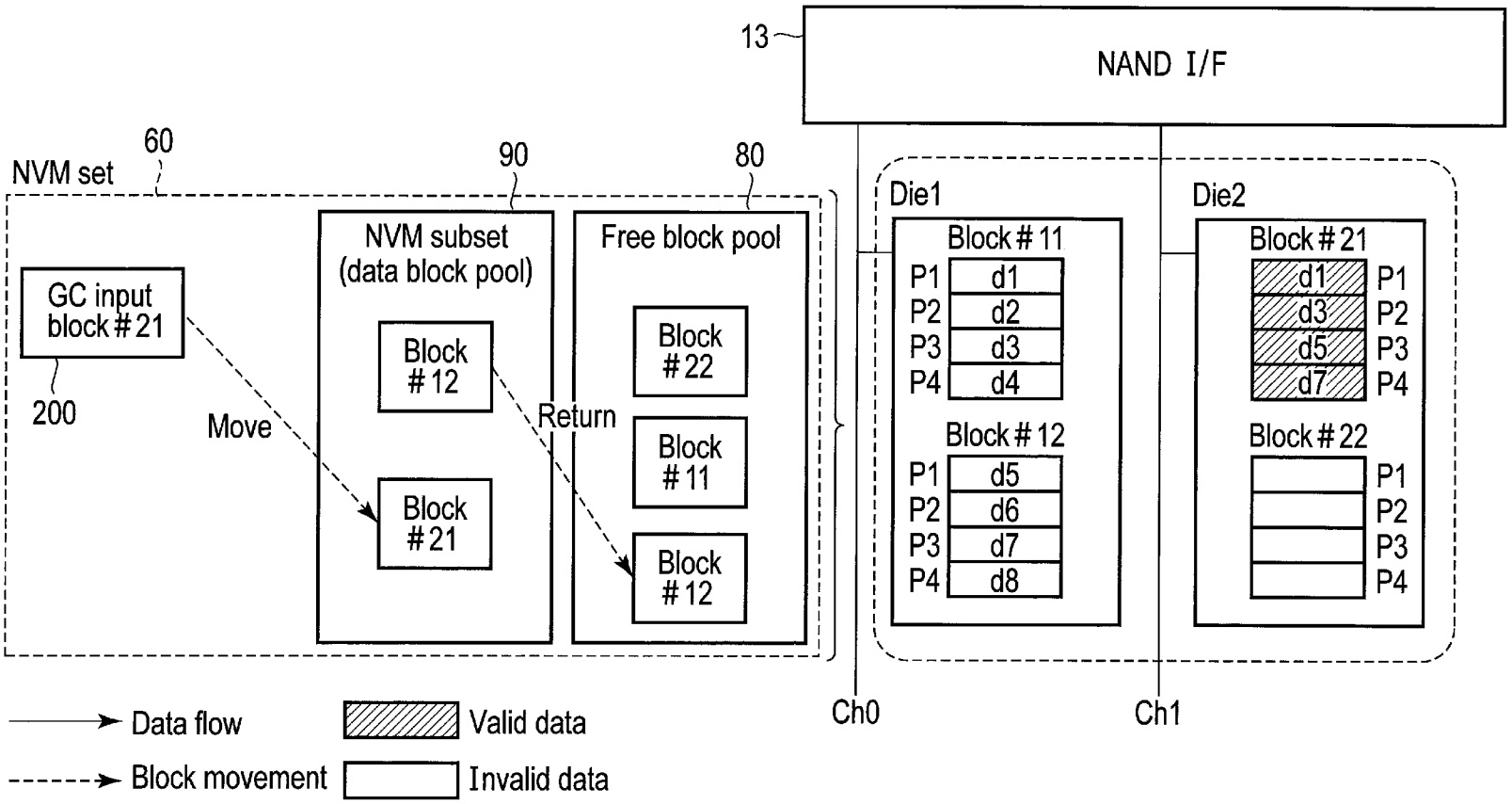
FIG. 13 is a diagram illustrating the other remaining part of the garbage collection operation for the certain NVM subset, which operation is performed by the memory system of the embodiment.

In FIG. 11 to FIG. 13, for simplification of illustration, a case is assumed where the NVM set 60 comprises two NAND flash memory dies 1 and 2 and where each die comprises two blocks each including pages P1 to P4.

As illustrated in FIG. 11, a free block (in this case, a free block #21) in the free block pool 80 is allocated as the GC input block 200.

Subsequently, a block including a mixture of valid data and invalid data (block #11) is selected from the NVM subset 90 as a copy source block. Only the valid data in the selected copy source block (block #11) is copied to the GC input block 200 (block #21).

In the block #11, if a mixture of valid data d1, d3 and invalid data d2, d4 is present, only the valid data d1 and the valid data d3 are copied to the GC input block 200 (block #21). At this time, the data d1 is copied to the page P1 of the block #21, and the data d3 is copied to the page P2 of the block #21.

When the valid data (data d1 and data d3) in the block #11 are copied to the GC input block 200 (block #21), the data d1 and the data d3 in the block #11 are invalidated. Consequently, the block #11 becomes a block holding no valid data, and thus, the block #11 is returned to the free block pool 80 as depicted in FIG. 12.

In the NVM subset 90, a block #12 including a mixture of valid data d5, d7 and invalid data d6, d8 exists. When the block #12 is selected as a copy source block, only the valid data (data d5 and data d7) in the block #12 are copied to the GC input block 200 (block #21). At this time, the data d5 is copied to the page P3 of the block #21, and the data d7 is copied to the page P4 of the block #21.

When the valid data (data d5 and data d7) in the block #12 are copied to the GC input block 200 (block #21), the data d5 and the data d7 in the block #12 are invalidated. Consequently, the block #12 becomes a block holding no valid data, and thus, the block #12 is returned to the free block pool 80 as depicted in FIG. 13. When the data d5 and the data d7 are copied to the GC input block 200 (block #21), the block #21 is filled with the valid data. In this case, the block #21 is moved to the NVM subset 90.

Figure 14:
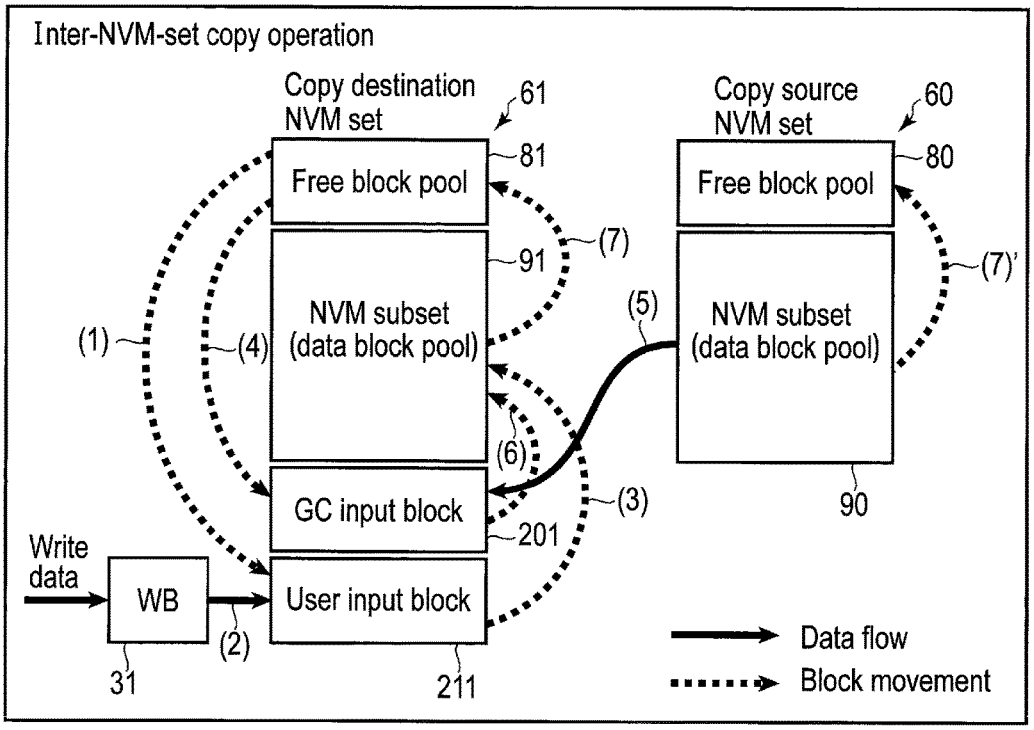
FIG. 14 is a diagram illustrating an inter-NVM-set copy operation performed by the memory system of the embodiment.

FIG. 14 illustrates an inter-NVM-set copy operation. In the description below, the NVM set 60 in FIG. 2 is assumed to be a copy source NVM set, and the NVM set 61 in FIG. 2 is assumed to be a copy destination NVM set. The host 2 can designate the copy source NVM set and the copy destination NVM set. The copy destination NVM set may be an NVM set not currently used by the host 2. When the NVM set not currently used by the host 2 is used as the copy destination block, a mixture of hot data and cold data in the copy destination NVM set resulting from the inter-NVM-set copy operation can be prevented. If all of the NVM sets are currently being utilized, the host 2 may transmit a command requesting creation of a new NVM set to the SSD 3.

The inter-NVM-set copy operation is performed according to the following procedure.

(1) Allocation of the User Input Block

In the copy destination block (NVM set 61), one free block in the free block pool 81 is allocated as the user input block 211.

(2) Host Write

Write data from the host 2 is written to the user input block 211 from the write buffer 31. Normally, write data associated with the namespace 102 corresponding to the copy destination NVM set, that is, write data directed to the copy destination NVM set, is stored in the write buffer 31. However, after the inter-NVM-set copy operation is started, write data associated with the namespace 100 or 101 corresponding to the copy source NVM set, that is, write data directed to the copy source NVM set, is stored in the write buffer 31. The lookup table corresponding to the NVM subset 90 is updated. Consequently, a physical address indicative of a physical location in the user input block 211 to which the write data has been written is mapped to a logical address (LBA) corresponding to the write data.

As described above, before the inter-NVM-set copy operation, the write destination of the write data associated with the namespace 101 or the namespace 100 is the user input block 210 in the copy source NVM set (NVM set 60). However, after the inter-NVM-set copy operation, the write destination of the write data associated with the namespace 101 or the namespace 100 is the user input block 211 in the copy destination NVM set (NVM set 61).

(3) Movement of the User Input Block

When the user input block 211 is filled with the write data, the user input block 211 is moved to the NVM subset (data block pool) 91. In other words, the user input block 211 filled with the data is managed by the NVM subset (data block pool) 91.

(4) Allocation of the GC Input Block

In the copy destination block (NVM set 61), one free block in the free block pool 81 is allocated as the GC input block 201.

(5) Copying of Valid Data from the Copy Source NVM Set to the Copy Destination NVM Set A block holding valid data is selected from the blocks in the NVM subset 90 of the copy source NVM set (NVM set 60) as a copy source block. Only the valid data in the copy source block is copied to the GC input block (copy destination block) 201 of the copy destination block (NVM set 61). In this case, first, valid data to be copied is selected from the copy source block. The selected valid data is read from the copy source block and written to the GC input block (copy destination block) 201.

When the valid data is copied to the GC input block 201, the lookup table corresponding to the NVM subset 90 is updated. Consequently, a physical address indicative of a physical location in the GC input block 201 to which the valid data has been written is mapped to a logical address (LBA) corresponding to the valid data.

(6) Movement of the GC Input Block

In the copy destination NVM set (NVM set 61), when the GC input block 201 is filled with the valid data from the block in the copy source NVM set (NVM set 60), the GC input block 201 is moved to the NVM subset 91. In other words, the GC input block 201 filled with the valid data is managed by the NVM subset (data block pool) 91.

(7) Returning of Blocks

In the copy destination NVM set (NVM set 61), blocks which are managed by the NVM subset 91 and which hold no valid data are returned from the NVM subset 91 to the free block pool 81. For example, when all of the data held by a certain block in the NVM subset 91 are invalidated by writing of new write data to the user input block 211, the block is returned from the NVM subset 91 to the free block pool 81.

(7)' Returning of the Copy Source Block

In the copy source NVM set (NVM set 60), when the valid data in the copy source block is copied to the GC input block 201 and thereby valid data no longer exist in the copy source block, the copy source block is returned from the NVM subset 90 to the free block pool 80.

The inter-NVM-set copy operation allows a physical storage space for data (hot data) stored in the copy source NVM set to be changed to the copy destination NVM set subjected to a small number of rewrites (a small number of program/erase cycles). Therefore, wear leveling can be executed to level the degrees of wear among the NVM sets.

Before valid data selected as a copy target is actually copied to the GC input block 201, write data with the same LBAx as that of the selected valid data (i.e., new data corresponding to the LBAx) may be written to the user input block 211. When the write data (new data corresponding to the LBAx) is written to the user input block 211, the lookup table corresponding to the NVM subset 90 is updated. Consequently, a physical address indicative of a physical location in the user input block 211 to which the write data has been written is mapped to an LBAx corresponding to the write data.

In this case, the selected valid data is old data which is no longer read by the host 2. Therefore, if write data with the same LBAx as that of the valid data selected as a copy target is written to the user input block 211 before the valid data is actually copied to the GC input block 201, a copying operation for the selected valid data may be suspended. This allows prevention of execution of an unwanted copying operation.

Alternatively, instead of suspension of the copying operation for the valid data, an operation may be performed in which the copying operation itself for the selected valid data is performed, with update of the lookup table corresponding to the NVM subset 90 avoided. Consequently, a physical address corresponding to the LBAx can be prevented from being changed to a value indicative of a physical location to which the valid data (old data) has been copied. More specifically, each time valid data corresponding to a certain LBA is copied to the GC input block 201, the controller 4 references the lookup table to determine to which of the copy source NVM set (NVM set 60) or the copy destination NVM set (NVM set 61) the physical address corresponding to the LBA corresponds. If the physical address corresponds to the copy destination NVM set (NVM set 61), the controller 4 recognizes that new data corresponding to the LBA has been written to the user input block 211, and avoids updating the lookup table. On the other hand, if the physical address corresponds to the copy source NVM set (NVM set 60), the controller 4 recognizes that the copied valid data is the latest data corresponding to the LBA, and updates the lookup table. Update of the lookup table allows the physical address indicative of the physical location to which the valid data has been copied to be mapped to the LBA.

Figure 15:
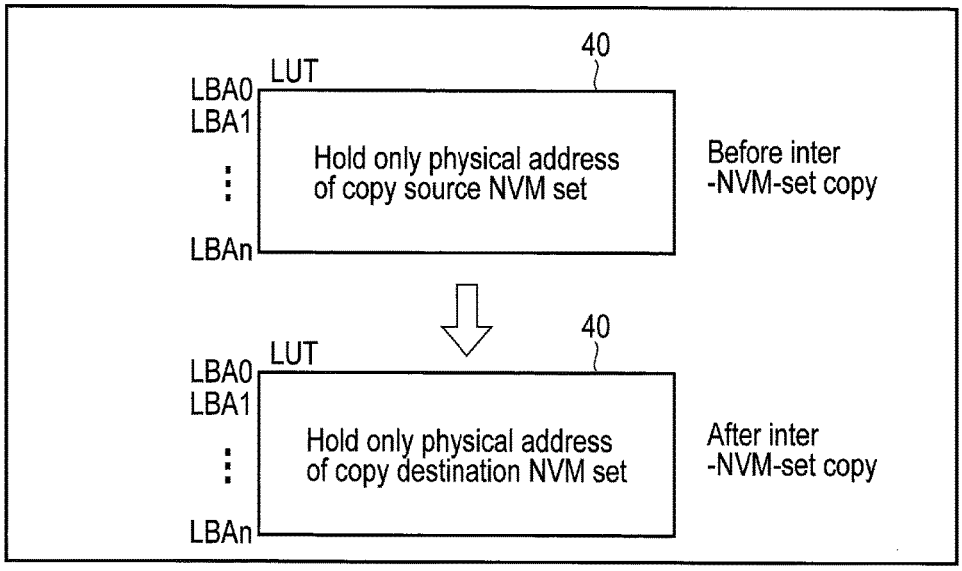
FIG. 15 is a diagram illustrating a relation between the contents of an address translation table before the inter-NVM-set copy operation in FIG. 14 and the contents of the address translation table after the inter-NVM-set copy operation.

FIG. 15 illustrates a relation between the contents of the address translation table (LUT) before the inter-NVM-set copy operation in FIG. 14 and the contents of the address translation table (LUT) after the inter-NVM-set copy operation.

In a period of time before the inter-NVM-set copy operation is performed, the LUT 40 corresponding to the NVM subset 90 holds only the physical addresses of the copy source NVM set (NVM set 60).

When an inter-NVM-set copy operation from the copy source NVM set (NVM set 60) to the copy destination NVM set (NVM set 61) is started, the physical addresses in the LUT 40 are updated. For example, when data d10 corresponding to an LBA 10 is copied from the copy source block (NVM set 60) to the GC input block 201 in the copy destination NVM set (NVM set 61), a physical address indicative of a physical location in the copy destination NVM set (NVM set 61) to which the data d10 has been copied is mapped to the LBA 10 in the LUT 40. Therefore, when the inter-NVM-set copy operation is completed, the LUT 40 holds only the physical addresses of the NVM set 61.

When the inter-NVM-set copy operation is performed using a mechanism similar to the mechanism for GC, the controller 4 can read data requested by the host 2 from the copy destination NVM set (NVM set 61) by referencing the LUT 40 without a special process for creating address translation information corresponding to the data copied to the copy destination NVM set (NVM set 61).

Now, the inter-NVM-set copy operation will be specifically described with reference to FIG. 16 to FIG. 18.

Figure 16:
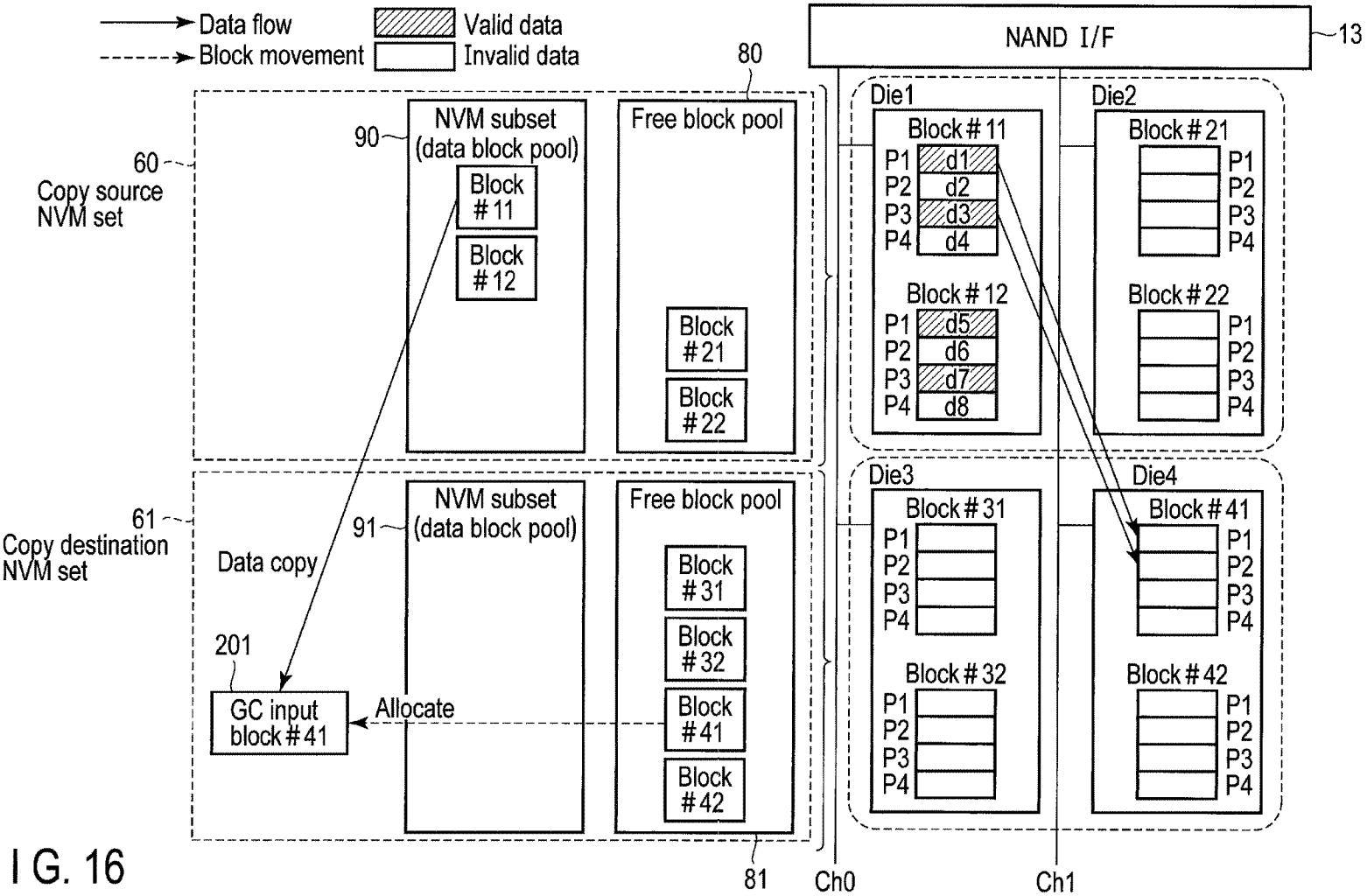
FIG. 16 is a diagram illustrating a part of the inter-NVM-set copy operation performed by the memory system of the embodiment.
Figure 17:
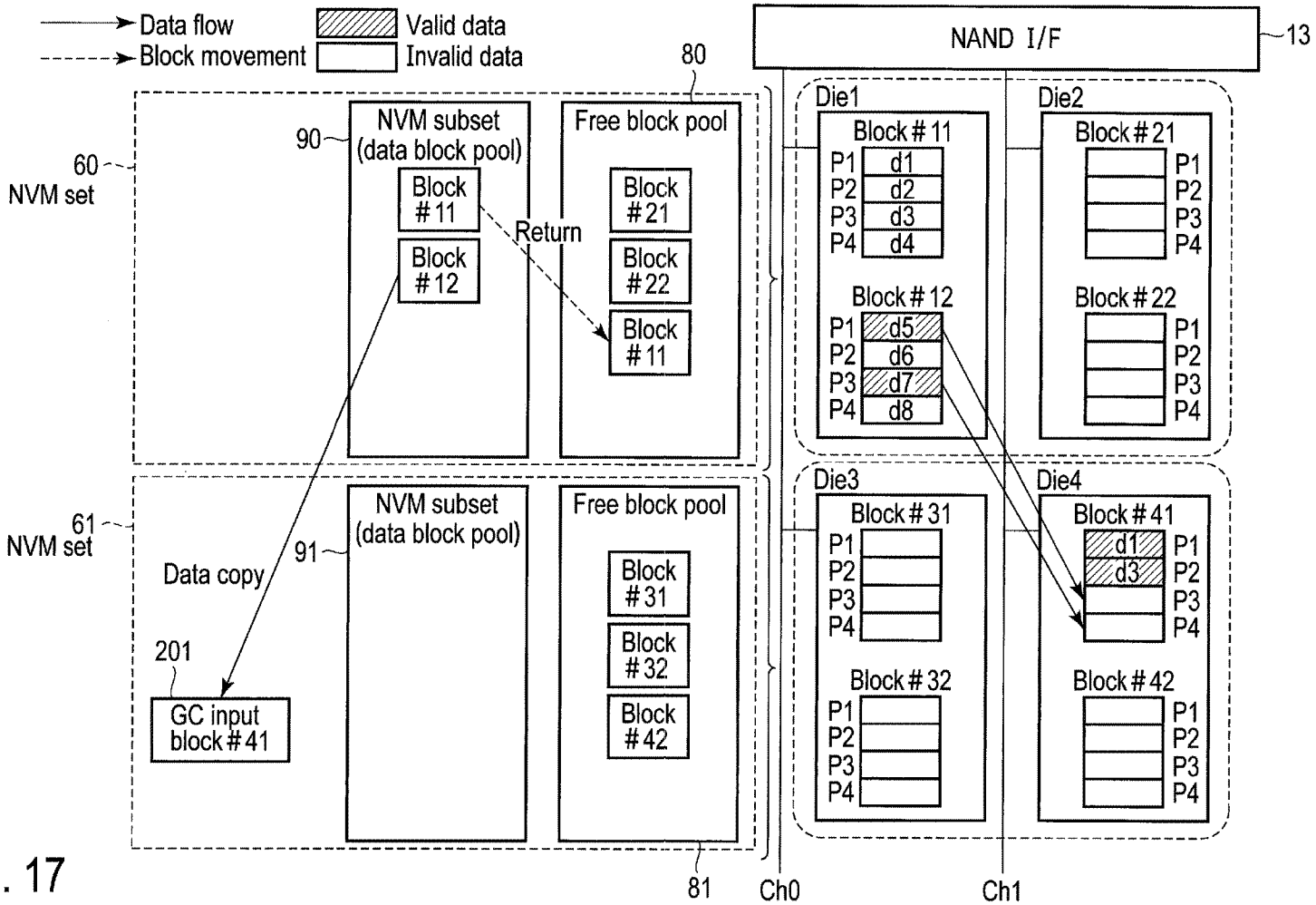
FIG. 17 is a diagram illustrating one remaining part of the inter-NVM-set copy operation performed by the memory system of the embodiment.
Figure 18:
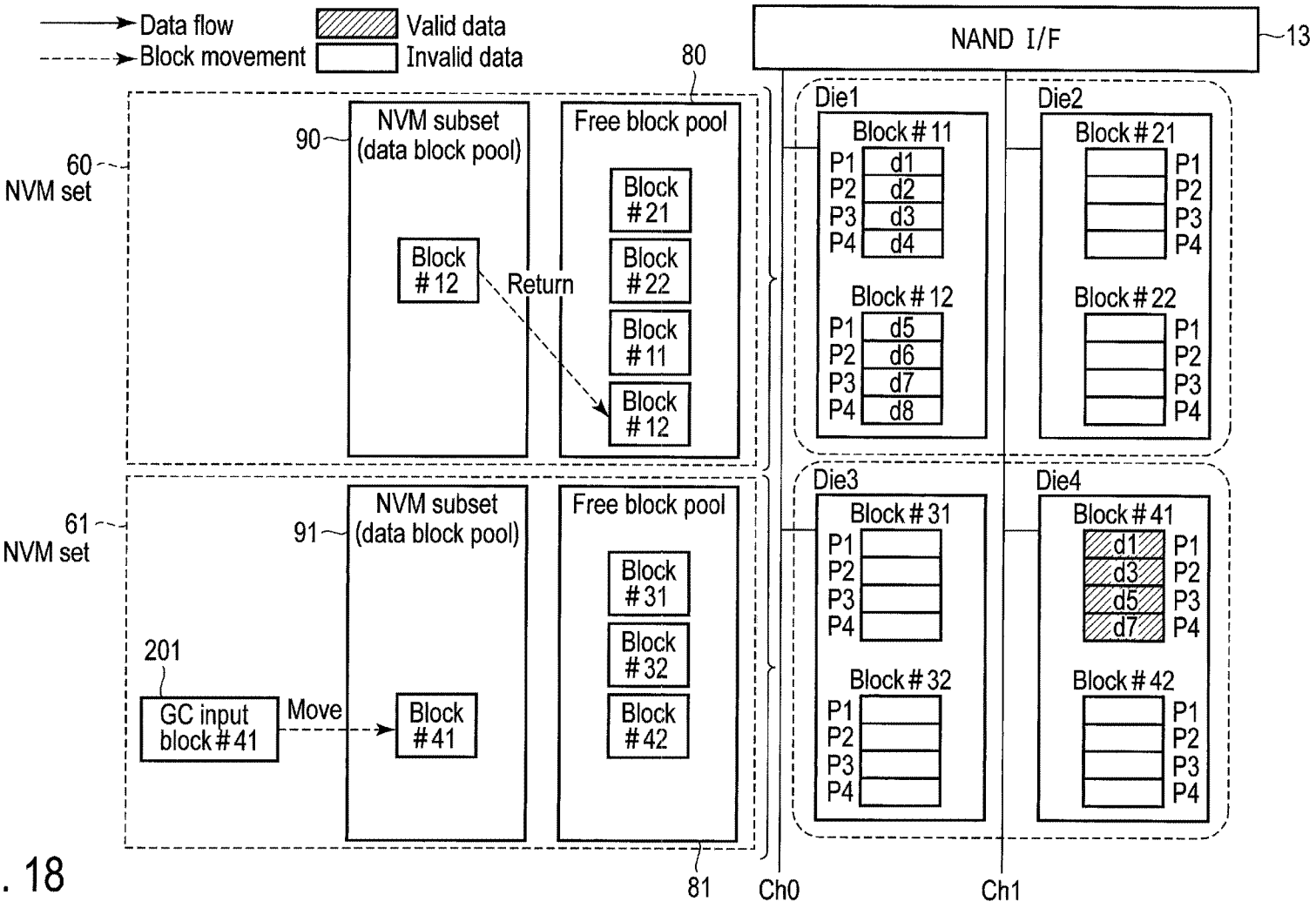
FIG. 18 is a diagram illustrating the other remaining part of the inter-NVM-set copy operation performed by the memory system of the embodiment.

In FIG. 16 to FIG. 18, for simplification of illustration, the NVM set 60 is assumed to comprise the NAND flash memory dies 1 and 2, the NVM set 61 is assumed to comprise the NAND flash memory dies 3 and 4, and each of dies is assumed to have two blocks each including the pages P1 to P4. Valid data is assumed to be copied from the NVM set 60 to the NVM set 61.

As illustrated in FIG. 16, in the copy destination NVM set (NVM set 61), a free block (in this case, a block #41) in the free block pool 81 is allocated as the GC input block 201.

Subsequently, in the copy source NVM set (NVM set 60), a block holding valid data is selected from the NVM subset 90 as a copy source block. Only the valid data in the selected copy source block (block #11) is copied to the GC input block 201 (block #41) in the copy destination NVM set (NVM set 61).

In the block #11, if a mixture of the valid data d1, d3 and the invalid data d2, d4 is present, only the valid data d1 and the valid data d3 are copied to the GC input block 201 (block #41). At this time, the data d1 is copied to the page P1 of the block #41, and the data d3 is copied to the page P2 of the block #41.

When the valid data (data d1 and data d3) in the block #11 are copied to the GC input block 201 (block #41), the data d1 and the data d3 in the block #11 are invalidated. Consequently, the block #11 becomes a block holding no valid data, and thus, the block #11 is returned to the free block pool 80 as depicted in FIG. 17.

In the NVM subset 90, a block #12 including a mixture of valid data d5, d7 and invalid data d6, d8 exists. When the block #12 is selected as a copy source block, only the valid data (data d5 and data d7) in the block #12 are copied to the GC input block 201 (block #41). At this time, the data d5 is copied to the page P3 of the block #41, and the data d7 is copied to the page P4 of the block #41.

When the valid data (data d5 and data d7) in the block #12 are copied to the GC input block 201 (block #41), the data d5 and the data d7 in the block #12 are invalidated. Consequently, the block #12 becomes a block holding no valid data, and thus, the block #12 is returned to the free block pool 80 as depicted in FIG. 18. When the data d5 and the data d7 are copied to the GC input block 201 (block #41), the block #41 is filled with the valid data. In this case, the block #41 is moved to the NVM subset 91.

Figure 19:
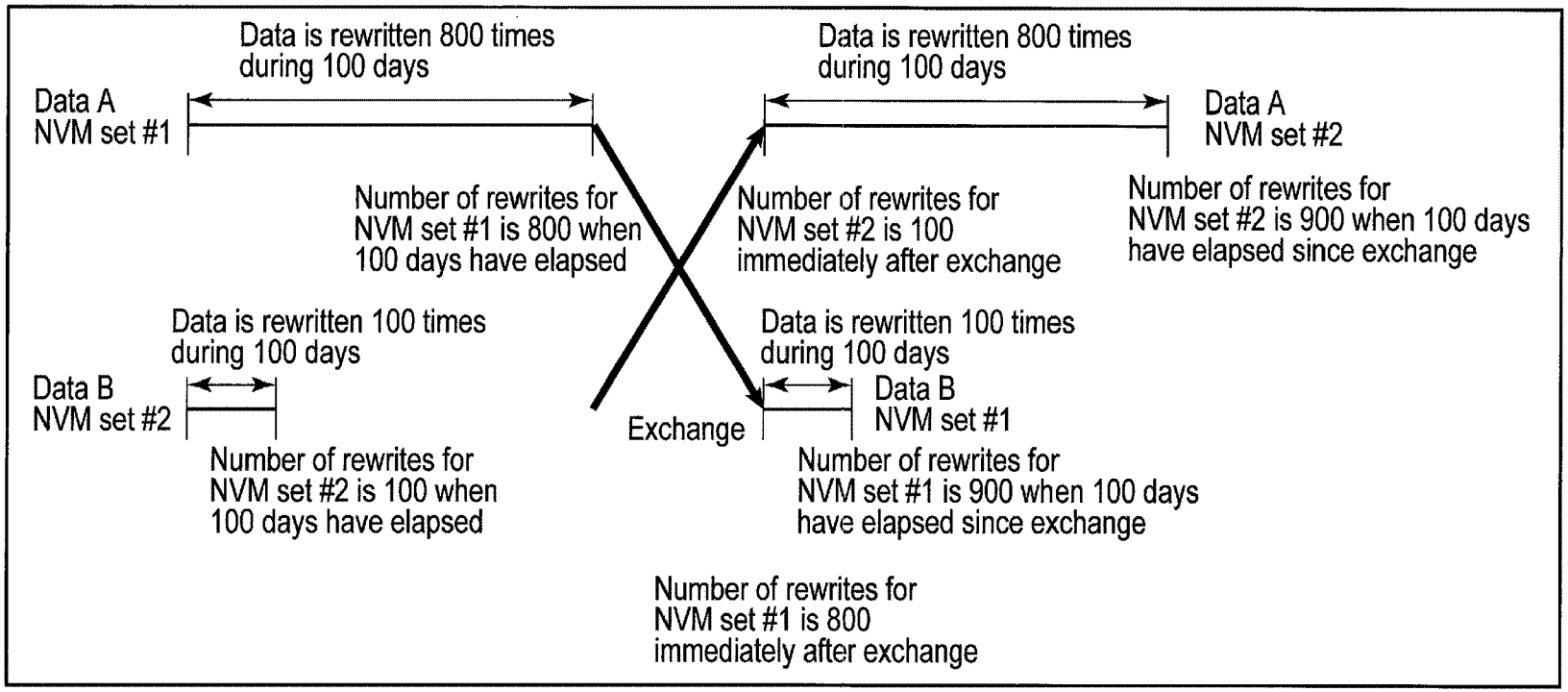
FIG. 19 is a diagram illustrating an outline of an NVM set exchange operation performed by the memory system of the embodiment.

FIG. 19 illustrates an outline of an NVM set exchange operation of exchanging data in two NVM sets (an NVM set #1, an NVM set #2) with each other.

The NVM set #1 is assumed to be the NVM set 60, and the NVM set #2 is assumed to be the NVM set 61. A state before an NVM set exchange operation is assumed to be such that data A (data with a high update frequency) is stored in the NVM set #1 (NVM set 60) and that data B (data with a low update frequency) is stored in the NVM set #2 (NVM set 61).

In this case, the number of rewrites (the number of program/erase cycles) for the NVM set #1 (NVM set 60) is larger than the number of rewrites (the number of program/erase cycles) for the NVM set #2 (NVM set 61). The number of rewrites (the number of program/erase cycles) for the NVM set may be represented by the average of the numbers of program/erase cycles for all the blocks belonging to the NVM set or by the total of the numbers of program/erase cycles for all the blocks belonging to the NVM set.

For example, the data in the NVM set #1 (NVM set 60) is rewritten 800 times during a period of 100 days (the number of program/erase cycles=800), and the data in the NVM set #2 (NVM set 61) is rewritten only 100 times during the same period of 100 days (the number of program/erase cycles=100). If a limit value for the number of rewrites for each block is, for example, 1,000, when 200 (=1000-800) rewrites (program/erase operations) are executed on the NVM set #1, the number of rewrites for the NVM set #1 reaches the limit value. In this case, each block in the NVM set #1 is likely to be no longer able to function normally.

In the present embodiment, an operation of exchanging the data in the NVM set #1 (NVM set 60) with the data in the NVM set #2 (NVM set 61) can be performed as needed. For example, when 100 days have elapsed since the start of use of the SSD 3, the data in the NVM set #1 (NVM set 60)

may be exchanged with the data in the NVM set #2 (NVM set 61) in accordance with a command from the host 2 requesting NVM set exchange.

In the NVM set exchange operation, the valid data stored in the NVM set #1 (NVM set 60) are copied to the NVM set #2 (NVM set 61). Subsequently, the lookup table corresponding to the NVM set #1 (NVM set 60) is updated. Consequently, physical addresses indicative of physical locations in the NVM set #2 (NVM set 61) to which the valid data have been copied are mapped to logical addresses (LBAs) corresponding to the copied valid data.

The valid data stored in the NVM set #2 (NVM set 61) also are copied to the NVM set #1 (NVM set 60). Subsequently, the lookup table corresponding to the NVM set #2 (NVM set 61) is updated. Consequently, physical addresses indicative of physical locations in the NVM set #1 (NVM set 60) to which the valid data have been copied are mapped to logical addresses (LBA) corresponding to the copied valid data.

When the NVM set exchange operation is completed, a physical storage space for the data A (data with a high update frequency) is changed to the NVM set #2 (NVM set 61), and a physical storage space for the data B (data with a low update frequency) is changed to the NVM set #1 (NVM set 60).

Immediately after completion of the data exchange, the number of rewrites for the NVM set #2 (NVM set 61) is 100, and the number of rewrites for the NVM set #1 (NVM set 60) is 800.

Subsequently, the data A is updated again at a high frequency, thus increasing the number of rewrites for the NVM set #2 to 800 during 100 days. On the other hand, the data B is updated at a relatively low frequency, thus increasing the number of rewrites for the NVM set #1 to 100 during 100 days. As result, when 200 days have elapsed since the initial state (i.e., when 100 days have elapsed since the NVM set exchange), the number of rewrites for the NVM set #2 (NVM set 61) is 900, and the number of rewrites for the NVM set #1 (NVM set 60) is 900.

As described above, execution of the NVM set exchange operation allows equalization of the numbers of rewrites for the blocks belonging to the NVM set #1 (NVM set 60) and the NVM set #2 (NVM set 61). Thus, the degrees of wear of the NVM sets can be leveled.

Figure 20:
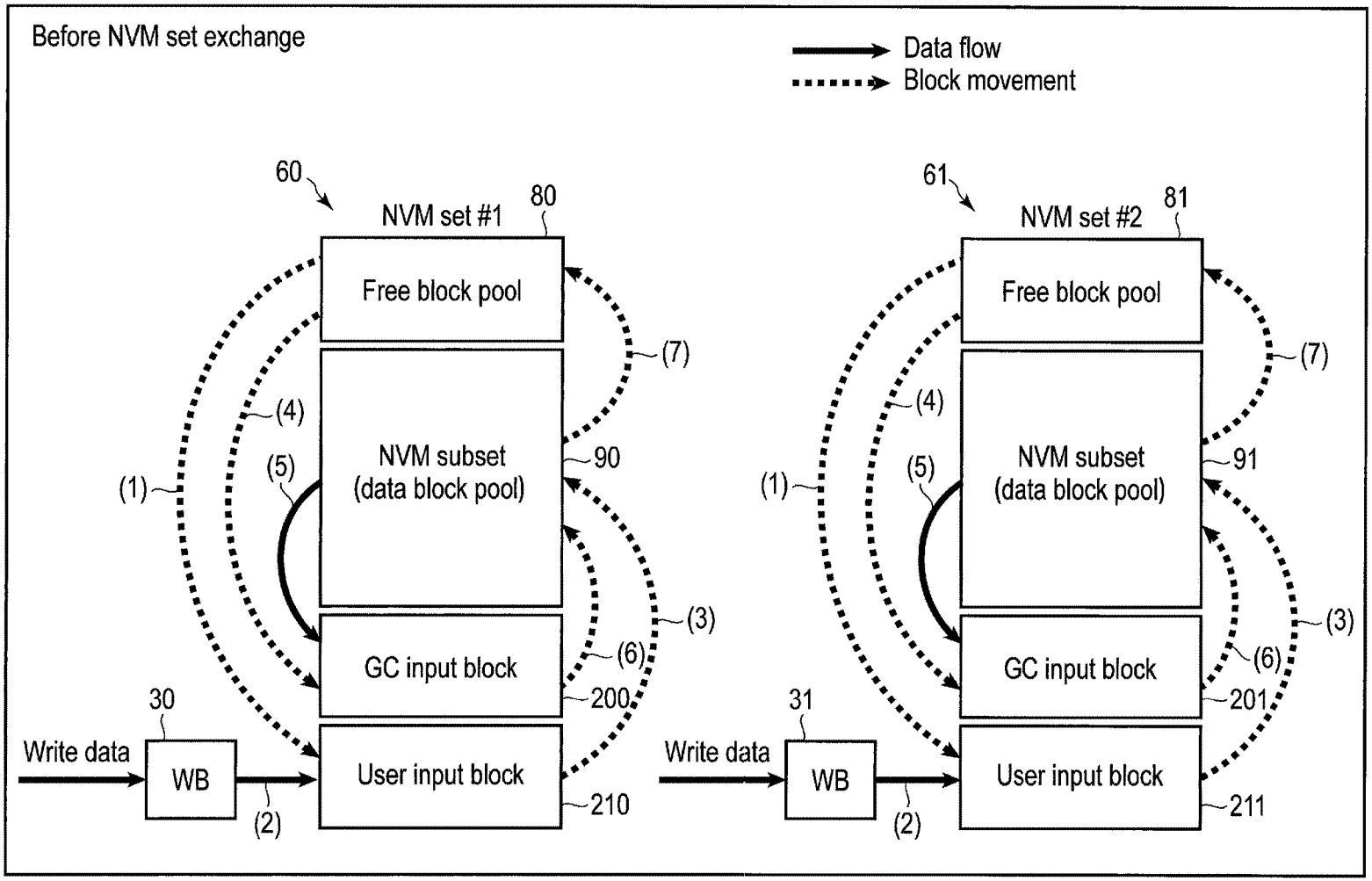
FIG. 20 is a diagram illustrating a host write/garbage collection operation performed for two NVM sets before the NVM set exchange operation.

FIG. 20 illustrates a host write/garbage collection operation performed for the two NVM sets before the NVM set exchange operation.

Before execution of the NVM set exchange operation, the host write/garbage collection operation is performed independently on the NVM set #1 (NVM set 60) and on the NVM set #2 (NVM set 61). Specifically, the operation is performed as described with reference to FIG. 4.

Figure 21:
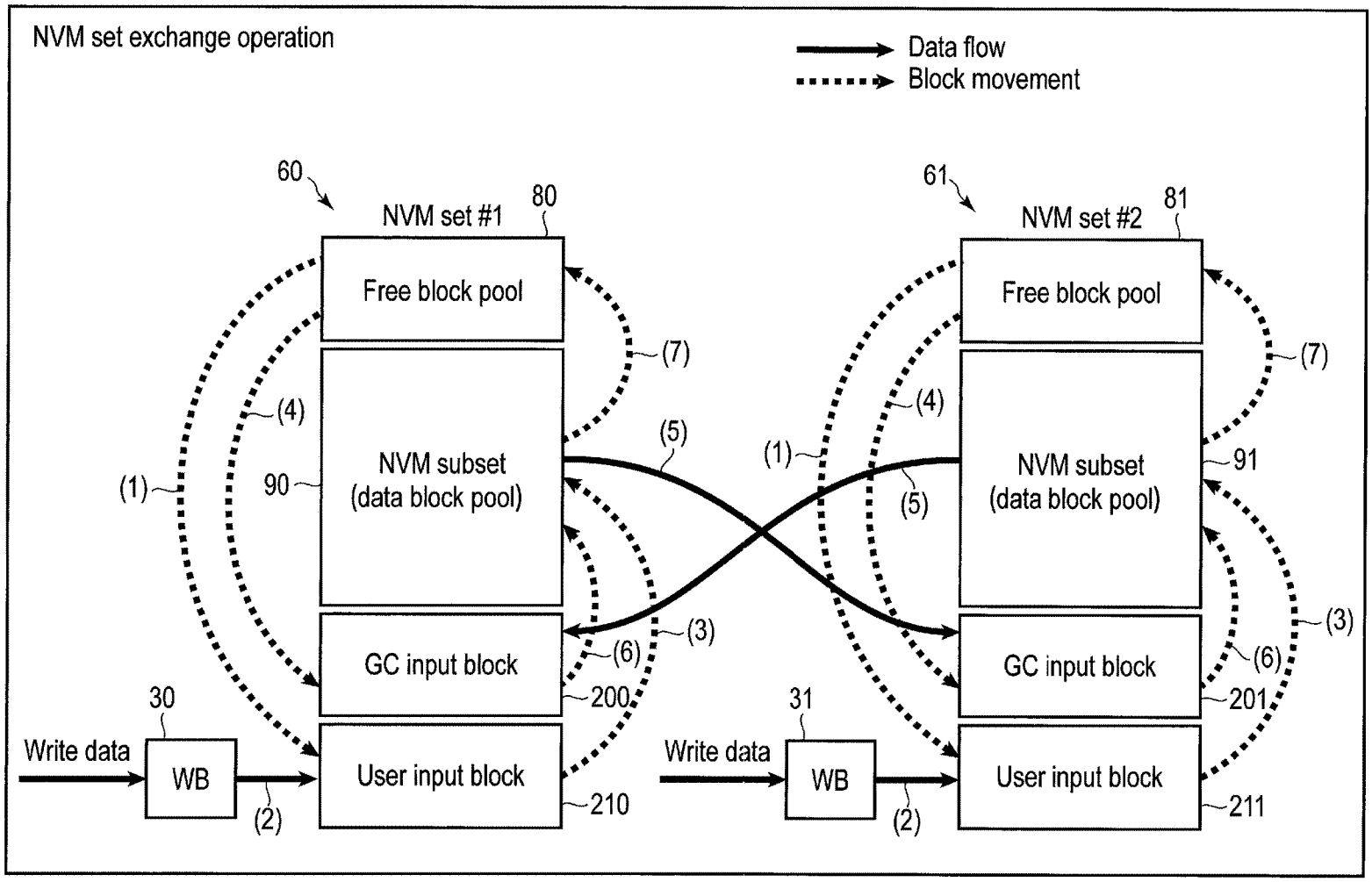
FIG. 21 is a diagram illustrating a host write/garbage collection operation performed for the NVM set exchange operation between two NVM sets.

FIG. 21 is a host write/garbage collection operation performed between the two NVM sets for the NVM set exchange operation.

(1) Allocation of the User Input Block

In the NVM set #1, one block in the free block pool 80 is allocated as the user input block 210. In the NVM set #2, one block in the free block pool 81 is allocated as the user input block 211.

(2) Host Write

Write data from the host 2 is written to the user input block 210 from the write buffer 30. Normally, write data associated with the namespace 100 or the namespace 101 corresponding to the NVM set #1 (NVM set 60), that is, write data directed to the NVM set #1, is stored in the write buffer 30. However, after the NVM set exchange operation is started, write data associated with the namespace 102 corresponding to the NVM set #2 (NVM set 61), that is, write data directed to the NVM set #2, is stored in the write buffer 30. The lookup table corresponding to the NVM set #2 (NVM set 61) is updated. Consequently, a physical address indicative of a physical location in the user input block 210 to which the write data has been written is mapped to a logical address (LBA) corresponding to the write data.

As described above, before the NVM set exchange operation, the write destination of the write data associated with the namespace 102 is the user input block 211 in the NVM set #2 (NVM set 61). However, after the NVM set exchange operation is started, the write destination of the write data associated with the namespace 102 is changed to the user input block 210 in the NVM set #1 (NVM set 60).

Write data from the host 2 is written to the user input block 211 from the write buffer 31. Normally, write data associated with the namespace 102 corresponding to the NVM set #2 (NVM set 61), that is, write data directed to the NVM set #2, is stored in the write buffer 31. However, after the NVM set exchange operation is started, write data associated with the namespace 100 or 101 corresponding to the NVM set #1 (NVM set 60), that is, write data directed to the NVM set #1, is stored in the write buffer 31. The lookup table corresponding to the NVM set #1 (NVM set 60) is updated. Consequently, a physical address indicative of a physical location in the user input block 211 to which the write data has been written is mapped to a logical address (LBA) corresponding to the write data.

As described above, before the NVM set exchange operation, the write destination of the write data associated with the namespace 101 or the namespace 100 is the user input block 210 in the NVM set #1 (NVM set 60). However, after the NVM set exchange operation is started, the write destination of the write data associated with the namespace 101 or the namespace 100 is changed to the user input block 211 in the NVM set #2 (NVM set 61).

(3) Movement of the User Input Block

When the user input block 210 is filled with the write data, the user input block 210 is moved to the NVM subset (data block pool) 90. In other words, the user input block 210 filled with the data is managed by the NVM subset (data block pool) 90.

When the user input block 211 is filled with the write data, the user input block 211 is moved to the NVM subset (data block pool) 91. In other words, the user input block 211 filled with the data is managed by the NVM subset (data block pool) 91.

(4) Allocation of the GC Input Block

In the NVM set #1 (NVM set 60), one free block in the free block pool 80 is allocated as the GC input block 200.

In the NVM set #2 (NVM set 61), one free block in the free block pool 81 is allocated as the GC input block 201.

(5) Exchange of Valid Data

A block holding valid data is selected from the blocks in the NVM subset 90 of the NVM set #1 (NVM set 60) as a copy source block. Only the valid data in the copy source block are copied to the GC input block 201 in the NVM set #2 (NVM set 61). Subsequently, the lookup table corresponding to the NVM subset 90 is updated. Consequently, physical addresses indicative of physical locations in the GC input block 201 to which the valid data have been copied are mapped to logical addresses (LBAs) corresponding to the copied valid data.

A block holding valid data is selected from the blocks in the NVM subset 91 of the NVM set #2 (NVM set 61) as a copy source block. Only the valid data in the copy source block are copied to the GC input block 200 in the NVM set #1 (NVM set 60). Subsequently, the lookup table corresponding to the NVM subset 91 is updated. Consequently, physical addresses indicative of physical locations in the GC input block 200 to which the valid data have been copied are mapped to logical addresses (LBAs) corresponding to the copied valid data.

(6) Movement of the GC Input Block

In the NVM set #1 (NVM set 60), when the GC input block 200 is filled with valid data from one or more blocks in the NVM set #2 (NVM set 61), the GC input block 200 is moved to the NVM subset 90. In other words, the GC input block 200 filled with the valid data is managed by the NVM subset (data block pool) 90.

In the NVM set #2 (NVM set 61), when the GC input block 201 is filled with valid data from one or more blocks in the NVM set #1 (NVM set 60), the GC input block 201 is moved to the NVM subset 91. In other words, the GC input block 201 filled with the valid data is managed by the NVM subset (data block pool) 91.

(7) Returning of the Copy Source Block

In the NVM set #1 (NVM set 60), blocks which are managed by the NVM subset 90 and which hold no valid data are returned from the NVM subset 90 to the free block pool 80. For example, when all the data held by a certain block in the NVM subset 90 are invalidated by writing of new write data to user input block 210, the block is returned from the NVM subset 90 to the free block pool 80.

In the NVM set #2 (NVM set 61), blocks which are managed by the NVM subset 91 and which hold no valid data are returned from the NVM subset 91 to the free block pool 81. For example, when all the data held by a certain block in the NVM subset 91 are invalidated by writing of new write data to the user input block 211, the block is returned from the NVM subset 91 to the free block pool 81.

Figure 22:
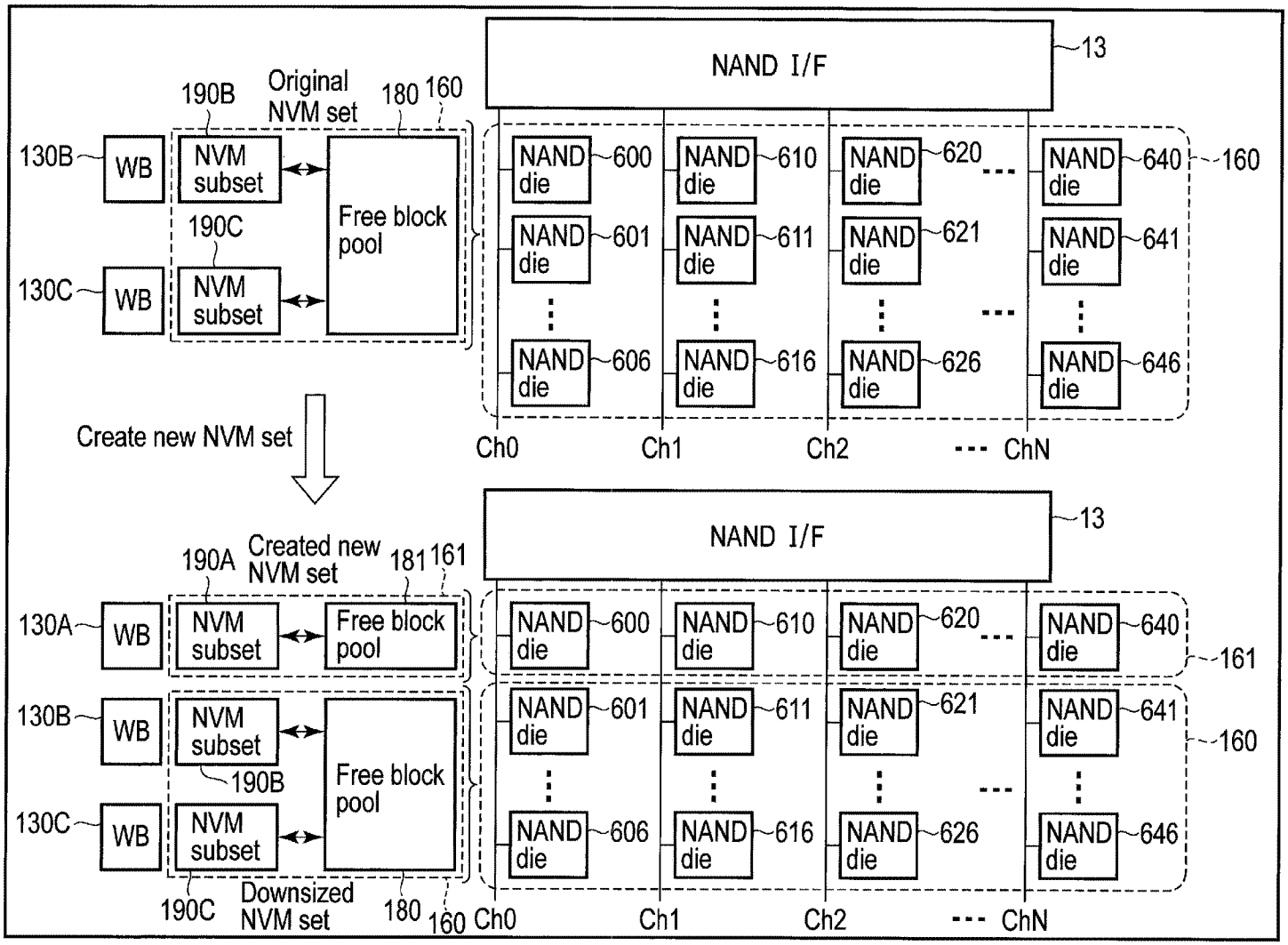
FIG. 22 is a diagram illustrating an outline of a new NVM set creation operation performed by the memory system of the embodiment.

FIG. 22 illustrates an outline of a new-NVM-set creation operation.

An NVM set 160 comprising the NAND flash memory dies 600 to 606, 610 to 616, 620 to 626, . . . 640 to 646 is assumed to be utilized. In the NVM set 160, a free block pool 180 exists. The free block pool 180 is shared by an NVM subset 190B and an NVM subset 190C. Moreover, a write buffer 130B is provided in association with the NVM subset 190B, and a write buffer 130C is provided in association with the NVM subset 190C.

The controller 4 can create a new NVM set 161 from the NVM set 160 as depicted in a lower portion of FIG. 22. In this case, first, NAND flash memory dies to be reserved for the new NVM set 161 are determined from a plurality of NAND flash memory dies included in the NVM set 160. In the example illustrated in FIG. 22, the NAND flash memory dies 600, 610, 620, . . . 640 are determined as NAND flash memory dies for the NVM set 161. The valid data in the NAND flash memory dies 600, 610, 620, . .. 640 are copied to a group of blocks belonging to the remaining NAND flash memory dies in the NVM set 160.

Consequently, a free block pool 181, an NVM subset 190A, and a write buffer 130A for the NVM set 161 are created. Each of the free blocks in the NAND flash memory dies 600, 610, 620, . . . 640 is managed by the free block pool 181 for the NVM set 161. The original NVM set 160 is a downsized NVM set. The free block pool 180 manages only a group of free blocks belonging to the remaining NAND flash memory dies other than the NAND flash memory dies 600, 610, 620, . . . 640.

Figure 23:
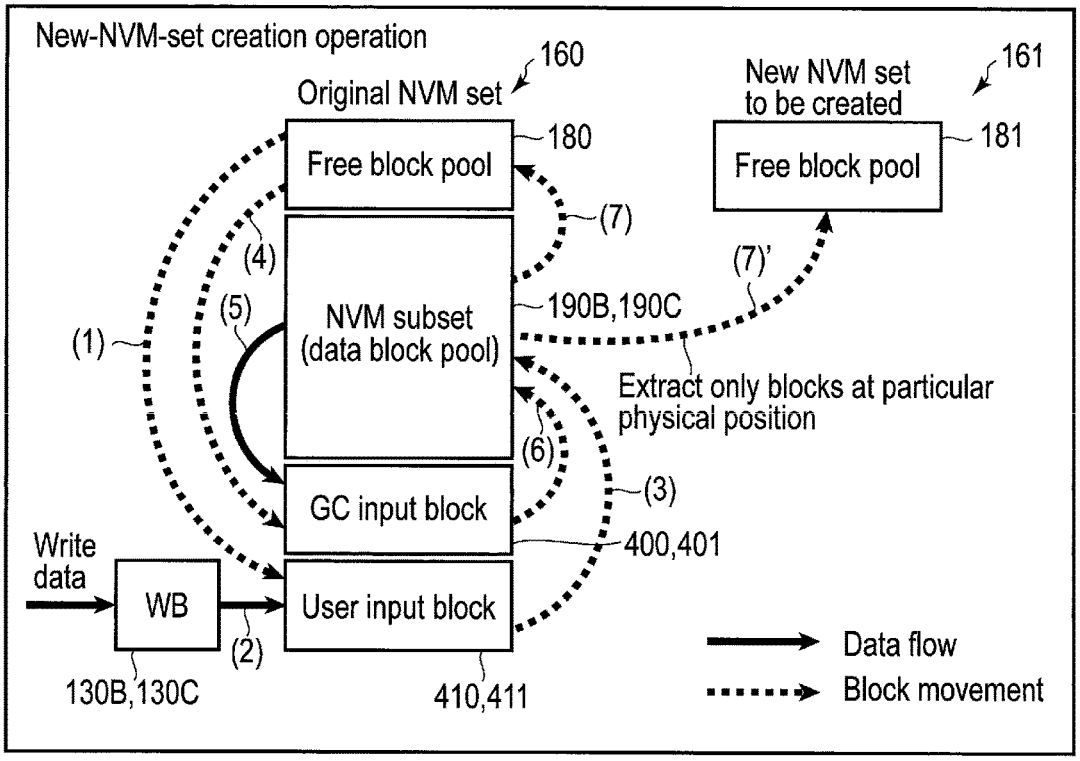
FIG. 23 is a diagram illustrating a host write/garbage collection operation performed for new-NVM-set creation.

FIG. 23 illustrates a host write/garbage collection operation performed to create a new NVM set. In FIG. 23, a case is assumed where the new NVM set 161 is created from the original NVM set 160 comprising two NVM subsets 190B, 190C.

(1) Allocation of the User Input Block

One free block in the free block pool 180 corresponding to the original NVM set 160 is allocated as a user input block 410 corresponding to the NVM subset 190B. One free block in the free block pool 180 is allocated as a user input block 411 corresponding to the NVM subset 190C. If the user input blocks 410, 411 have already been allocated, this operation is not performed.

(2) Host Write

Write data from the host 2 is written to the user input block 410 from a write buffer 130B. Subsequently, the lookup table corresponding to the NVM subset 190B is updated. Consequently, a physical address indicative of a physical location in the user input block 410 to which the write data has been written is mapped to a logical address (LBA) corresponding to the write data.

Write data from the host 2 is written to the user input block 411 from a write buffer 130C. Subsequently, the lookup table corresponding to the NVM subset 190C is updated. Consequently, a physical address indicative of a physical location in the user input block 411 to which the write data has been written is mapped to a logical address (LBA) corresponding to the write data.

(3) Movement of the User Input Block

When the user input block 410 is filled with the write data, the user input block 410 is moved to the NVM subset (data block pool) 190B. In other words, the user input block 410 filled with the data is managed by the NVM subset (data block pool) 190B.

When the user input block 411 is filled with the write data, the user input block 411 is moved to the NVM subset (data block pool) 190C. In other words, the user input block 411 filled with the data is managed by the NVM subset (data block pool) 190C.

(4) Allocation of the GC Input Block

In the original NVM set (NVM set 160), one of the free blocks in the free block pool 180 is allocated as the GC input block 400 corresponding to the NVM subset 190B. One of the free blocks in the free block pool 180 is allocated as the GC input block 401 corresponding to the NVM subset 190C.

(5) Copying of Valid Data

One or more blocks including a mixture of valid data and invalid data are selected from the blocks in the NVM subset 190B (or the NVM subset 190C) as copy source blocks. Only the valid data in each of the copy source blocks are copied to the GC input block 400 (or the GC input block 401). Subsequently, the lookup table corresponding to the NVM subset 190B (or the NVM subset 190C) is updated. Consequently, physical addresses indicative of physical locations in the GC input block 400 (or the GC input block 401) to which the valid data have been copied are mapped to logical addresses (LBAs) corresponding to the copied valid data.

(6) Movement of the GC Input Block

When the GC input block 400 (or the GC input block 401) is filled with the valid data, the GC input block 400 (or the GC input block 401) is moved to the NVM subset 190B (or the NVM subset 190C). In other words, the GC input block 400 (or the GC input block 401) filled with the valid data is managed by the corresponding NVM subset (data block pool).

(7), (7)' Returning of Blocks

Blocks managed by the NVM subset 190B (or the NVM subset 190C) and holding no valid data are returned to the free block pool. In this case, blocks which do not belong to a set of dies to be allocated to the new NVM set 161 are returned from the NVM subset 190B (or the NVM subset 190C) to the free block pool 180. On the other hand, the blocks which belong to the set of dies to be allocated to the new NVM set 161 are returned from the NVM subset 190B (or the NVM subset 190C) to the free block pool 181 of the new NVM set.

The case where GC is executed on the whole original NVM set 160 has been described. However, blocks holding valid data may preferentially be selected, as copy source blocks, from the blocks which belong to the set of dies to be allocated to the new NVM set 161, and then, only the valid data in the selected copy source blocks may be copied to the GC input block (copy destination block). This enables the new NVM set 161 to be created in a short time.

Figure 24:
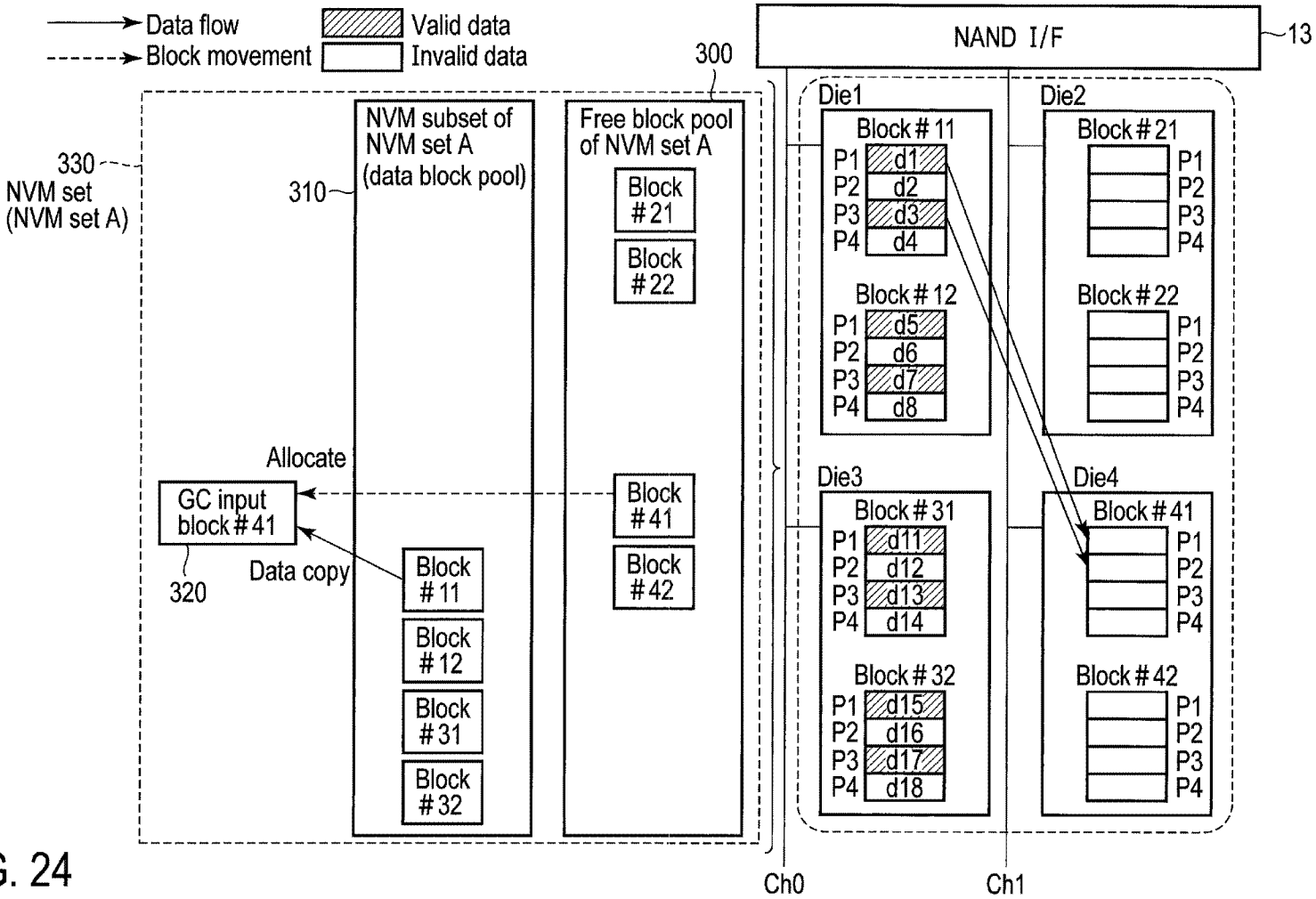
FIG. 24 is a diagram illustrating a part of the new NVM set creation operation performed by the memory system of the embodiment.
Figure 25:
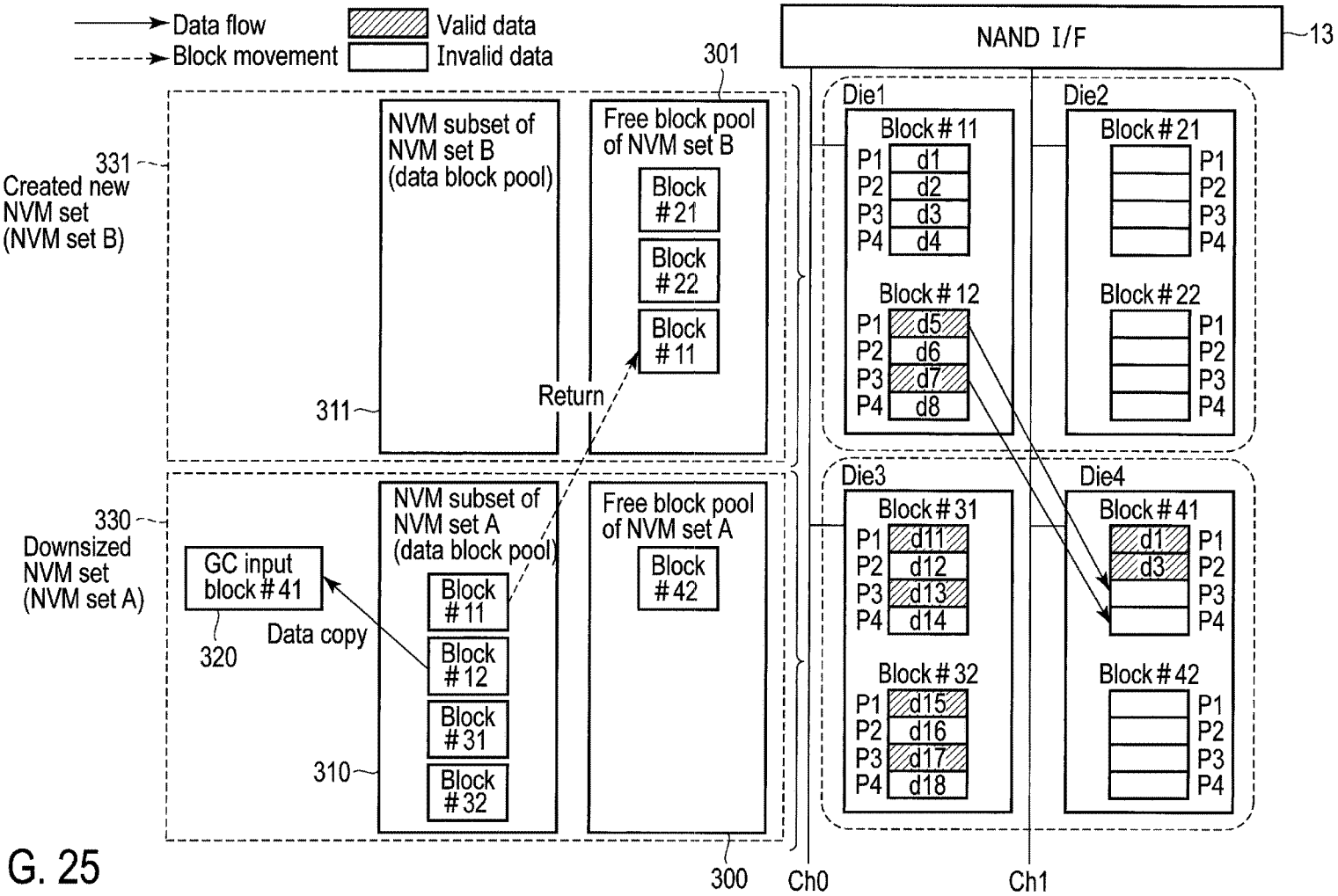
FIG. 25 is a diagram illustrating one remaining part of the new NVM set creation operation performed by the memory system of the embodiment.
Figure 26:
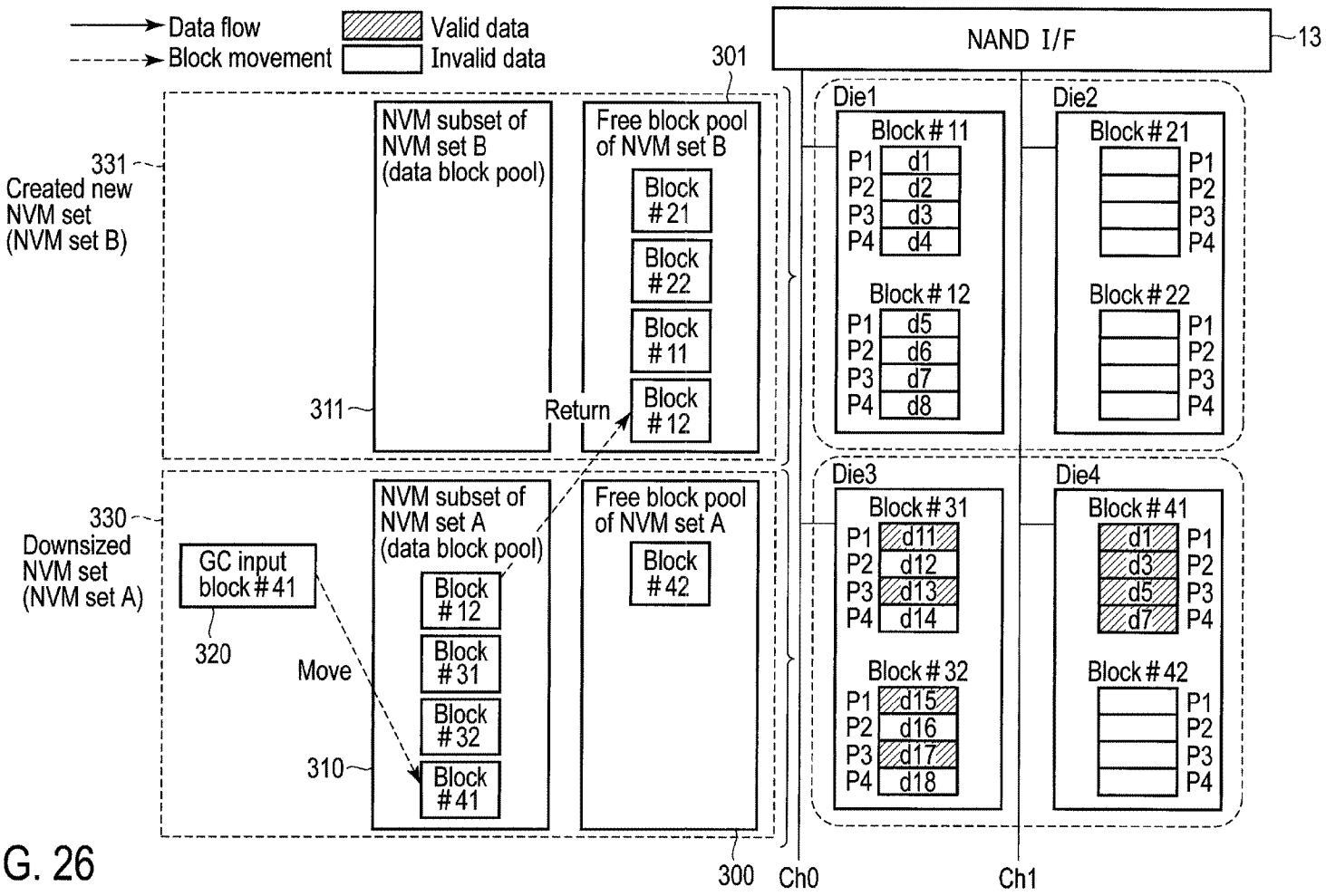
FIG. 26 is a diagram illustrating the other remaining part of the new NVM set creation operation performed by the memory system of the embodiment.

Now, the new-NVM-set creation operation will specifically be described using FIG. 24 to FIG. 26. In FIG. 24 to FIG. 26, for simplification of illustration, an NVM set 330 (NVM set A) is assumed to comprise the NAND flash memory dies 1 to 4, and each of dies is assumed to have two blocks each including the pages P1 to P4.

First, the NAND flash memory dies 1 and 2 to be reserved for the new NVM set B are determined by being selected from the NAND flash memory dies 1 to 4 belonging to the NVM set A.

Then, as depicted in FIG. 24, a block (in this case, the block #41) in a free block pool 300 of the NVM set A is allocated as a GC input block 320. A block holding valid data (in this case, the block #11) is selected from the blocks in the NAND flash memory dies 1 and 2 reserved for the new NVM set B, as a copy source block. Valid data in the selected copy source block (block #11) is copied to the GC input block 320 (block #41).

In the block #11, if a mixture of the valid data d1, d3 and the invalid data d2, d4 is present, only the valid data d1 and the valid data d3 are copied to the GC input block 320 (block #41). At this time, the data d1 is copied to the page P1 of the block #41, and the data d3 is copied to the page P2 of the block #41.

When the valid data (data d1 and data d3) in the block #11 are copied to the GC input block 320 (block #41), the data d1 and the data d3 in the block #11 are invalidated. Consequently, the block #11 becomes a block holding no valid data, and thus, the block #11 is returned to a free block pool 301 newly created for the NVM set B as depicted in FIG. 25.

In the NAND flash memory dies reserved for the NVM set B, the block #12 including a mixture of the valid data d5, d7 and the invalid data d6, d8 is present. When the block #12 is selected as a copy source block, only the valid data (data d5 and data d7) in the block #12 are copied to the GC input block 320 (block #41). At this time, the data d5 is copied to the page P3 of the block #21, and the data d7 is copied to the page P4 of the block #41.

When the valid data (data d5 and data d7) in the block #12 are copied to the GC input block 320 (block #41), the data d5 and the data d7 in the block #12 are invalidated. Consequently, the block #12 becomes a block holding no valid data, and thus, the block #12 is returned to the free block pool 301 of the NVM set B (new NVM set) as depicted in FIG. 26.

Figure 27:
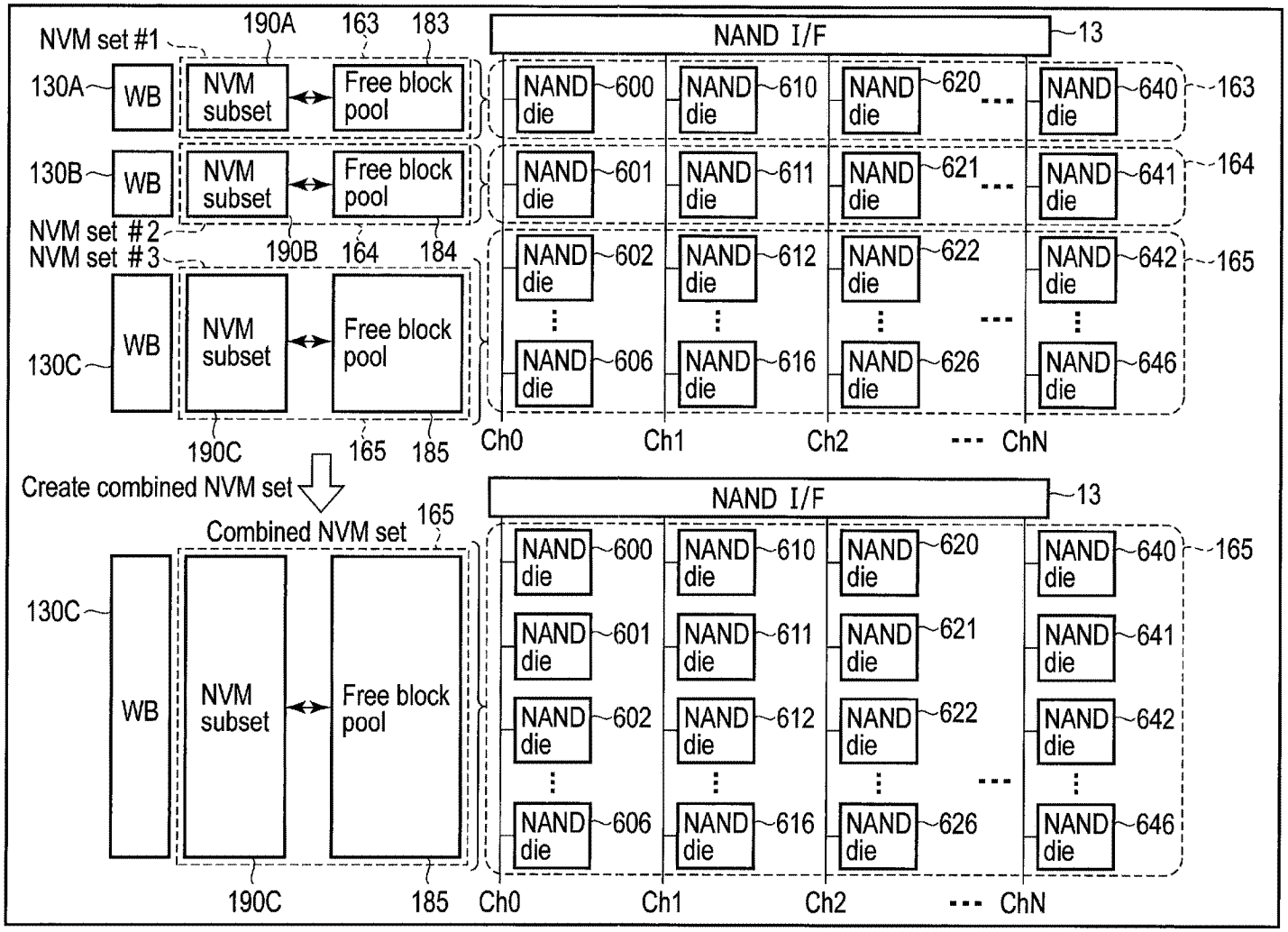
FIG. 27 is a diagram illustrating an outline of an NVM set combining operation performed by the memory system of the embodiment.

FIG. 27 illustrates an outline of an NVM set combining operation.

FIG. 27 illustrates an operation of combining the NVM set #1 (NVM set 163) and the NVM set #2 (NVM set 164) to the NVM set #3 (NVM set 165).

The NVM set #1 (NVM set 163) comprises the NAND flash memory dies 600, 610, 620, . . . 640. The NVM set #2 (NVM set 164) comprises the NAND flash memory dies 601, 611, 621, . . . 641. The NVM set #3 (NVM set 165) comprises the NAND flash memory dies 602 to 606, 612 to 616, 622 to 626, . . . 642 to 646.

When the NVM set #1 (NVM set 163) and the NVM set #2 (NVM set 164) are combined to the NVM set #3 (NVM set 165), a free block pool 183 corresponding to the NVM set #1 (NVM set 163) and a free block pool 184 corresponding to the NVM set #2 (NVM set 164) are also combined to a free block pool 185 corresponding to the NVM set #3 (NVM set 165). Further, an NVM subset 190A of the NVM set #1 (NVM set 163) and an NVM subset 190B of the NVM set #2 (NVM set 164) are combined to an NVM subset 190C of the NVM set #3 (NVM set 165).

Figure 28:
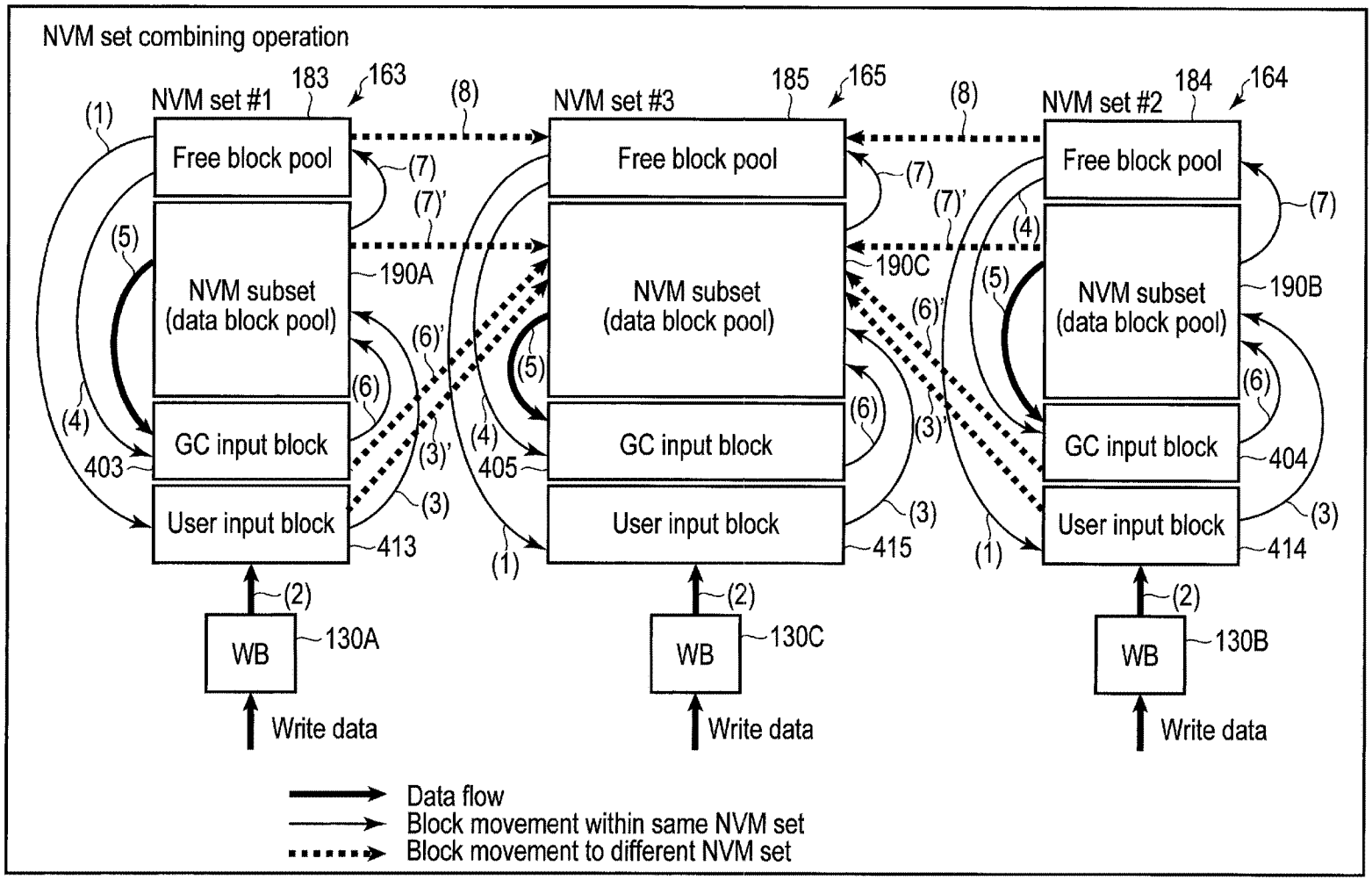
FIG. 28 is a diagram illustrating a host write/garbage collection operation performed for NVM set combining.

FIG. 28 illustrates a host write/garbage collection operation performed for NVM set combining.

Before the NVM set combining operation is performed, a write data writing operation and a garbage collection operation are performed independently on the NVM sets #1 to #3.

(1) Allocation of the User Input Block

One free block in the free block pool 183 is allocated as a user input block 413. One free block in the free block pool 184 is allocated as a user input block 414. One free block in the free block pool 185 is allocated as a user input block 415. If the user input blocks 413, 414, 415 have already been allocated, this operation is not performed.

(2) Host Write

In the NVM set #1 (NVM set 163), write data from the host 2 is written to the user input block 413 from the write buffer 130A. The write buffer 130A temporarily stores write data associated with the NVM subset 190A. Subsequently, the lookup table corresponding to the NVM set 163 is updated. Consequently, a physical address indicative of a physical location in the user input block 413 to which the write data has been written is mapped to a logical address (LBA) corresponding to the write data.

In the NVM set #2 (NVM set 164), write data from the host 2 is written to the user input block 414 from the write buffer 130B. The write buffer 130B temporarily stores write data associated with the NVM subset 190B. Subsequently, the lookup table corresponding to the NVM set 164 is updated. Consequently, a physical address indicative of a physical location in the user input block 414 to which the write data has been written is mapped to a logical address (LBA) corresponding to the write data.

In the NVM set #3 (NVM set 165), write data from the host 2 is written to the user input block 415 from the write buffer 130C. The write buffer 130C temporarily stores write data associated with the NVM subset 190C. Subsequently, the lookup table corresponding to the NVM set 165 is updated. Consequently, a physical address indicative of a physical location in the user input block 415 to which the write data has been written is mapped to a logical address (LBA) corresponding to the write data.

(3) Movement of the User Input Block

When the user input block 415 in the NVM set #3 is filled with the write data, the user input block 415 is moved to the NVM subset (data block pool) 190C. In other words, the user input block 415 filled with the data is managed by the NVM subset (data block pool) 190C.

Before the NVM set combining operation is performed, when the user input block 413 in the NVM set #1 is filled with the write data, the user input block 413 is moved to the NVM subset (data block pool) 190A, and when the user input block 414 in the NVM set #2 is filled with the write data, the user input block 414 is moved to the NVM subset (data block pool) 190B. However, after the NVM set combining operation is performed, an operation illustrated in (3)' is performed instead of the operation illustrated in (3).

(3)' Movement of the User Input Block to the Combining Destination NVM Set.

When the user input block 413 in the NVM set #1 is filled with the write data, the user input block 413 is moved to the NVM subset 190C of the NVM set #3. In other words, the user input block 413 filled with the data is managed by the NVM subset (data block pool) 190C.

When the user input block 414 in the NVM set #2 is filled with the write data, the user input block 414 is moved to the NVM subset 190C of the NVM set #3. In other words, the user input block 414 filled with the data is managed by the NVM subset (data block pool) 190C.

(4) Allocation of the GC Input Block

When garbage collection needs to be executed on the NVM subset (data block pool) 190A, a garbage collection operation for a group of the blocks in the NVM subset 190A is performed independently of the other NVM sets. For example, the garbage collection operation may be determined to be necessary when the number of blocks included in the NVM subset 190A is larger than the certain threshold X1 corresponding to the NVM subset 190A. The threshold X1 may be determined based on the total number of blocks which can be allocated for the NVM subset 190A. For example, the certain threshold X1 corresponding to the NVM set 190A may be a value resulting from subtraction of a predetermined number from the total number of blocks which can be allocated for the NVM subset 190A.

When the garbage collection operation is needed for the NVM subset 190A, one free block in the free block pool 183 is allocated as a GC input block 403.

When the garbage collection operation needs to be performed on the NVM subset (data block pool) 190B, a garbage collection operation for a group of the blocks in the NVM subset 190B is executed independently of the other NVM sets. For example, the garbage collection operation may be determined to be necessary when the number of blocks included in the NVM subset 190B is larger than the certain threshold X1 corresponding to the NVM subset 190B. The threshold X1 may be determined based on the total number of blocks which can be allocated for the NVM subset 190B. For example, the certain threshold X1 corresponding to the NVM set 190B may be a value resulting from subtraction of a predetermined number from the total number of blocks which can be allocated for the NVM subset 190B.

When the garbage collection operation is needed for the NVM subset 190B, one free block in the free block pool 184 is allocated as a GC input block 404.

When the garbage collection operation needs to be performed on the NVM subset (data block pool) 190C, a garbage collection operation for a group of the blocks in the NVM subset 190C is executed independently of the other NVM sets. For example, the garbage collection operation may be determined to be necessary when the number of blocks included in the NVM subset 190C is larger than the certain threshold X1 corresponding to the NVM subset 190C. The threshold X1 may be determined based on the total number of blocks which can be allocated for the NVM subset 190C. For example, the certain threshold X1 corresponding to the NVM set 190C may be a value resulting from subtraction of a predetermined number from the total number of blocks which can be allocated for the NVM subset 190C.

When the garbage collection operation is needed for the NVM subset 190C, one free block in the free block pool 185 is allocated as a GC input block 405.

(5) Copying of Valid Data

One or more blocks including a mixture of valid data and invalid data are selected from the blocks in the NVM subset 190A as copy source blocks. Only the valid data in the selected blocks are copied to the GC input block 403. Subsequently, the lookup table corresponding to the NVM set 163 is updated. Consequently, physical addresses indicative of physical locations in the GC input block 403 to which the valid data have been copied are mapped to logical addresses (LBAs) corresponding to the copied valid data.

One or more blocks including a mixture of valid data and invalid data are also selected from the blocks in the NVM subset 190B as copy source blocks. Only the valid data in the selected blocks are copied to the GC input block 404. Subsequently, the lookup table corresponding to the NVM set 164 is updated. Consequently, physical addresses indicative of physical locations in the GC input block 404 to which the valid data have been copied are mapped to logical addresses (LBAs) corresponding to the copied valid data.

One or more blocks including a mixture of valid data and invalid data are further selected from the blocks in the NVM subset 190C as copy source blocks. Only the valid data in the selected blocks are copied to the GC input block 405. Subsequently, the lookup table corresponding to the NVM set 165 is updated. Consequently, physical addresses indicative of physical locations in the GC input block 405 to which the valid data have been copied are mapped to logical addresses (LBAs) corresponding to the copied valid data.

(6) Movement of the GC Input Block

When the GC input block 405 in the NVM set #3 is filled with the valid data, the GC input block 405 is moved to the NVM subset 190C. In other words, the GC input block 405 filled with the valid data is managed by the NVM subset (data block pool) 190C.

Before the NVM set combining operation is performed, when the GC input block 403 in the NVM set #1 is filled with the valid data, the GC input block 403 is moved to the NVM subset 190A, and when the GC input block 404 in the NVM set #2 is filled with the valid data, the GC input block 404 is moved to the NVM subset 190B. However, after the NVM set combining operation is performed, an operation illustrated in (6)' is performed instead of the operation illustrated in (6).

(6)' Movement of the GC Input Block to the Combining Destination NVM Set

When the GC input block 403 in the NVM set #1 is filled with the valid data, the GC input block 403 is moved to the NVM subset 190C in the NVM set #3. The GC input block 403 filled with the valid data is managed by the NVM subset (data block pool) 190C.

When the GC input block 404 in the NVM set #2 is filled with the valid data, the GC input block 404 is moved to the NVM subset 190C in the NVM set #3. The GC input block 404 filled with the valid data is managed by the NVM subset (data block pool) 190C.

(7) Returning of Blocks

Blocks in the NVM set #3 which are managed by the NVM subset 190C and which hold no valid data are returned from the NVM subset 190C to the free block pool 185. Blocks which do not hold valid data are blocks where all the data therein are invalidated by host write, or blocks where all the valid data therein are copied to the copy destination block by the garbage collection operation.

Before the NVM set combining operation is performed, blocks in the NVM set #1 which are managed by the NVM subset 190A and which hold no valid data are returned from the NVM subset 190A to the free block pool 183, and blocks in the NVM set #2 which are managed by the NVM subset 190B and which hold no valid data are returned from the NVM subset 190B to the free block pool 184. However, after the NVM set combining operation is performed, an operation illustrated in (7)' is performed instead of the operation illustrated in (7).

(7)' Movement of the Blocks in the NVM Subset to the Combining Destination NVM Set The blocks in the NVM subset 190A are moved to the NVM subset 190C in the NVM set #3. In other words, the blocks in the NVM subset 190A are managed by the NVM subset (data block pool) 190C.

The blocks in the NVM subset 190B are moved to the NVM subset 190C in the NVM set #3. In other words, the blocks in the NVM subset 190B are managed by the NVM subset (data block pool) 190C.

(8) Movement of Free Blocks to the Combining Destination NVM Set

The free blocks in the free block pool 183 of the NVM set #1 are moved to the free block pool 185 of the NVM set #3. The free blocks in the free block pool 184 of the NVM set #2 are moved to the free block pool 185 of the NVM set #3.

Figure 29:
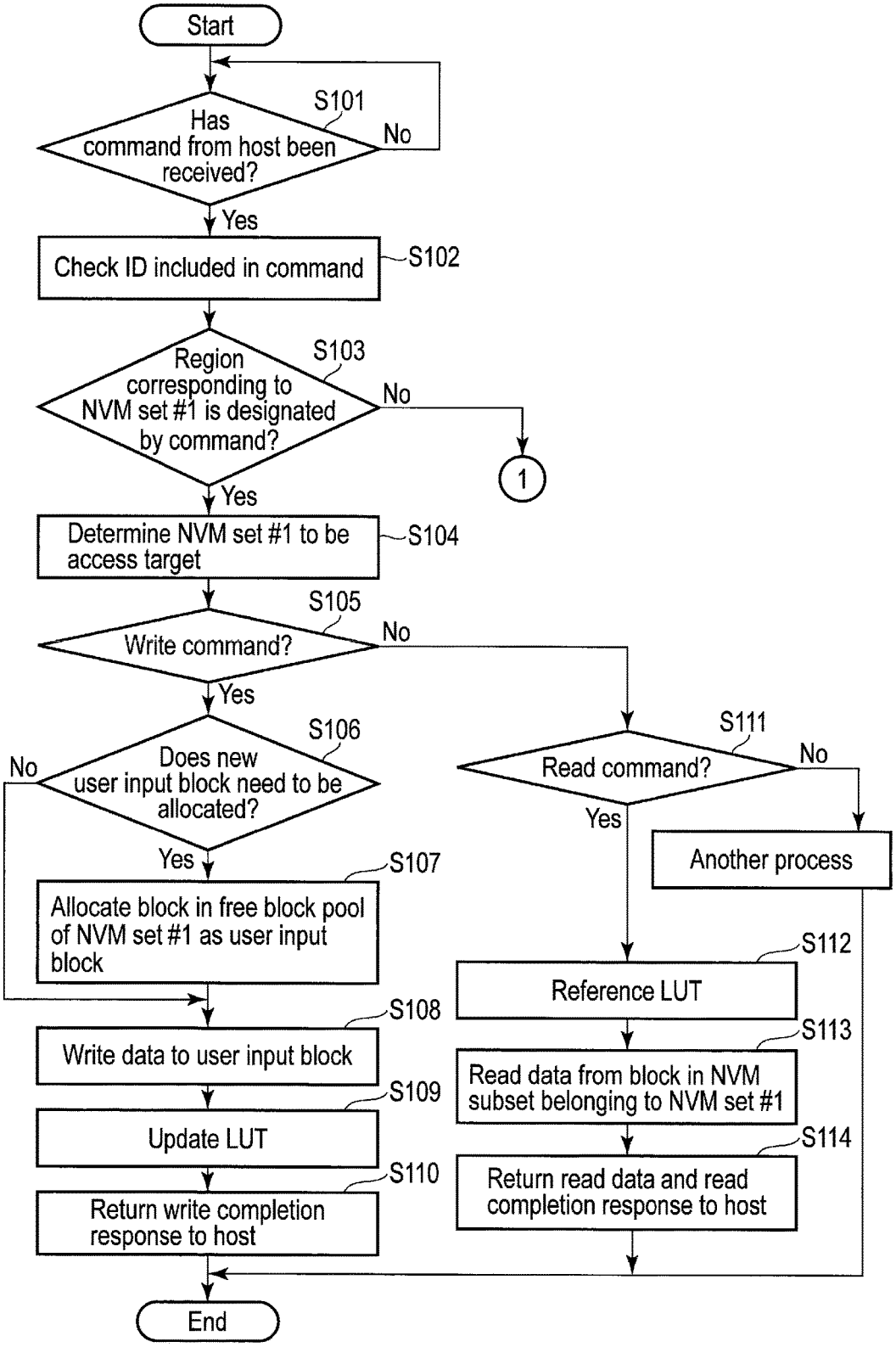
FIG. 29 is a flowchart illustrating a part of a procedure of a data write/read operation performed by the memory system of the embodiment.
Figure 30:
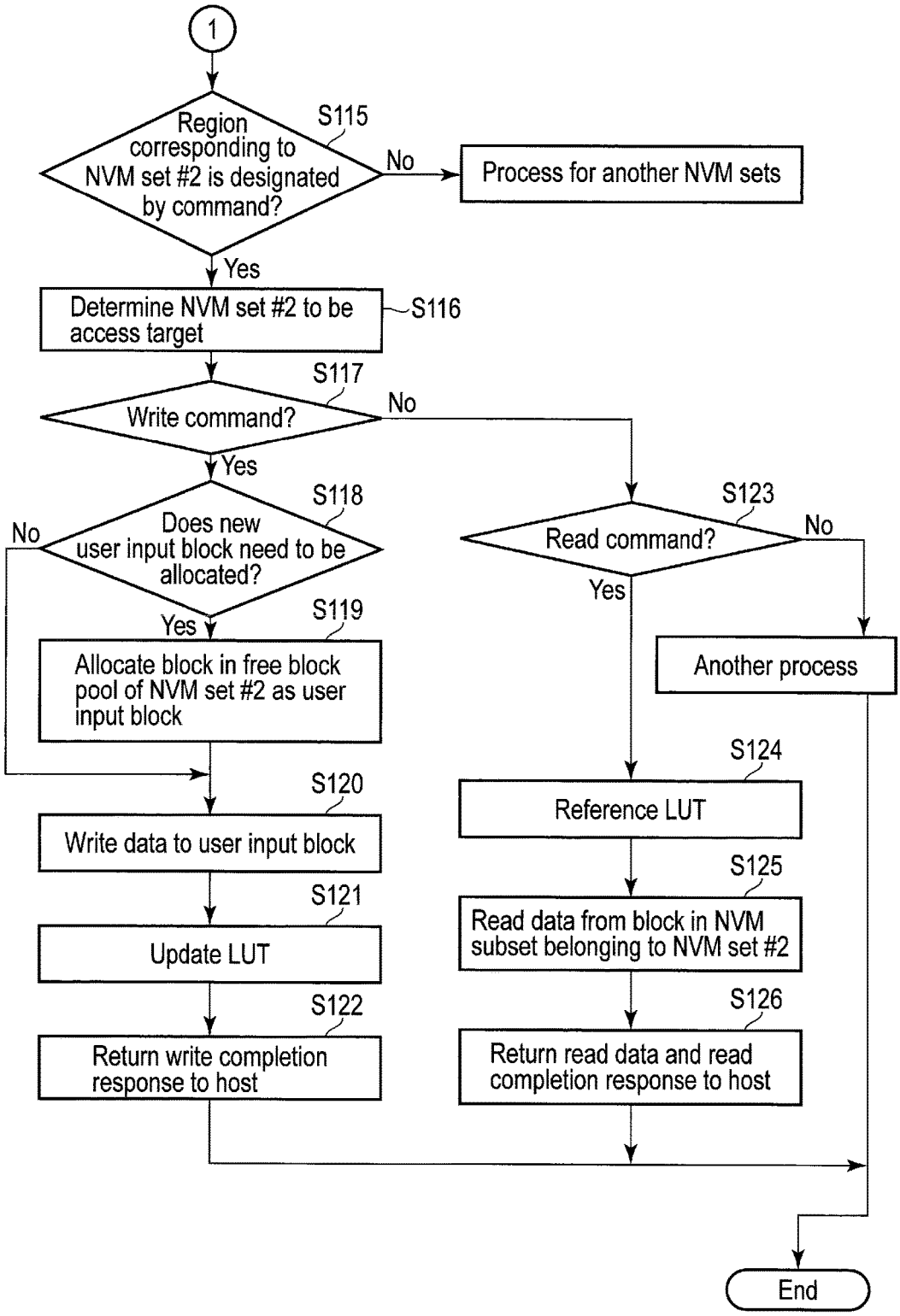
FIG. 30 is a flowchart illustrating the remaining part of the procedure of the data write/read operation performed by the memory system of the embodiment.

Flowcharts in FIG. 29 and FIG. 30 illustrate a procedure of a data write/read operation performed by the controller 4.

When the controller 4 receives a command from the host 2 (step S101, YES), the NVM set control unit 21 of the controller 4 checks a namespace ID included in the received command (step S102). If the received command designates a region corresponding to the NVM set #1 (step S103, YES), the NVM set control unit 21 determines the NVM set #1 to be an access target (step S104). For example, in a case where a namespace with NSID1 corresponds to the NVM set #1, if the received command includes the NSID1, the NVM set control unit 21 may determine that the region corresponding to the NVM set #1 is designated.

If the received command is a write command (step S105, YES), the NVM set control unit 21 determines whether or not allocation of a new user input block is needed (step S106). If the allocation of a new user input block is needed (step S106, YES), the NVM set control unit 21 allocates a free block in the free block pool of the NVM set #1 as a user input block (step S107) and writes data (write data) to the allocated user input block (step S108). If the allocation of a new user input block is not needed (step S106, NO), the NVM set control unit 21 writes the write data to an already allocated user input block (step S108).

When the write data is written to the user input block, the NVM set control unit 21 updates the LUT corresponding to the NVM set #1 (step S109). The NVM set control unit 21 then returns a write completion response to the host 2 (step S110).

If the received command is a read command (step S105, NO, step S111, YES), the NVM set control unit 21 references the LUT corresponding to the NVM set #1 (step S112) to acquire a physical address corresponding to a starting LBA in the read command. The NVM set control unit 21 reads data designated by the read command from a block in the NVM subset belonging to the NVM set #1 (step S113). The NVM set control unit 21 then returns the read data and a read completion response to the host 2 (step S114).

If the received command does not designate the region corresponding to the NVM set #1 (step S103, NO), the NVM set control unit 21 determines whether or not the received command designates a region corresponding to the NVM set #2 (step S115 in FIG. 30). If the received command designates a region corresponding to the NVM set #2 (step S115, YES), the NVM set control unit 21 determines the NVM set #2 to be an access target (step S116). For example, in a case where a namespace with NSID2 corresponds to the NVM set #2, if the received command includes the NSID2, the NVM set control unit 21 may determine that the region corresponding to the NVM set #2 is designated.

If the received command is a write command (step S117, YES), the NVM set control unit 21 determines whether or not allocation of a new user input block is needed (step S118). If the allocation of a new user input block is needed (step S118, YES), the NVM set control unit 21 allocates a free block in the free block pool of the NVM set #2 as a user input block (step S119) and writes data (write data) to the allocated user input block (step S120). If the allocation of a new user input block is not needed (step S118, NO), the NVM set control unit 21 writes the write data to an already allocated user input block (step S120).

When the write data is written to the user input block, the NVM set control unit 21 updates the LUT corresponding to the NVM set #2 (step S121). The NVM set control unit 21 then returns a write completion response to the host 2 (step S122).

If the received command is a read command (step S117, NO, step S123, YES), the NVM set control unit 21 references the LUT corresponding to the NVM set #2 (step S124) to acquire a physical address corresponding to a starting LBA in the read command. The NVM set control unit 21 reads data designated by the read command from a block in the NVM subset belonging to the NVM set #2 (step S125). The NVM set control unit 21 returns the read data and a read completion response to the host 2 (step S126).

Figure 31:
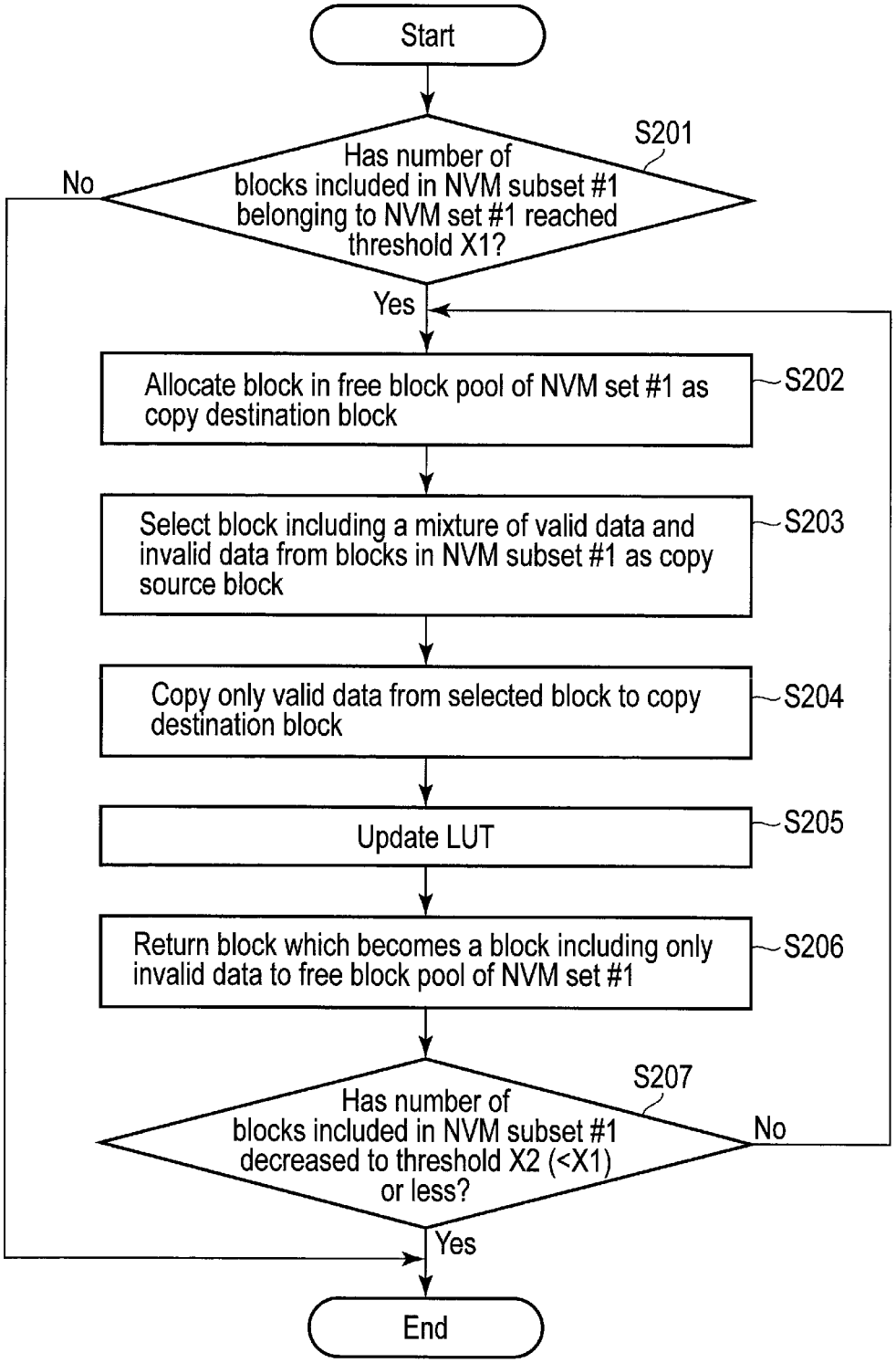
FIG. 31 is a flowchart illustrating a procedure of the garbage collection operation performed for each of the NVM subsets belonging to a certain NVM set.

A flowchart in FIG. 31 illustrates a procedure of a garbage collection operation performed for each NVM subset belonging to a certain NVM set.

The GC operation control unit 22 determines whether or not the number of blocks included in an NVM subset #1 belonging to the NVM set #1 has reached the threshold X1 corresponding to the NVM subset #1 (step S201). If the number of blocks included in an NVM subset #1 belonging to the NVM set #1 has reached the threshold X1 corresponding to the NVM subset #1 (step S201, YES), the GC operation control unit 22 starts GC for the NVM subset #1.

The GC operation control unit 22 first allocates a free block in the free block pool of the NVM set #1 as a copy destination block (step S202). The GC operation control unit 22 then selects a block including a mixture of valid data and invalid data from the blocks in the NVM subset #1 as a copy source block (step S203).

The GC operation control unit 22 then copies only the valid data in the selected block (copy source block) to the copy destination block (step S204). The GC operation control unit 22 then updates the LUT corresponding to the NVM subset #1 (step S205). When valid date no longer exist in copy source block by the copy of the valid data to the copy destination block, the GC operation control unit 22 returns the block (copy source block) which becomes a block including only the invalid data to the free block pool of the NVM set #1 (step S206).

The GC operation control unit 22 subsequently determines whether or not the number of blocks included in the NVM subset #1 has decreased to a threshold X2 (<X1) or less corresponding to the NVM subset #1 (step S207). If the number of blocks included in the NVM subset #1 has decreased to the threshold X2 (<X1) or less, the GC operation control unit 22 ends the garbage collection operation. If the number of blocks included in the NVM subset #1 has not decreased to the threshold X2 (<X1) or less (step S207, NO), the GC operation control unit 22 continues the garbage collection operation (steps S202 to S206).

Figure 32:
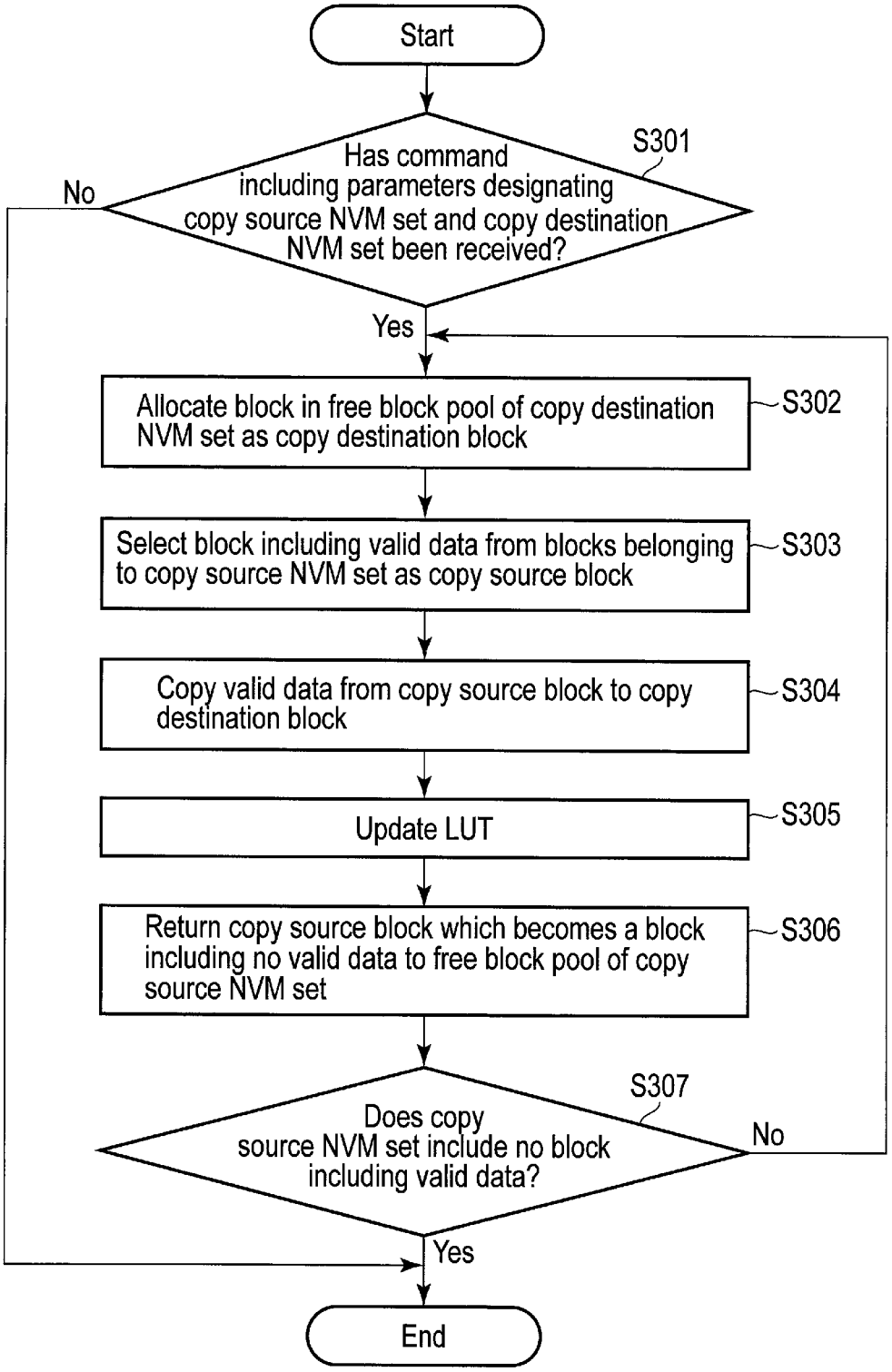
FIG. 32 is a flowchart of a procedure of the inter-NVM-set copy operation performed by the memory system of the embodiment.

A flowchart in FIG. 32 illustrates a procedure of an inter-NVM-set copy operation performed by the inter-NVM-set copy control unit 23.

Upon receiving an inter-NVM-set copy command from the host 2 which includes parameters designating a copy source NVM set and a copy destination NVM set (step S301, YES), the inter-NVM-set copy control unit 23 allocates a free block in the free block pool of the copy destination NVM set as a copy destination block (step S302). The inter-NVM-set copy control unit 23 selects a block with valid data from the blocks belonging to the copy source NVM set as a copy source block (step S303).

The inter-NVM-set copy control unit 23 then copies the valid data from the copy source block to the copy destination block (step S304). When the valid data is copied, the inter-NVM-set copy control unit 23 updates the LUT corresponding to the NVM subset of the copy source NVM set (step S305).

When valid date no longer exist in copy source block by the copy of the valid data to the copy destination block, the inter-NVM-set copy control unit 23 returns the copy source block which becomes a block including no valid data to the free block pool of the copy source NVM set (step S306).

The inter-NVM-set copy control unit 23 repeats the processing in step S302 to step S306 until a block including valid data no longer exists in the copy source NVM set (step S307).

Figure 33:
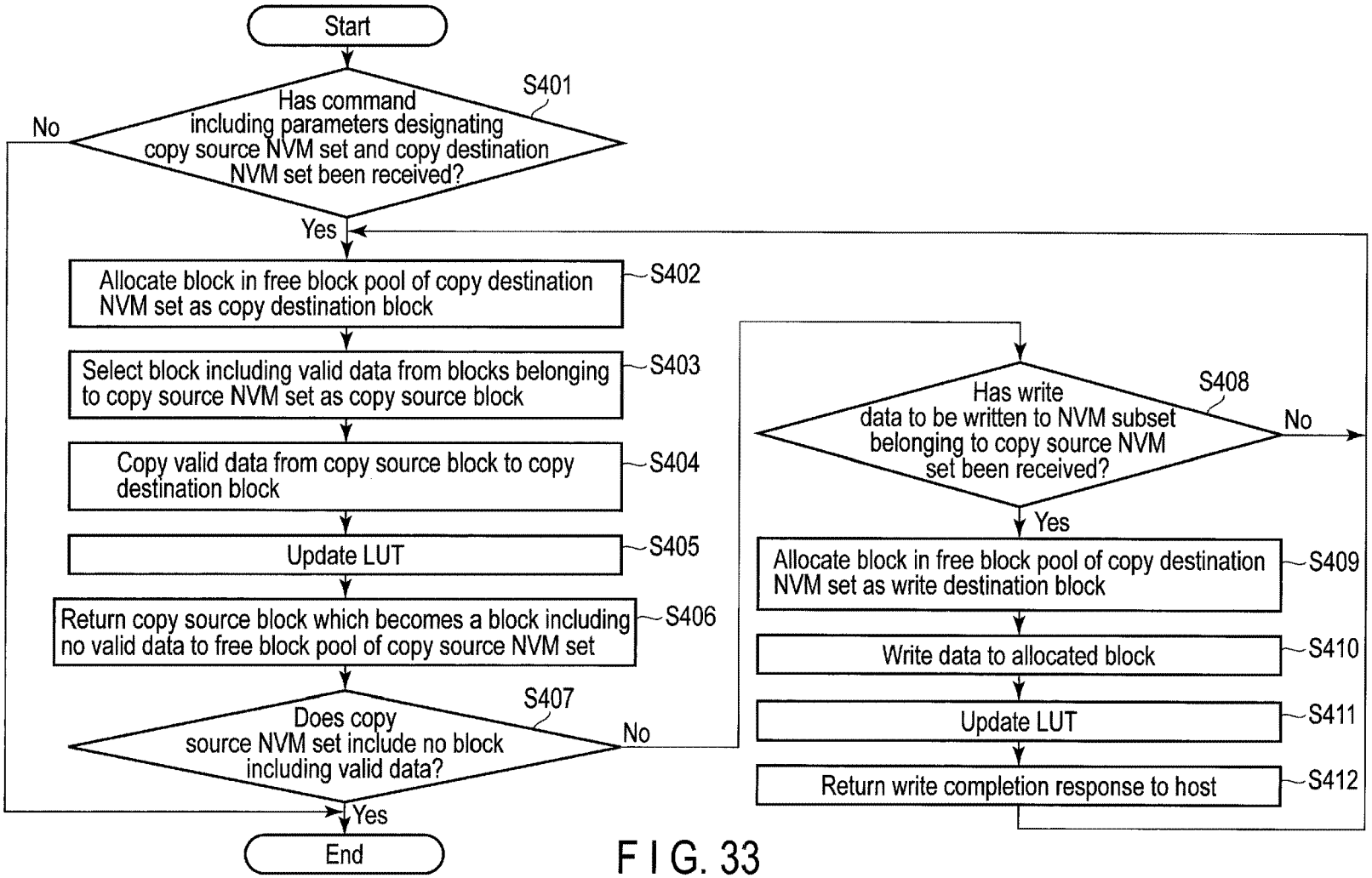
FIG. 33 is a flowchart illustrating another procedure of the inter-NVM-set copy operation performed by the memory system of the embodiment.

A flowchart in FIG. 33 illustrates a procedure of an inter-NVM-set copy operation performed by the inter-NVM-set copy control unit 23. A host write operation during the inter-NVM-set copy operation is assumed to be allowed.

Upon receiving an inter-NVM-set copy command from the host 2 which includes parameters designating a copy source NVM set and a copy destination NVM set (step S401, YES), the inter-NVM-set copy control unit 23 allocates a free block in the free block pool of the copy destination NVM set as a copy destination block (step S402). The inter-NVM-set copy control unit 23 then selects a block with valid data from the blocks belonging to the copy source NVM set as a copy source block (step S403).

The inter-NVM-set copy control unit 23 then copies the valid data from the copy source block to the copy destination block (step S404). When the valid data is copied, the inter-NVM-set copy control unit 23 updates the LUT corresponding to the NVM subset of the copy source NVM set (step S405).

When valid date no longer exist in copy source block by the copy of the valid data to the copy destination block, the inter-NVM-set copy control unit 23 returns the copy source block which becomes a block including no valid data to the free block pool of the copy source NVM set (step S406).

The inter-NVM-set copy control unit 23 then determines whether or not a block including valid data does not exist in the copy source NVM set, that is, whether or not a block including valid data no longer exists in the copy source NVM set (step S407). If a block including valid data does not exist in the copy source NVM set (step S407, YES), the inter-NVM-set copy control unit 23 ends the inter-NVM-set copy operation.

On the other hand, if a block including valid data exists in the copy source NVM set (step S407, NO), the NVM set control unit 21 of the controller 4 determines whether or not write data to be written to the NVM subset belonging to the copy source NVM set has been received (step S408). If the write data to be written to the NVM subset belonging to the copy source NVM set has not been received (step S408, NO), the process continues with step S402.

If the write data to be written to the NVM subset belonging to the copy source NVM set has been received (step S408, YES), that is, if the write data directed to the copy source NVM set is received from the host 2 while performing the inter-NVM-set copy operation, the NVM set control unit 21 allocates a free block in the free block pool of the copy destination NVM set as a write destination block (step S409). The NVM set control unit 21 writes the write data to the allocated write destination block (step S410). When the write data is written to the allocated write destination block, the NVM set control unit 21 updates the LUT corresponding to the NVM subset belonging to the copy source NVM set (step S411). In step S411, the controller 4 maps a physical address indicative of a physical location in the allocated write destination block to which the write data is written, to a logical address corresponding to the write data.

The controller 4 then returns a write completion response to the host 2 (step S412). When the write completion response is returned to the host 2, the process continues with step S402.

The processing in step S402 to step S412 is repeated until a block including valid data no longer exists in the copy source NVM set (step S407).

Figure 34:
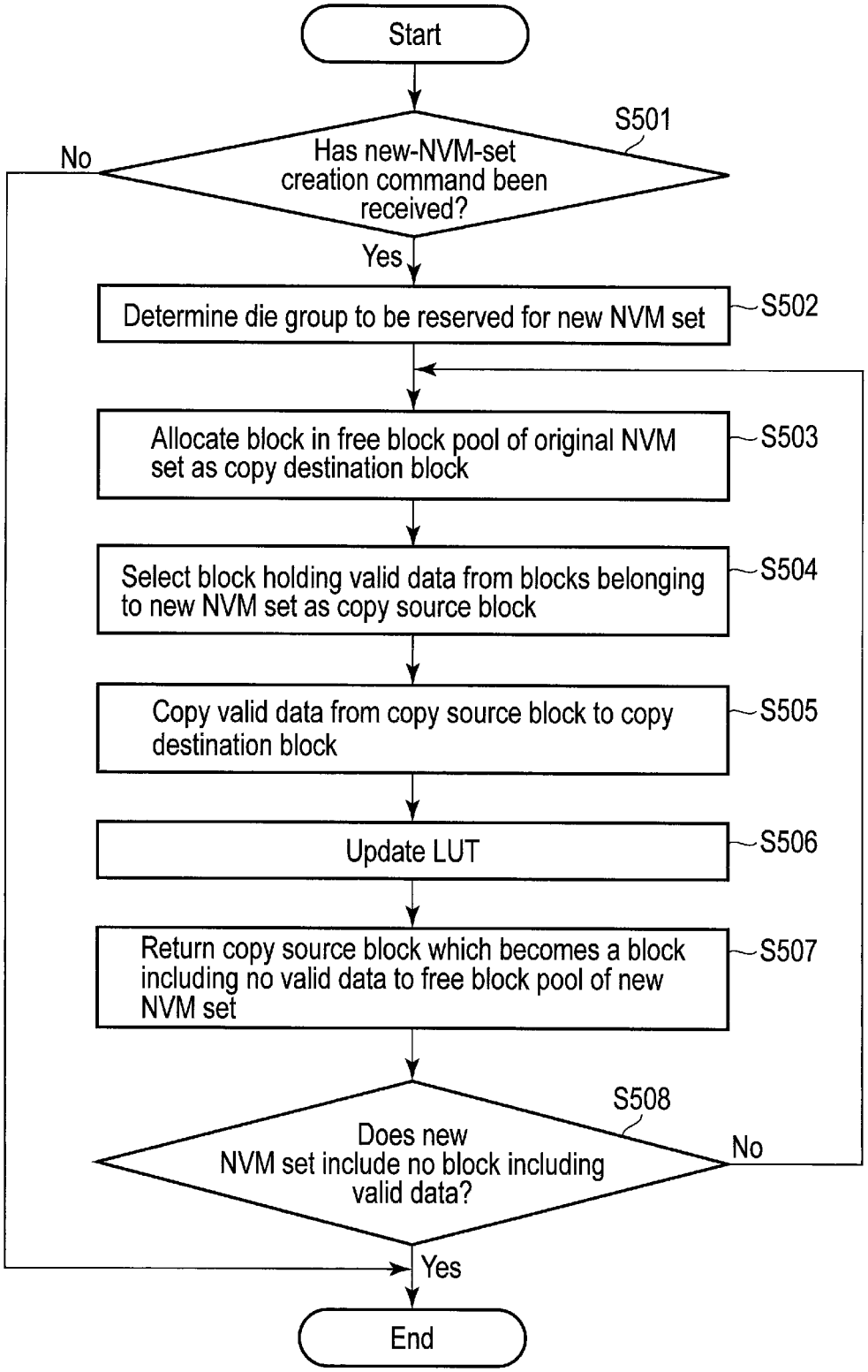
FIG. 34 is a flowchart illustrating a procedure of the new-NVM-set creation operation performed by the memory system of the embodiment.

A flowchart in FIG. 34 illustrates a procedure of a new-NVM-set creation operation performed by the new-NVM-set creation control unit 24.

Upon receiving a new-NVM-set creation command (step S501, YES), the new-NVM-set creation control unit 24 determines a group of NAND flash memory dies to be reserved for a new NVM set by selecting the group of NAND flash memory dies from all the NAND flash memory dies belonging to the original NVM set (step S502). The original NVM set may be designated by the new-NVM-set creation command.

The new-NVM-set creation control unit 24 subsequently allocates a free block in the free block pool of the original NVM set as a copy destination block (step S503). The new-NVM-set creation control unit 24 then selects a block holding valid data from the blocks belonging to the new NVM set (that is, the blocks belonging to the group of the reserved NAND flash memory dies) as a copy source block (step S504).

The new-NVM-set creation control unit 24 then copies the valid data from the copy source block to the copy destination block (step S505). When the valid data are copied, the new-NVM-set creation control unit 24 updates the LUT corresponding to the NVM subset of the original NVM set (step S506). When valid data no longer exist in the copy source block, the new-NVM-set creation control unit 24 subsequently returns the copy source block which becomes a block including no valid data to the free block pool of the new NVM set (step S507).

The new-NVM-set creation control unit 24 then determines whether or not a block including valid data does not exist in the new NVM set, that is, whether or not a block including valid data no longer exists in the new NVM set (step S508). If a block including valid data does not exist in the new NVM set (step S508, YES), the new-NVM-set creation control unit 24 ends the new-NVM-set creation operation. If a block including valid data exists in the new NVM set (step S508, NO), the new-NVM-set creation control unit 24 continues with the new-NVM-set creation operation (step S503 to step S507).

The processing in step S503 to step S507 is repeated until a block including valid data no longer exists in the new NVM set.

Figure 35:
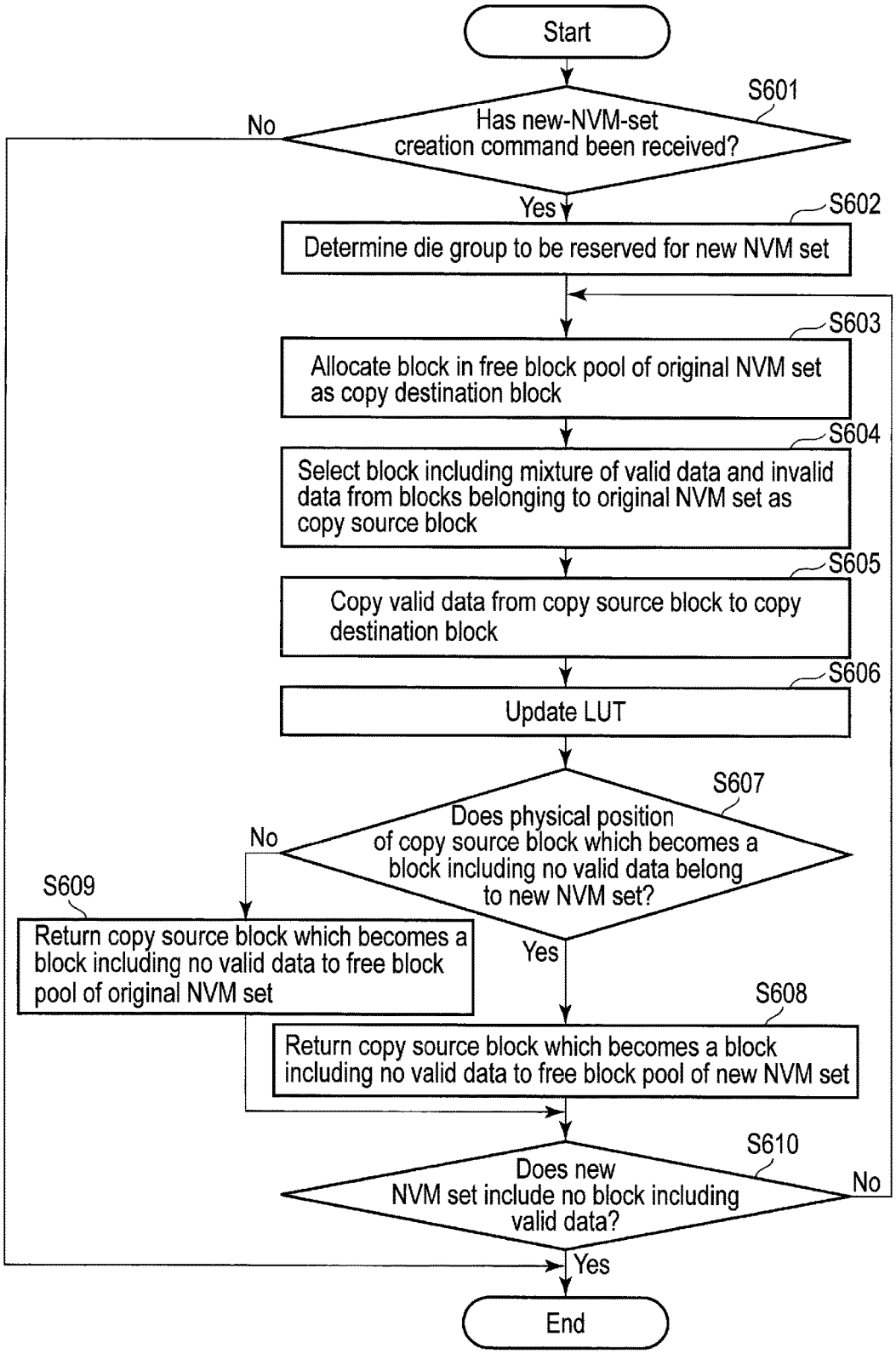
FIG. 35 is a flowchart illustrating another procedure of the new-NVM-set creation operation performed by the memory system of the embodiment.

A flowchart in FIG. 35 illustrates another procedure of the new-NVM-set creation operation performed by the new-NVM-set creation control unit 24. The flowchart illustrates the procedure in which the new-NVM-set creation operation and a garbage collection operation for the original NVM set are performed in parallel.

Upon receiving a new-NVM-set creation command (step S601), the new-NVM-set creation control unit 24 determines a group of NAND flash memory dies to be reserved for a new NVM set (step S602). The new-NVM-set creation control unit 24 subsequently allocates a free block in the free block pool of the original NVM set as a copy destination block (step S603). The new-NVM-set creation control unit 24 then selects a block including a mixture of valid data and invalid data from the blocks belonging to the original NVM set as a copy source block (step S604). In step S604, the new-NVM-set creation control unit 24 may preferentially select a block with few valid data as a copy source block.

The new-NVM-set creation control unit 24 then copies the valid data from the copy source block to the copy destination block (step S605). When the valid data are copied, the new-NVM-set creation control unit 24 updates the LUT corresponding to the NVM subset of the original NVM set (step S606).

When valid data no longer exist in the copy source block, the new-NVM-set creation control unit 24 subsequently determines whether or not the physical position of the copy source block which becomes a block including no valid data belongs to the new NVM set (step S607). If the physical position of the copy source block which becomes a block including no valid data belongs to the new NVM set (step S607, YES), the new-NVM-set creation control unit 24 returns the copy source which becomes a block including no valid data to the free block pool of the new NVM set (step S608). If the physical position of the copy source block which becomes a block including no valid data does not belong to the new NVM set (step S607, NO), the new-NVM-set creation control unit 24 returns the copy source block which becomes a block including no valid data to the free block pool of the original NVM set (step S609).

The new-NVM-set creation control unit 24 then determines whether or not a block including valid data does not exist in the new NVM set, that is, whether or not a block including valid data no longer exists in the new NVM set (step S610). If a block including valid data does not exist in the new NVM set (step S610, YES), the new-NVM-set creation control unit 24 ends the new-NVM-set creation operation. If a block including valid data exists in the new NVM set (step S610, NO), the new-NVM-set creation control unit 24 executes the processing in step S603.

The processing in step S603 to step S607 is repeated until a block including valid data no longer exists in the new NVM set.

Figure 36:
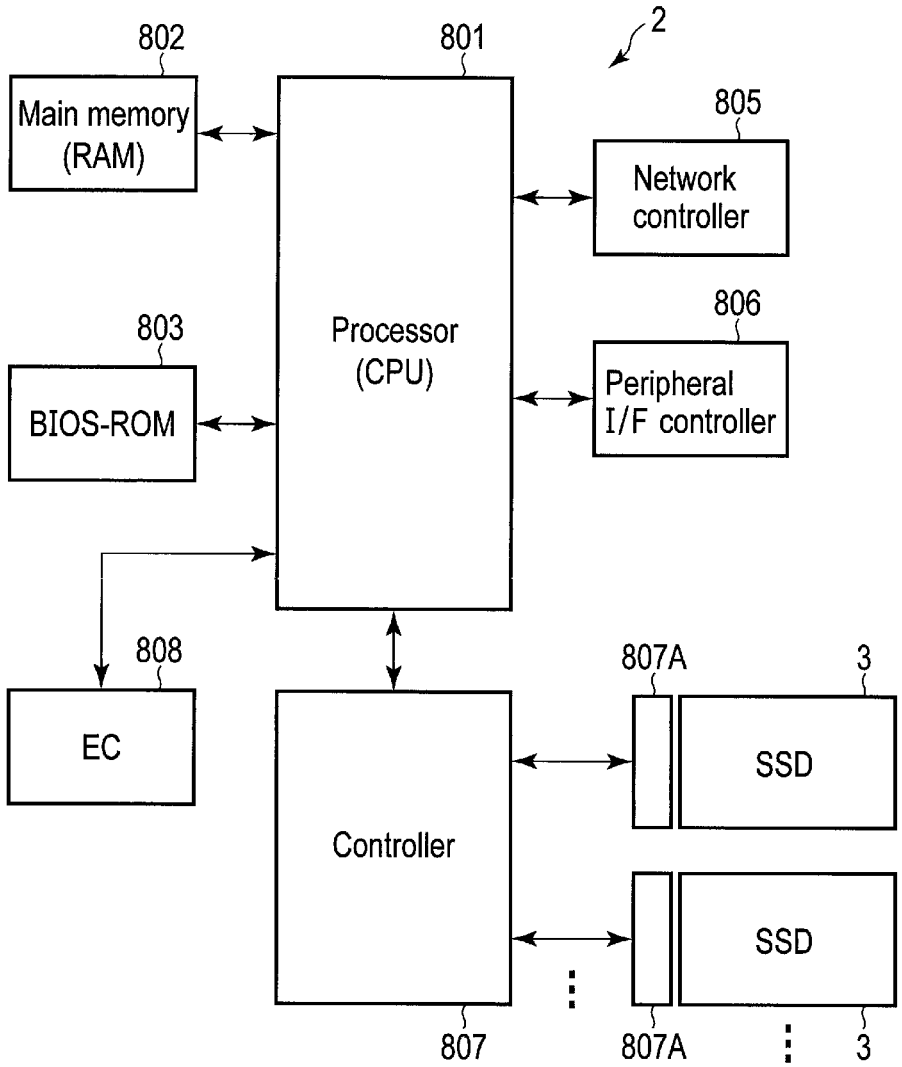
FIG. 36 is a block diagram illustrating a configuration example of a host applied to the memory system of the embodiment.

FIG. 36 illustrates a configuration example of an information processing apparatus (computing device) functioning as the host 2.

The information processing apparatus is implemented as a computing device like a server. The information processing apparatus comprises a processor (CPU) 801, a main memory 802, a BIOS-ROM 803, a network controller 805, a peripheral interface controller 806, a controller 807, and an embedded controller (EC) 808.

The processor 801 is a CPU configured to control operations of the components of the information processing apparatus. The processor 801 executes various programs loaded from one of the plurality of SSDs 3 into the main memory 802. The main memory 802 is a random access memory such as a DRAM. The programs may include a setting program configured to issue commands to instruct execution of the above-described inter-NVM-set copy, NVM set exchange, new-NVM-set creation, and NVM set combining.

The processor 801 also executes a basic input/output system (BIOS) stored in a BIOS-ROM 803 that is a non-volatile memory. The BIOS is a system program for hardware control.

The network controller 805 is a communication device such as a wired LAN controller, a wireless LAN controller. The peripheral interface controller 806 is configured to communicate with a peripheral device such as a USB device.

The controller 807 is configured to execute communicate with devices connected to a plurality of connectors 807A. The plurality of SSDs 3 may be connected to the respective connectors 807A. The controller 807 is an SAS expander, a PCIe switch, a PCIe expander, a flash array controller, a RAID controller, or the like.

The EC 808 functions as a system controller configured to execute power management for the information processing apparatus.

Figure 37:
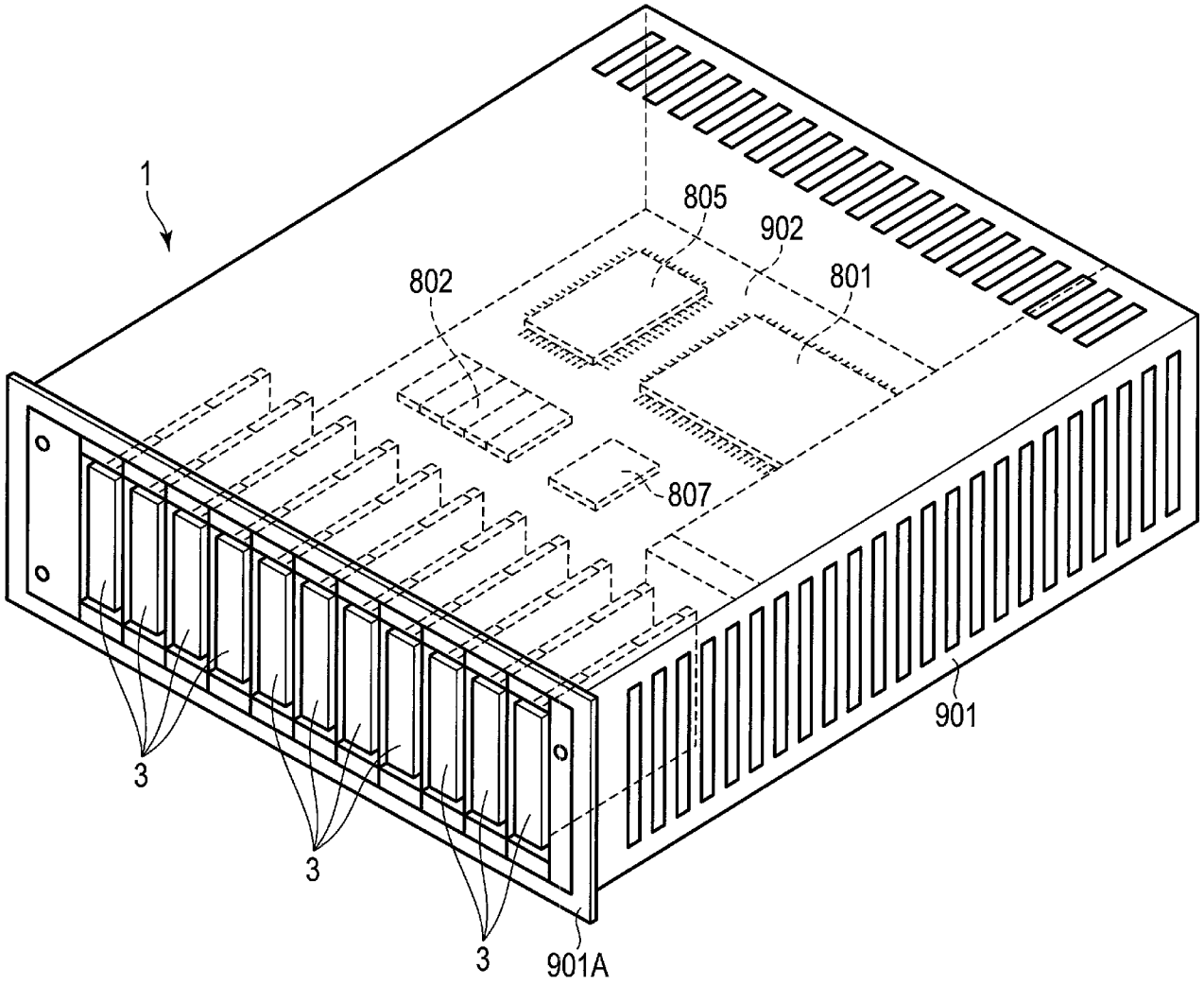
FIG. 37 is a block diagram illustrating a configuration example of a computer comprising the memory system of the embodiment and a host.

FIG. 37 illustrates a configuration example of an information processing apparatus (server) comprising the plurality of SSDs 3 and the host 2.

The information processing apparatus (server) comprises a thin-box-shaped housing 901 which can be housed in a rack. A large number of the SSDs 3 may be arranged in the housing 901. In this case, the SSDs 3 may be removably inserted into respective slots provided in a front surface 901A of the housing 901.

A system board (mother board) 902 is arranged in the housing 901. Various electronic components including the CPU 801, the main memory 802, the network controller 805, and the controller 807 are mounted on the system board (mother board) 902. The electronic components function as the host 2.

As described above, according to the present embodiment, a plurality of NAND flash memory dies is classified into a plurality of NVM sets such that each of the plurality of NAND flash memory dies belongs to only one NVM set. In accordance with an I/O command from the host designating at least one region (for example, a namespace) corresponding to each NVM set, a data write/read operation is performed for one of the plurality of NVM sets. Therefore, a plurality of I/O commands (write commands or read commands) designating different regions corresponding to the different NVM sets can be simultaneously executed without causing die contention. Consequently, for example, even if, during execution of a data write operation for a certain NVM set, a read command directed for a region corresponding to another NVM set is received from the host 2, the controller 4 can immediately perform a data read operation corresponding to the read command without the need to wait for the data write operation to complete.

A group of free blocks in the NAND flash memory die 5 are individually managed for each of the plurality of NVM sets by using a plurality of free block pools corresponding to the plurality of NVM sets. Then, the controller 4 performs, for each of the plurality of NVM sets, an operation of allocating one free block in the corresponding free block pool as an input block (a user input block or a GC input block), an operation of writing user data to the input block, an operation of managing the input block filled with the user data by using an NVM subset (a data block pool), and an operation of returning blocks which are managed by the NVM subset and which hold no valid data to the corresponding free block pool. As described above, the use of free blocks corresponding to the respective NVM sets allows the allocation of the input block and the returning of the free blocks to be executed independently for each NVM set. Therefore, for example, a block in a die belonging to a certain NVM set can be prevented from being allocated as an input block for another NVM set. The present embodiment can ensure that no die contention occurs.

The present embodiment also allows coexistence, in a single SSD 3, of a shared NVM set in which a free block pool is shared by a plurality of NVM subsets (a plurality of groups for garbage collection) and an isolated NVM set in which a free block pool is exclusively used by one NVM subset (one group for garbage collection).

In the present embodiment, the NAND flash memory has been illustrated as a nonvolatile memory. However, the functions of the present embodiment are also applicable to various other nonvolatile memories, For example, a magnetoresistive random access memory (MRAM), a phase change random access memory (PRAM), a resistive random access memory (ReRAM), or a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, the memory system comprising:

a nonvolatile memory including a plurality of nonvolatile memory dies connected to a plurality of channels, each of the nonvolatile memory dies including a plurality of blocks; and a controller configured to control the nonvolatile memory via the plurality of channels, wherein the controller is configured to:

classify the plurality of nonvolatile memory dies into a first die group including a plurality of first nonvolatile memory dies and a second die group including a plurality of second nonvolatile memory dies different from the first nonvolatile memory dies;

in response to receiving, from the host, a first write command designating a first region corresponding to the first die group, write first data to be written to the first region to a first write destination block which is selected from one of the first nonvolatile memory dies; and in response to receiving, from the host, a second write command designating a second region corresponding to the second die group, write second data to be written to the second region to a second write destination block which is selected from one of the second nonvolatile memory dies,

*a group of free blocks belonging to the first die group is managed by a first free block pool corresponding to the first die group,*

*a group of free blocks belonging to the second die group is managed by a second free block pool corresponding to the second die group,*

*the first write destination block is allocated from the first free block pool,*

*the second write destination block is allocated from the second free block pool,*

*the first free block pool is a free block pool dedicated to a first data block pool managing each of blocks which belongs to the first die group and which holds valid data, and*

*the second free block pool is a shared free block pool shared by a plurality of second data block pools managing respective blocks which belong to the second die group and which hold valid data.*

2. The memory system of claim 1, wherein the controller is further configured to:

in response to receiving, from the host, a first read command designating the first region while a write operation for the second data is being executed, read data from the first die group without waiting for completion of the write operation for the second data.

[3. The memory system of claim 1, wherein a group of free blocks belonging to the first die group is managed by a first free block pool corresponding to the first die group, and a group of free blocks belonging to the second die group is managed by a second free block pool corresponding to the second die group, the first write destination block is allocated from the first free block pool, and the second write destination block is allocated from the second free block pool, and the first free block pool is a free block pool dedicated to a first data block pool managing each of blocks which belongs to the first die group and which holds valid data, and the second free block pool is a shared free block pool shared by a plurality of second data block pools managing respective blocks which belong to the second die group and which hold valid data.]

4. The memory system of claim [3] *1*, wherein the controller is further configured to:

in garbage collection on the first data block pool, allocate one of the free blocks in the first free block pool as a first copy destination block, copy, to the first copy destination block, only valid data from one or more blocks in the first data block pool, and return, to the first free block pool, the one or more blocks which include only invalid data as a result of copying of the valid data to the first copy destination block; and in garbage collection on the second data block pool which is one of the plurality of second data block pools, allocate one of the free blocks in the second free block pool shared by the plurality of second data block pools, as a second copy destination block, copy, to the second copy destination block, only valid data from one or more blocks in the one second data block pool, and return, to the second free block pool, the one or more blocks which include only invalid data as a result of copying of the valid data to the second copy destination block.

[5. The memory system of claim 1, wherein a group of free blocks belonging to the first die group is managed by a first free block pool corresponding to the first die group, and a group of free blocks belonging to the second die group is managed by a second free block pool corresponding to the second die group, the first write destination block is allocated from the first free block pool, and the second write destination block is allocated from the second free block pool, and the first free block pool is a free block pool dedicated to a first data block pool managing each of blocks which belongs to the first die group and which holds valid data, and the second free block pool is a free block pool dedicated to a second data block pool managing each of blocks which belongs to the second die group and which holds valid data.]

[6. The memory system of claim 5, wherein the controller is further configured to:

in garbage collection on the first data block pool, allocate one of the free blocks in the first free block pool as a first copy destination block, copy, to the first copy destination block, only valid data from one or more blocks in the first data block pool, and return, to the first free block pool, the one or more blocks which include only invalid data as a result of copying of the valid data to the first copy destination block; and in garbage collection on the second data block pool, allocate one of the free blocks in the second free block pool as a second copy destination block, copy, to the second copy destination block, only valid data from one or more blocks in the second data block pool, and return, to the second free block pool, the one or more blocks which include only invalid data as a result of copying of the valid data to the second copy destination block.]

[7. The memory system of claim 1, wherein a group of free blocks belonging to the first die group is managed by a first free block pool corresponding to the first die group, and a group of free blocks belonging to the second die group is managed by a second free block pool corresponding to the second die group, the first write destination block is allocated from the first free block pool, and the second write destination block is allocated from the second free block pool, and the first free block pool is a shared free block pool shared by a plurality of first data block pools managing respective blocks which belong to the first die group and which hold valid data, and the second free block pool is a shared free block pool shared by a plurality of second data block pools managing respective blocks which belong to the second die group and which hold valid data.]

[8. The memory system of claim 7, wherein the controller is further configured to:

in garbage collection on one first data block pool of the plurality of first data block pools, allocate, as a first copy destination block, one of the free blocks in the first free block pool shared by the plurality of first data block pools, copy, to the first copy destination block, only valid data from one or more blocks in the one first data block pool, and return, to the first free block pool, the one or more blocks which include only invalid data as a result of copying of the valid data to the first copy destination block; and in garbage collection on one second data block pool of the plurality of second data block pools, allocate, as a second copy destination block, one of the free blocks in the second free block pool shared by the plurality of second data block pools, copy, to the second copy destination block, only valid data from one or more blocks in the one second data block pool, and return, to the second free block pool, the one or more blocks which include only invalid data as a result of copying of the valid data to the second copy destination block.]

9. The memory system of claim 1, wherein the first nonvolatile memory dies included in the first die group are a set of nonvolatile memory dies connected to the respective channels, and the second nonvolatile memory dies included in the second die group are a set of other nonvolatile memory dies connected to the respective channels.

10. The memory system of claim 1, wherein the first nonvolatile memory dies included in the first die group are a set of nonvolatile memory dies each connected to a first channel of the plurality of channels, and the second nonvolatile memory dies included in the second die group are a set of nonvolatile memory dies each connected to a second channel of the plurality of channels.

11. A method of controlling a nonvolatile memory including a plurality of nonvolatile memory dies connected to a plurality of channels, each of the nonvolatile memory dies including a plurality of blocks, the method comprising:

classifying the plurality of nonvolatile memory dies into a first die group including a plurality of first nonvolatile memory dies and a second die group including a plurality of second nonvolatile memory dies different from the first nonvolatile memory dies;

in response to receiving, from a host, a first write command designating a first region corresponding to the first die group, writing first data to be written to the first region to a first write destination block which is selected from one of the first nonvolatile memory dies; and in response to receiving, from the host, a second write command designating a second region corresponding to the second die group, writing second data to be written to the second region to a second write destination block which is selected from one of the second nonvolatile memory dies, *wherein*

*a group of free blocks belonging to the first die group is managed by a first free block pool corresponding to the first die group,*

*a group of free blocks belonging to the second die group is managed by a second free block pool corresponding to the second die group,*

*the first write destination block is allocated from the first free block pool,*

*the second write destination block is allocated from the second free block pool,*

*the first free block pool is a free block pool dedicated to a first data block pool managing each of blocks which belongs to the first die group and which holds valid data, and*

*the second free block pool is a shared free block pool shared by a plurality of second data block pools managing respective blocks which belong to the second die group and which hold valid data.*

12. The method of claim 11, further comprising:

in response to receiving, from the host, a first read command designating the first region while a write operation for the second data is being executed, reading data from the first die group without waiting for completion of the write operation for the second data.

[13. The method of claim 11, wherein a group of free blocks belonging to the first die group is managed by a first free block pool corresponding to the first die group, and a group of free blocks belonging to the second die group is managed by a second free block pool corresponding to the second die group, the first write destination block is allocated from the first free block pool, and the second write destination block is allocated from the second free block pool, and the first free block pool is a free block pool dedicated to a first data block pool managing each of blocks which belongs to the first die group and which holds valid data, and the second free block pool is a shared free block pool shared by a plurality of second data block pools managing respective blocks which belong to the second die group and which hold valid data.]

14. The method of claim [13] *11*, further comprising:

in garbage collection on *one first data block pool of* the *plurality of* first data block pool*s*, allocating one of the free blocks in the first free block pool as a first copy destination block *shared by the plurality of first data block pools*, copying, to the first copy destination block, only valid data from one or more blocks in the *one* first data block pool, and returning, to the first free block pool, the one or more blocks which include only invalid data as a result of copying of the valid data to the first copy destination block; and in garbage collection on [the] *one* second data block pool [which is one] of the plurality of second data block pools, allocating one of the free blocks in the second free block pool shared by the plurality of second data block pools, as a second copy destination block, copying, to the second copy destination block, only valid data from one or more blocks in the one second data block pool, and returning, to the second free block pool, the one or more blocks which include only invalid data as a result of copying of the valid data to the second copy destination block.

15. The method of claim 11, wherein the first nonvolatile memory dies included in the first die group are a set of nonvolatile memory dies connected to the respective channels, and the second nonvolatile memory dies included in the second die group are a set of other nonvolatile memory dies connected to the respective channels.

16. The method of claim 11, wherein the first nonvolatile memory dies included in the first die group are a set of nonvolatile memory dies each connected to a first channel of the plurality of channels, and the second nonvolatile memory dies included in the second die group are a set of nonvolatile memory dies each connected to a second channel of the plurality of channels.

*17. A memory system connectable to a host, the memory system comprising:*

*a nonvolatile memory including a plurality of nonvolatile memory dies connected to a plurality of channels, each of the plurality of nonvolatile memory dies including a plurality of blocks; and*

*a controller configured to control the nonvolatile memory via the plurality of channels, wherein*

*the controller is configured to:*

*classify the plurality of nonvolatile memory dies into a first die group and a second die group such that each of the plurality of nonvolatile memory dies belongs to only one die group;*

*in response to receiving, from the host, a first write command designating a first region corresponding to the first die group, write first data to be written to the first region to a first write destination block which is selected from the first die group; and*

*in response to receiving, from the host, a second write command designating a second region corresponding to the second die group, write second data to be written to the second region to a second write destination block which is selected from the second die group,*

*free blocks belonging to the first die group are managed by a first free block pool corresponding to the first die group,*

*free blocks belonging to the second die group are managed by a second free block pool corresponding to the second die group,*

*the first write destination block is allocated from the first free block pool,*

*the second write destination block is allocated from the second free block pool,*

*the first free block pool is a free block pool dedicated to a first data block pool, the first data block pool managing each of blocks which belongs to the first die group and which stores valid data, and*

*the second free block pool is a shared free block pool shared by a plurality of second data block pools, the plurality of second data block pools managing respective blocks which belong to the second die group and which store valid data.*

*18. The memory system of claim 17, wherein*

*the controller is further configured to:*

*in response to receiving, from the host, a first read command designating the first region while a write operation for the second data is being executed, read data from the first die group without waiting for completion of the write operation for the second data.*

*19. The memory system of claim 17, wherein*

*the controller is further configured to:*

*in a garbage collection operation on the first data block pool,*

*allocate one of the free blocks in the first free block pool as a first copy destination block,*

*copy, to the first copy destination block, only valid data from one or more blocks in the first data block pool, and*

*return, to the first free block pool, the one or more blocks which include only invalid data as a result of copying of the valid data to the first copy destination block; and*

*in a garbage collection operation on one of the plurality of second data block pools,*

*allocate one of the free blocks in the second free block pool, as a second copy destination block,*

*copy, to the second copy destination block, only valid data from one or more blocks in the one of the plurality of second data block pools, and*

*return, to the second free block pool, the one or more blocks which include only invalid data as a result of copying of the valid data to the second copy destination block.*

*20. The memory system of claim 17, wherein*

*the first die group includes a plurality of first nonvolatile memory dies respectively connected to the plurality of channels, and*

*the second die group includes a plurality of second nonvolatile memory dies respectively connected to the plurality of channels.*

*21. The memory system of claim 17, wherein*

*the first die group includes a plurality of first nonvolatile memory dies each connected to a first channel of the plurality of channels, and*

*the second die group includes a plurality of second nonvolatile memory dies each connected to a second channel of the plurality of channels.*

*22. A memory system connectable to a host, the memory system comprising:*

*a nonvolatile memory including a plurality of nonvolatile memory dies connected to a plurality of channels, each of the plurality of nonvolatile memory dies including a plurality of blocks; and*

*a controller configured to control the nonvolatile memory via the plurality of channels, wherein*

*the controller is configured to:*

*classify the plurality of nonvolatile memory dies into a first die group and a second die group such that each of the plurality of nonvolatile memory dies belongs to only one die group; and*

*in response to receiving, from the host, a copy command designating the first die group as a copy source and designating the second die group as a copy destination,*

*(1) read valid data from a first block which is selected from the first die group; and*

*(2) write the read valid data to a second block which is selected from the second die group.*

*23. The memory system of claim 22, wherein*

*the controller is further configured to:*

*(3) return the first block to a free block pool belonging to the first die group when valid data no longer exist in the first block.*

*24. The memory system of claim 23, wherein*

*the controller is further configured to:*

*repeat operations of (1) to (3) until a block storing valid data no longer exists in the first die group.*

*25. The memory system of claim 22, wherein*

*the controller is further configured to:*

*in response to receiving, from the host, a write command designating a first region corresponding to the first die group while performing an operation for the copy command, write first write data to be written to the first region to a write destination block which is selected from the second die group.*

*26. The memory system of claim 22, wherein*

*the controller is configured to cause the first die group and the second die group to simultaneously execute I/O commands.*

*27. The memory system of claim 22, wherein*

*the first die group includes a plurality of first nonvolatile memory dies respectively connected to the plurality of channels, and*

*the second die group includes a plurality of second nonvolatile memory dies respectively connected to the plurality of channels.*

*28. The memory system of claim 22, wherein*

*the first die group includes a plurality of first nonvolatile memory dies each connected to a first channel of the plurality of channels, and*

*the second die group includes a plurality of second nonvolatile memory dies each connected to a second channel of the plurality of channels.*

*29. A memory system connectable to a host, the memory system comprising:*

*a nonvolatile memory including a plurality of nonvolatile memory dies connected to a plurality of channels, each of the plurality of nonvolatile memory dies including a plurality of blocks; and*

*a controller configured to control the nonvolatile memory via the plurality of channels, wherein*

*the controller is configured to:*

*classify the plurality of nonvolatile memory dies into a first die group and a second die group such that each of the plurality of nonvolatile memory dies belongs to only one die group;*

*in response to receiving, from the host, a first write command designating a first region corresponding to the first die group, write first data to be written to the first region to a first write destination block which is selected from the first die group; and*

*in response to receiving, from the host, a second write command designating a second region corresponding to the second die group, write second data to be written to the second region to a second write destination block which is selected from the second die group, wherein*

*free blocks belonging to the first die group are managed by a first free block pool corresponding to the first die group,*

*free blocks belonging to the second die group are managed by a second free block pool corresponding to the second die group,*

*the first write destination block is allocated from the first free block pool,*

*the second write destination block is allocated from the second free block pool,*

*the first free block pool is a shared free block pool shared by a plurality of first data block pools, the plurality of first data block pools managing respective blocks which belong to the first die group and which store valid data, and*

*the second free block pool is a shared free block pool shared by a plurality of second data block pools, the plurality of second data block pools managing respective blocks which belong to the second die group and which store valid data.*

*30. The memory system of claim 29, wherein*

*the controller is further configured to:*

*in response to receiving, from the host, a first read command designating the first region while a write operation for the second data is being executed, read data from the first die group without waiting for completion of the write operation for the second data.*

*31. The memory system of claim 29, wherein*

*the controller is further configured to:*

*in a garbage collection operation on one of the plurality of first data block pools,*

*allocate, as a first copy destination block, one of the free blocks in the first free block pool,*

*copy, to the first copy destination block, only valid data from one or more blocks in the one of the plurality of first data block pools, and*

*return, to the first free block pool, the one or more blocks which include only invalid data as a result of copying of the valid data to the first copy destination block; and*

*in a garbage collection operation on one of the plurality of second data block pools,*

*allocate, as a second copy destination block, one of the free blocks in the second free block pool,*

*copy, to the second copy destination block, only valid data from one or more blocks in the one of the plurality of second data block pools, and*

*return, to the second free block pool, the one or more blocks which include only invalid data as a result of copying of the valid data to the second copy destination block.*

*32. The memory system of claim 29, wherein*

*the first die group includes a plurality of first nonvolatile memory dies respectively connected to the plurality of channels, and*

*the second die group includes a plurality of second nonvolatile memory dies respectively connected to the plurality of channels.*

*33. The memory system of claim 29, wherein*

*the first die group includes a plurality of first nonvolatile memory dies each connected to a first channel of the plurality of channels, and*

*the second die group includes a plurality of second nonvolatile memory dies each connected to a second channel of the plurality of channels.*

*34. A method of controlling a nonvolatile memory, the nonvolatile memory including a plurality of nonvolatile memory dies connected to a plurality of channels, each of the plurality of nonvolatile memory dies including a plurality of blocks, said method comprising:*

*classifying the plurality of nonvolatile memory dies into a first die group and a second die group such that each of the plurality of nonvolatile memory dies belongs to only one die group; and*

*in response to receiving, from a host, a copy command designating the first die group as a copy source and designating the second die group as a copy destination,*

*(1) reading valid data from a first block which is selected from the first die group; and*

*(2) writing the read valid data to a second block which is selected from the second die group.*

*35. The method of claim 34, further comprising:*

*(3) returning the first block to a free block pool belonging to the first die group when valid data no longer exist in the first block.*

*36. The method of claim 35, further comprising:*

*repeating operations of (1) to (3) until a block storing valid data no longer exists in the first die group.*

*37. The method of claim 34, further comprising:*

*in response to receiving, from the host, a write command designating a first region corresponding to the first die group while performing an operation for the copy command, writing first write data to be written to the first region to a write destination block which is selected from the second die group.*

38. The method of claim 34, further comprising:

causing the first die group and the second die group to simultaneously execute I/O commands.

*39. The method of claim 34, wherein*

*the first die group includes a plurality of first nonvolatile memory dies respectively connected to the plurality of channels, and*

*the second die group includes a plurality of second nonvolatile memory dies respectively connected to the plurality of channels.*

*40. The method of claim 34, wherein*

*the first die group includes a plurality of first nonvolatile memory dies each connected to a first channel of the plurality of channels, and*

*the second die group includes a plurality of second nonvolatile memory dies each connected to a second channel of the plurality of channels.*

* * * * *